(12) United States Patent
Edahiro

(10) Patent No.: US 7,277,339 B2
(45) Date of Patent: Oct. 2, 2007

(54) SEMICONDUCTOR STORAGE DEVICE PRECHARGING/DISCHARGING BIT LINE TO READ DATA FROM MEMORY CELL

(75) Inventor: Toshiaki Edahiro, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 46 days.

(21) Appl. No.: 11/240,620

(22) Filed: Oct. 3, 2005

(65) Prior Publication Data

US 2006/0083091 A1 Apr. 20, 2006

(30) Foreign Application Priority Data

Oct. 14, 2004 (JP) .............................. 2004-300666

(51) Int. Cl.
*G11C 7/00* (2006.01)
*G11C 16/06* (2006.01)
(52) U.S. Cl. .................................. 365/203; 365/185.25
(58) Field of Classification Search ........... 365/185.25, 365/185.11, 203, 63, 203.03
See application file for complete search history.

(56) References Cited

U.S. PATENT DOCUMENTS 6,021,072 A * 2/2000 Takeda et al. ......... 365/185.25
6,031,774 A * 2/2000 Chung ................... 365/185.25
6,226,215 B1 * 5/2001 Yoon ............................ 365/203
7,027,340 B2 * 4/2006 Huang ......................... 365/203
7,061,803 B2 * 6/2006 Kim ............................ 365/203
7,126,869 B1 * 10/2006 Chou ........................... 365/203

OTHER PUBLICATIONS

Rino Micheloni, et al., "The Flash Memory Read Path: Building Blocks and Critical Aspects", Proceedings of the IEEE, vol. 91, No. 4, Apr. 2003, pp. 537-553.

* cited by examiner

*Primary Examiner*—Trong Phan
(74) *Attorney, Agent, or Firm*—Oblon, Spivak, McClelland, Maier & Neustadt, P.C.

(57) ABSTRACT

A read circuit includes a precharge circuit, a discharge circuit, and a sense amplifier. The precharge circuit includes a first transistor which has a gate connected to the bit line, a second transistor which has a gate connected to the bit line, the second transistor having a current path one end of which is connected to one end of a current path in the first transistor, a third transistor which has a current path one end of which is connected to the other end of the current path in the first transistor, the other end of the current path in the third transistor being connected to a power supply, and a fourth transistor which has a gate connected to a junction between the current paths in the first and second transistors and which controls a charge level of the bit line.

18 Claims, 69 Drawing Sheets

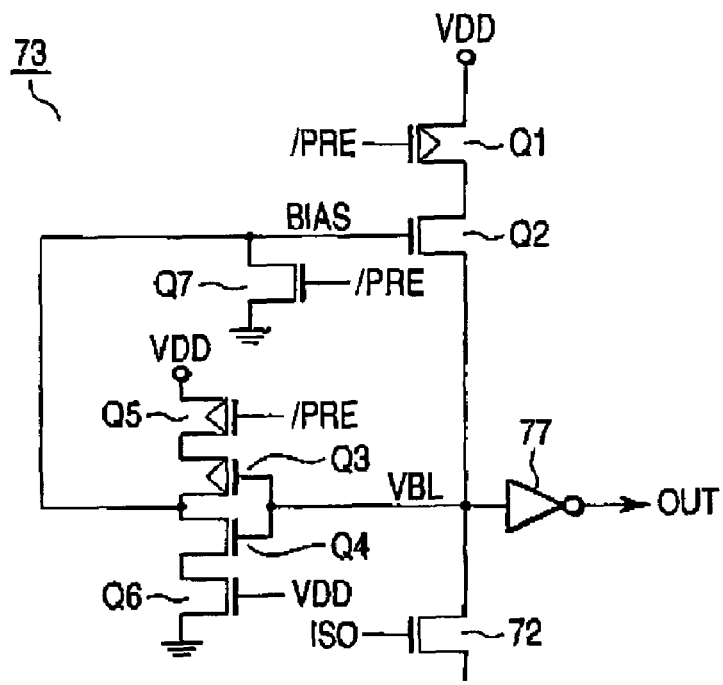
F I G. 6
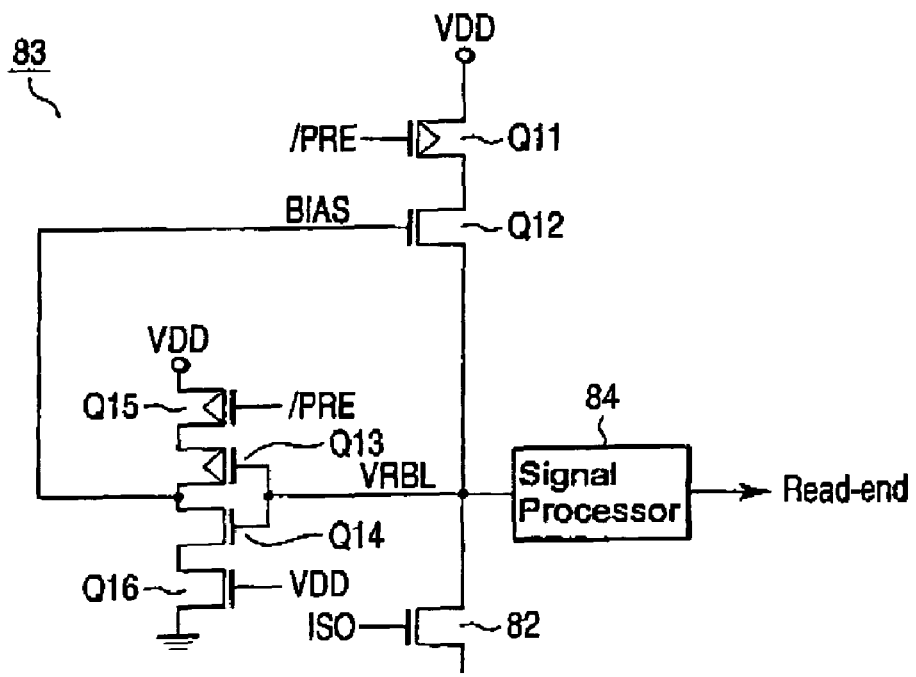
F I G. 7 A

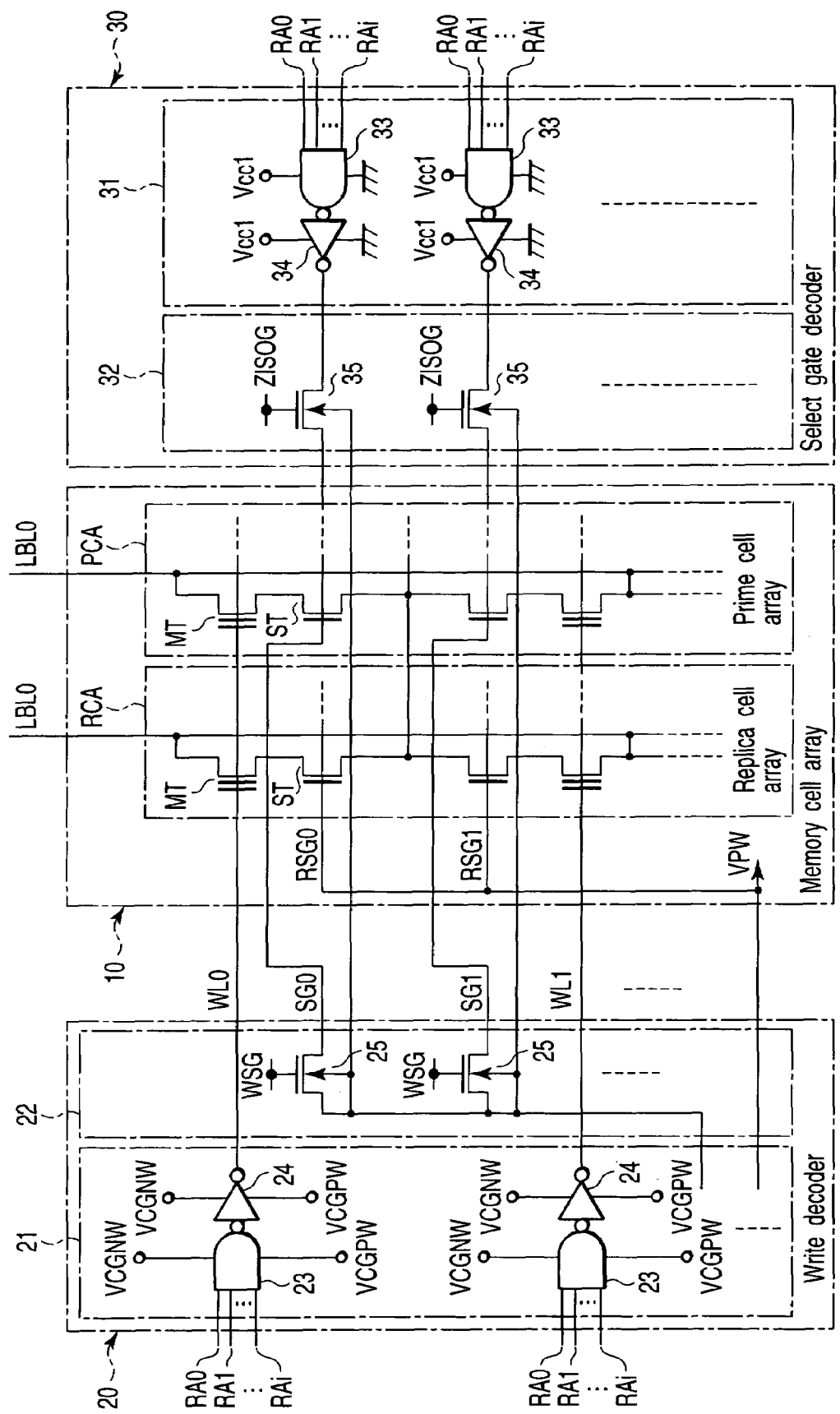
F I G. 13

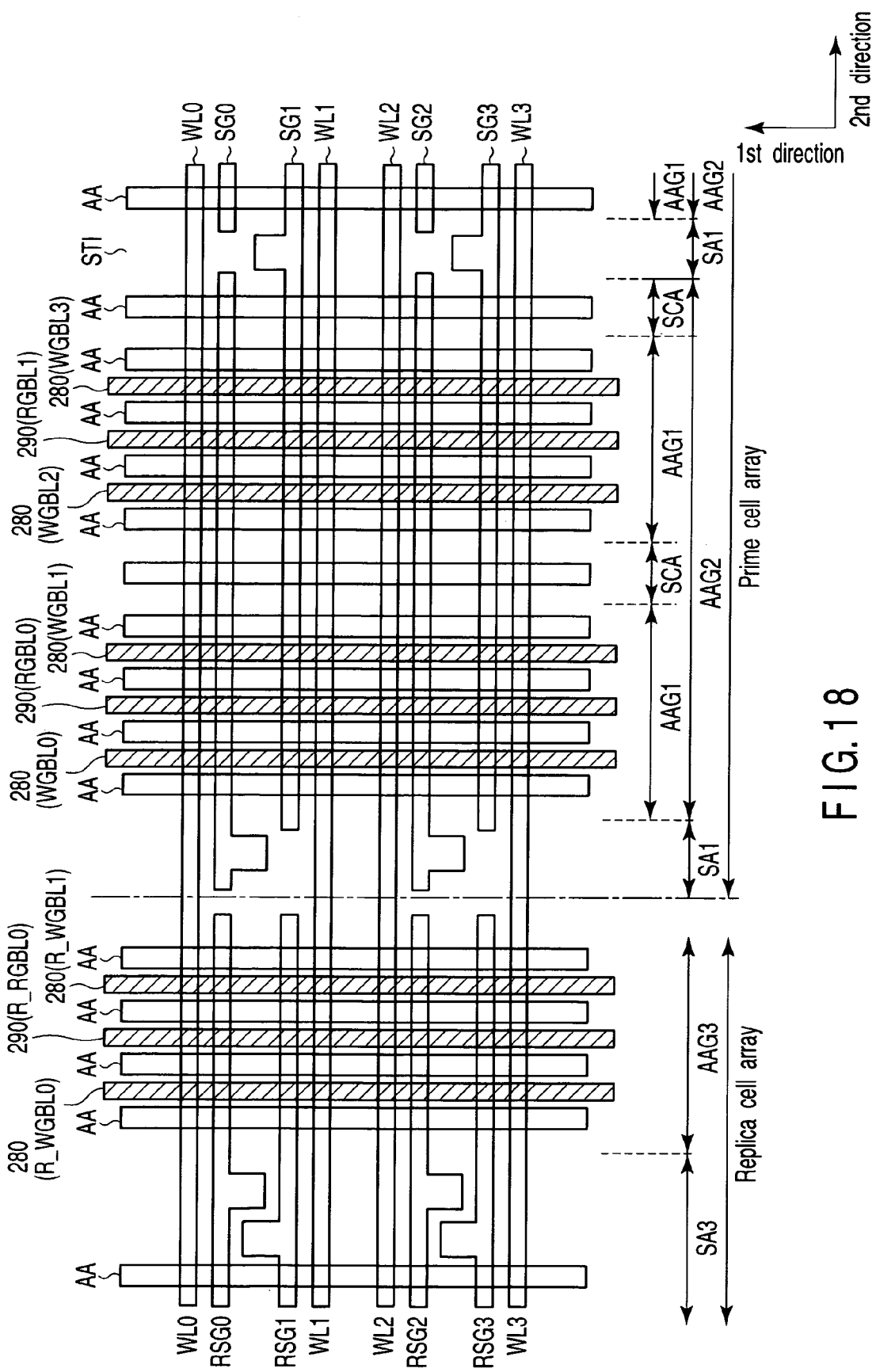
F I G. 18

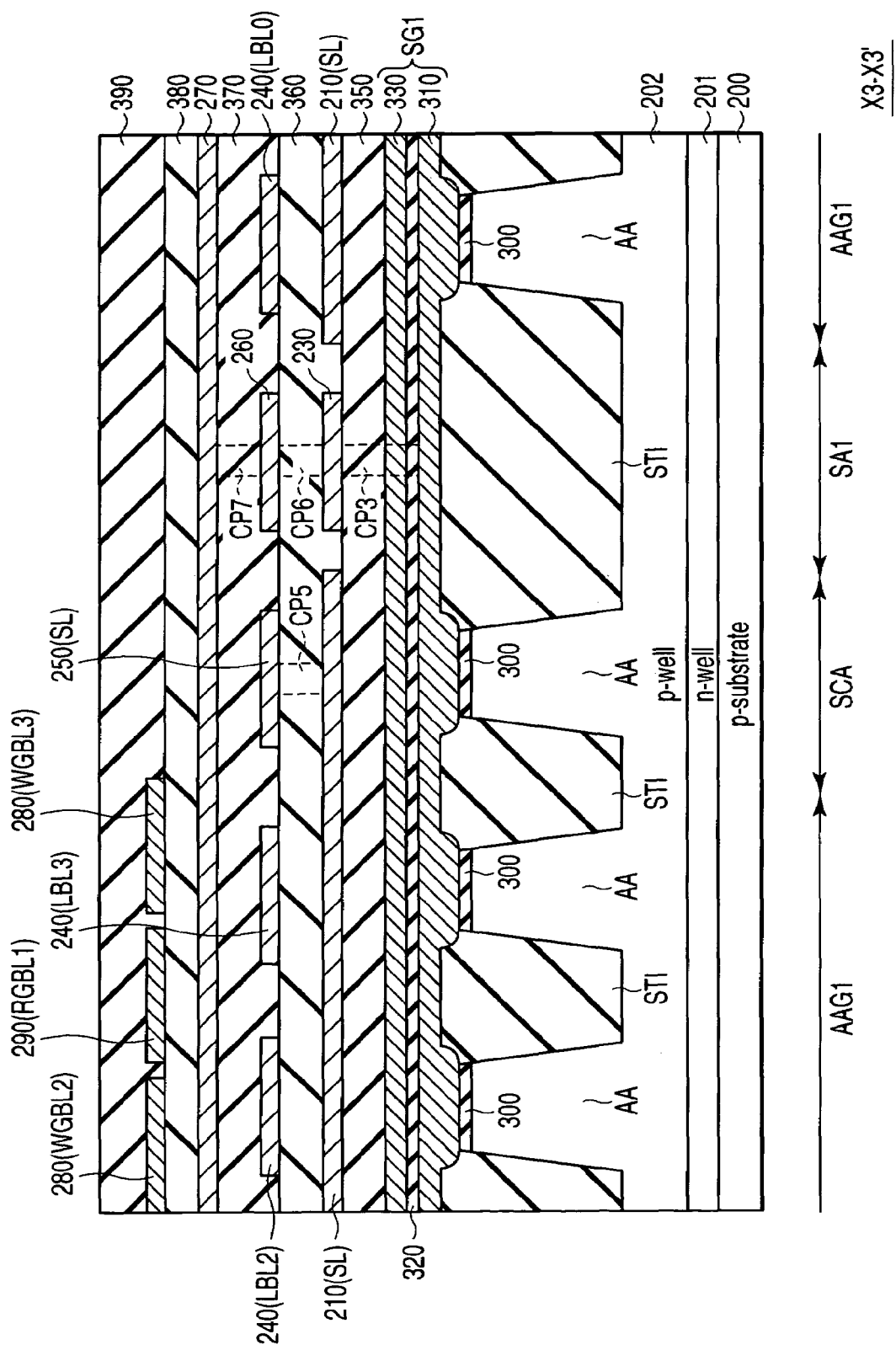
F I G. 21

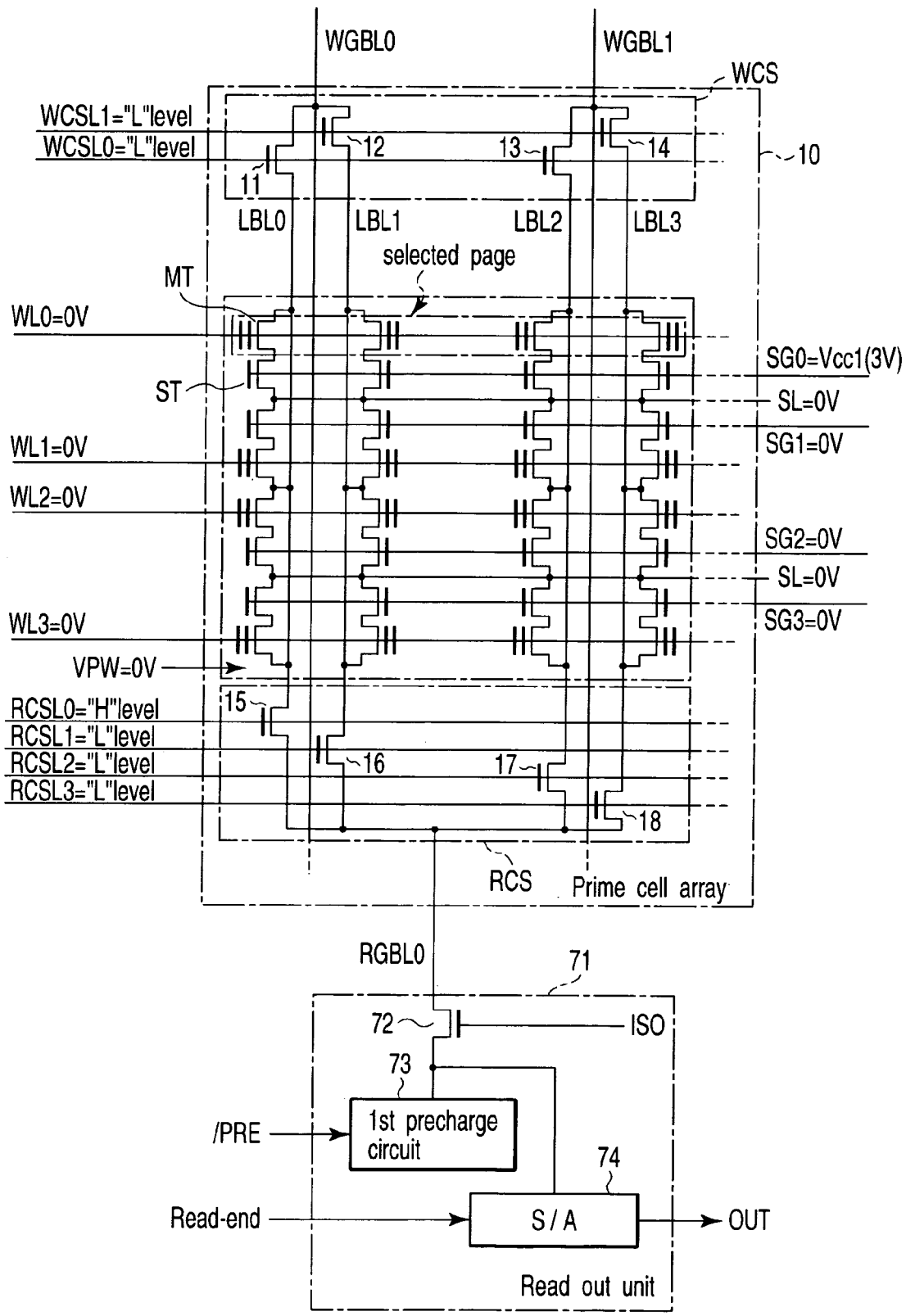
F I G. 41

FIG.42    READ OPERATION

FIG. 46  $C_{R\_RGBL} > C_{RGBL}$

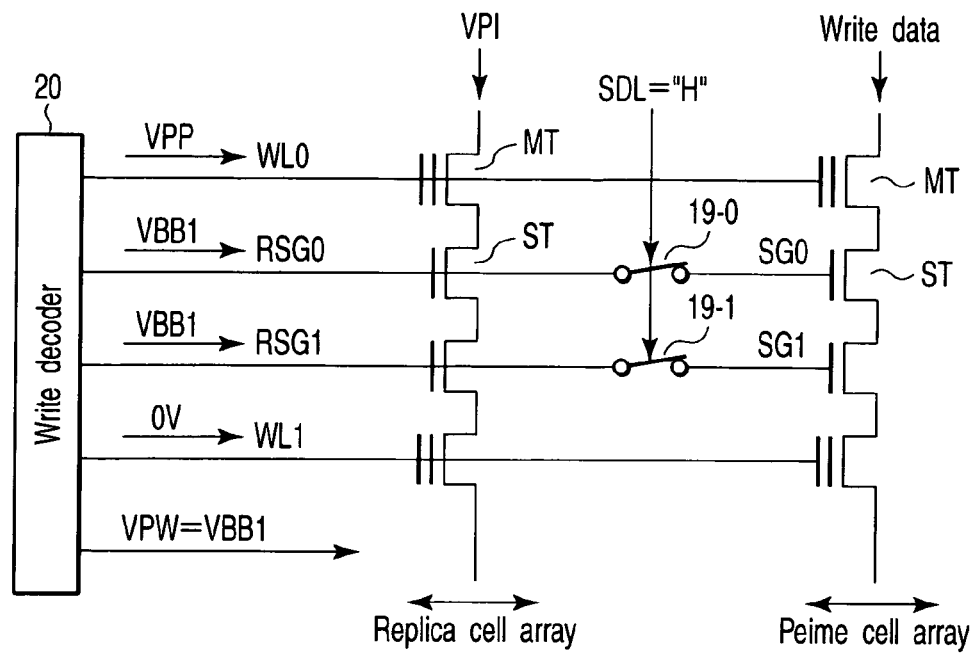
F I G. 5 3
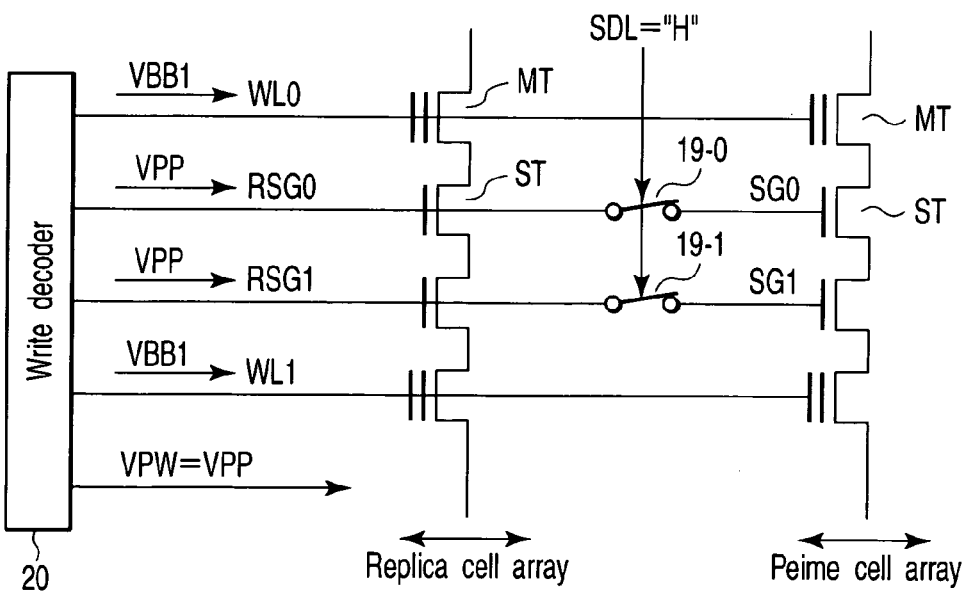
F I G. 5 4

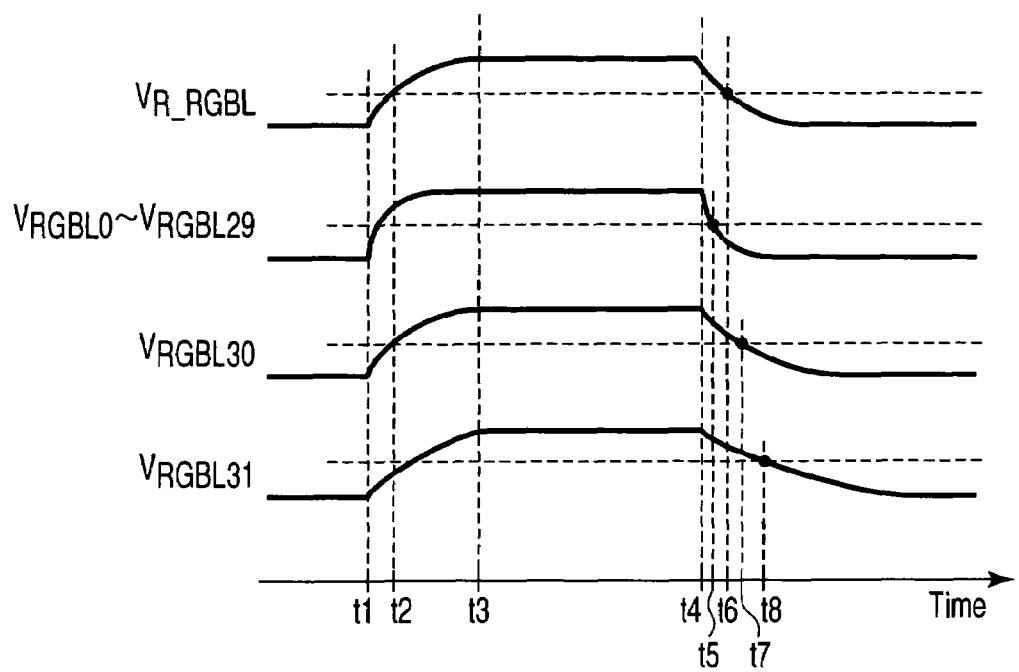
F I G. 5 9
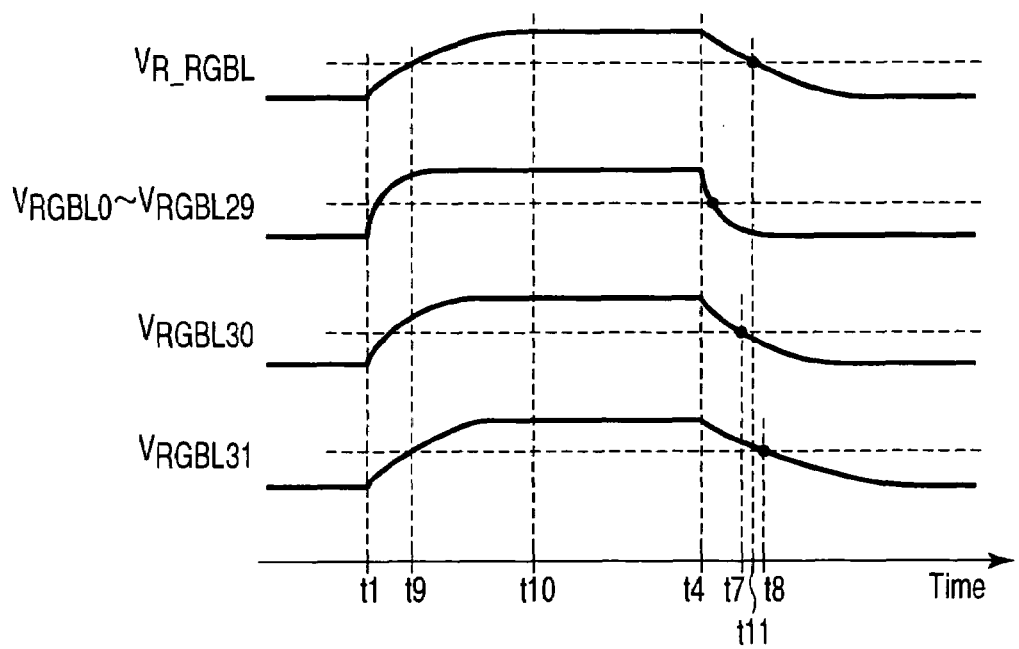
F I G. 6 0

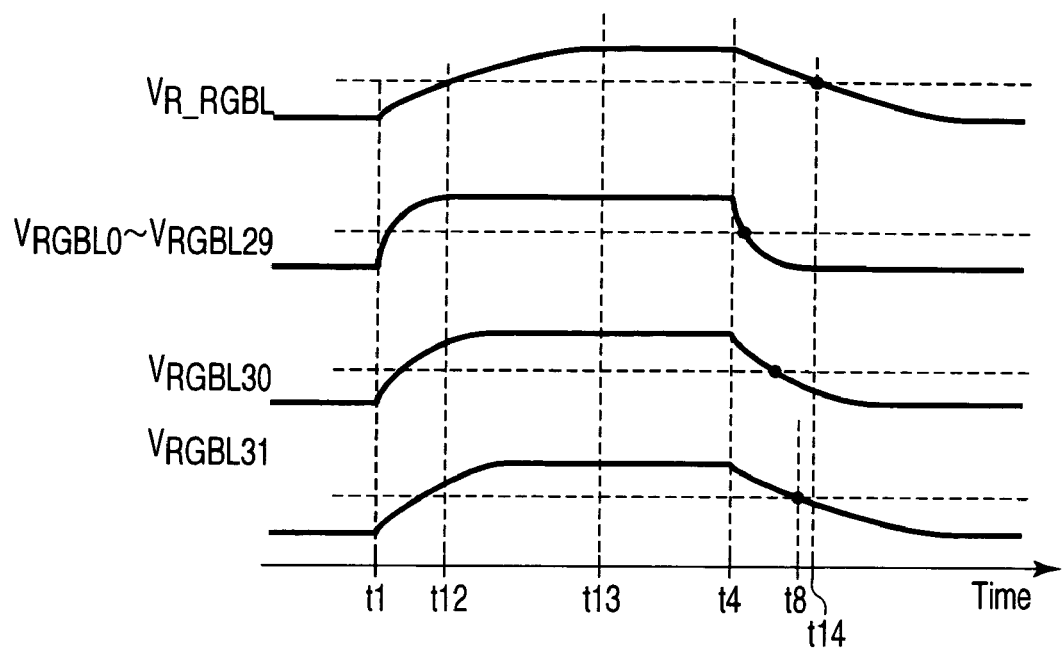
F I G. 6 1
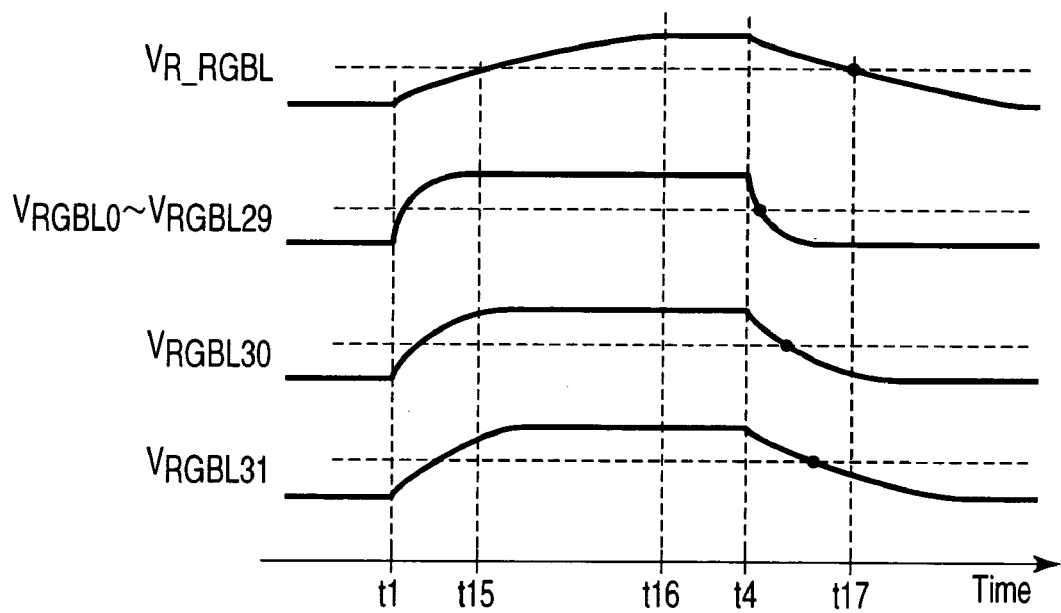
F I G. 6 2

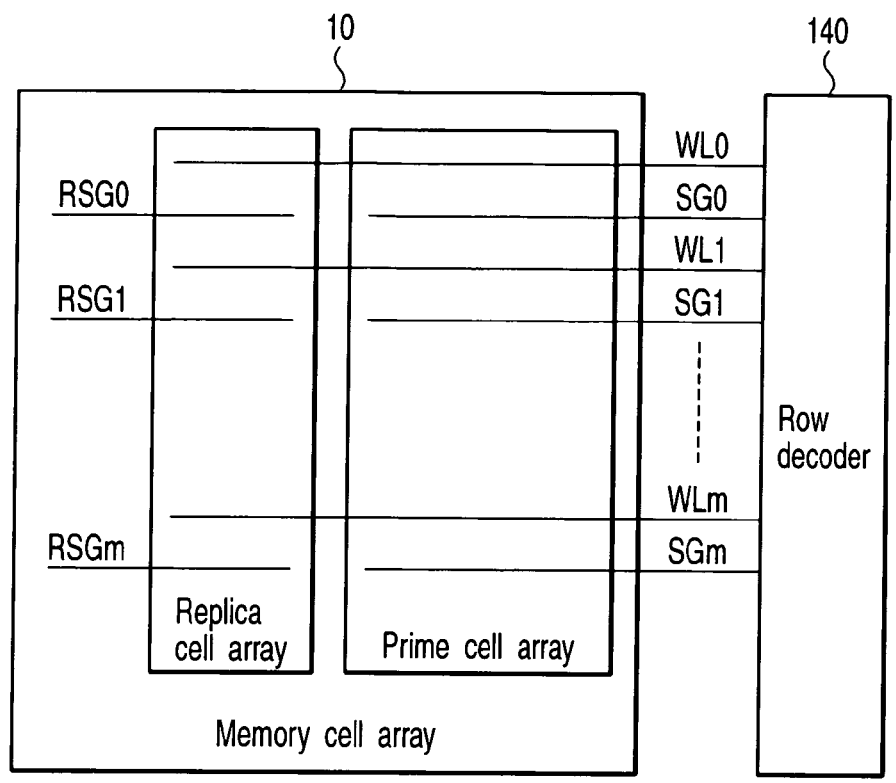
F I G. 74
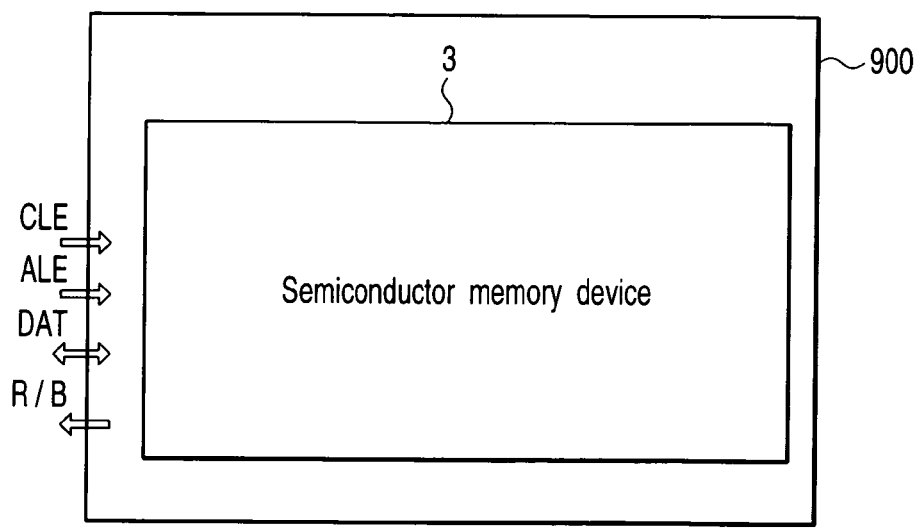
F I G. 75

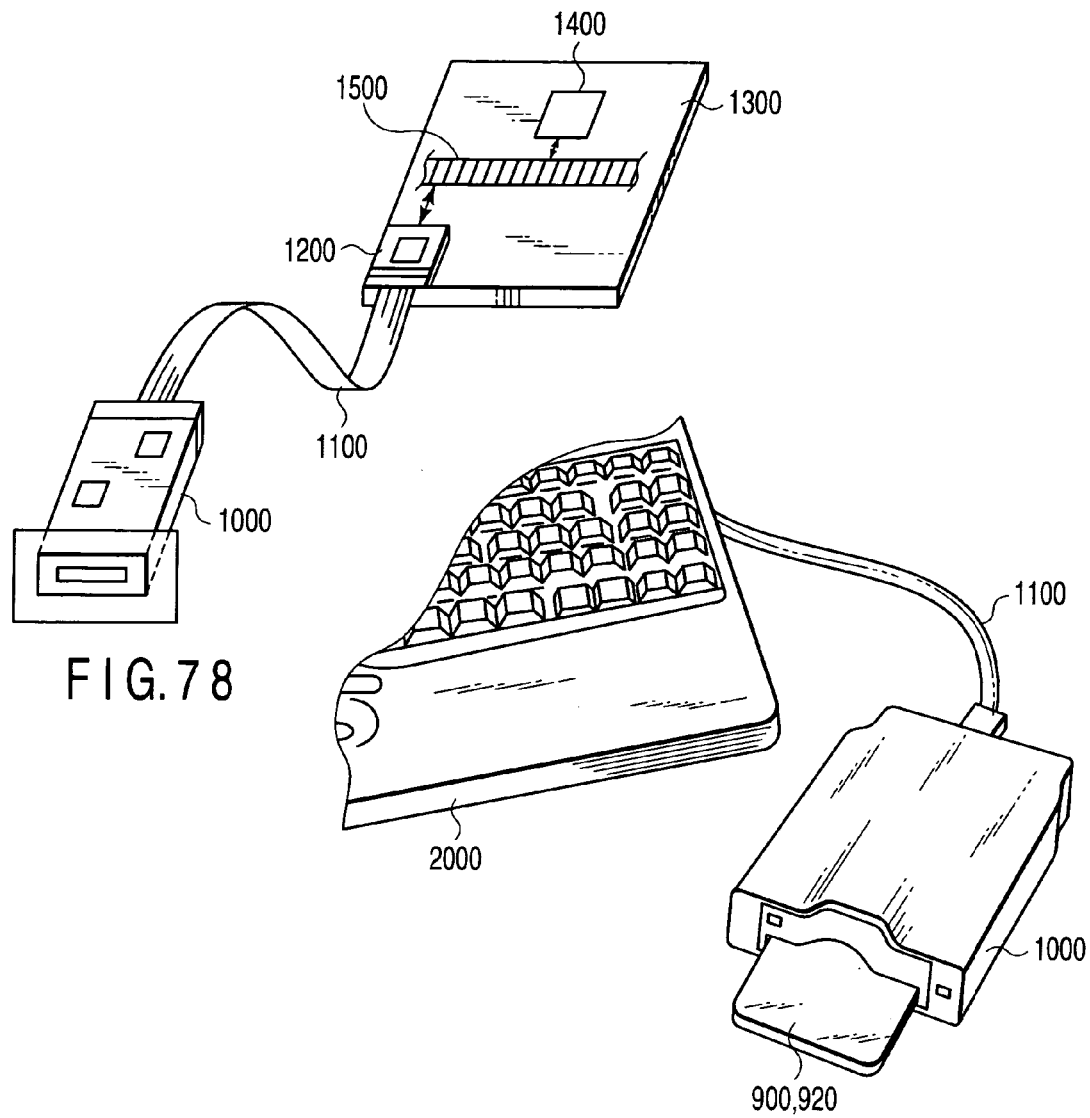
FIG. 78
FIG. 79
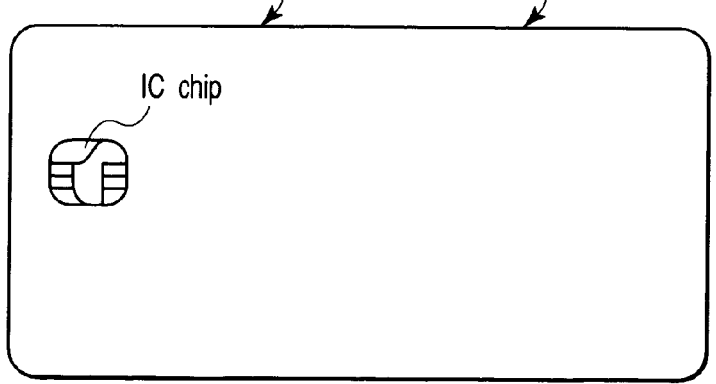
FIG. 80

SEMICONDUCTOR STORAGE DEVICE PRECHARGING/DISCHARGING BIT LINE TO READ DATA FROM MEMORY CELL

CROSS-REFERENCE TO RELATED APPLICATIONS

This application is based upon and claims the benefit of priority from prior Japanese Patent Application No. 2004-300666, filed Oct. 14, 2004, the entire contents of which are incorporated herein by reference.

BACKGROUND OF THE INVENTION

1. Field of the Invention

The present invention relates to a semiconductor storage device that precharges/discharges a bit line to read data from a memory cell.

2. Description of the Related Art

As described in, for example, PROCEEDINGS OF THE IEEE, VOL. 91, NO. 4, APRIL 2003, R. MICHELONI et al. "The Flash Memory Read Path: Building Blocks and Critical Aspects" pp. 537-553 (see FIG. 6(a)), in a read operation performed by a semiconductor storage device such as a flash memory, a power supply $V_{DD}$ first passes a current through a bit line via a resistor R. Then, the bit line is precharged to a predetermined level. On this occasion, when a memory cell (cell transistor) is on, the bit line is discharged. Accordingly, a sense amplifier senses the level of a node OUT to determine that the memory cell is on. On the other hand, when the memory cell is off, the level of the precharged bit line and node OUT is retained. Thus, the sense amplifier senses the level to determine that the memory cell is off.

With this read system, the precharge level of the bit line is adjusted by controlling a bias voltage BIAS applied to a gate of a MOS transistor M1. If the bias voltage BIAS is at the level of the power supply voltage $V_{DD}$, the bit line is clamped to a level $V_{DD}$-Vth (a threshold voltage of the MOS transistor M1). If the charge level of the bit line is excessively high, when the bit line has a large capacitance and the memory cell has only a small current, a long time is required to discharge the memory cell in the on state to a determination level. Further, to input a level equal to or lower than the power supply voltage $V_{DD}$ as the bias voltage BIAS to reduce the charge level of the bit line, a circuit is required which generates a bias voltage equal to or lower than $V_{DD}$.

FIG. 7(b) in the above article describes, as another read circuit, a circuit in which an inverter carries out negative feedback to suppress excessive charging of the bit line. When a node A2 is at ground potential GND, the bias voltage BIAS supplied to the gate of the MOS transistor M1 is set at the $V_{DD}$ level to rapidly charge the bit line. Once the bit line is sufficiently precharged to, for example, about $V_{DD}/2$, an output from the inverter is inverted to perform control such that the MOS transistor M1 is turned off. This makes it possible to suppress the excessive charging of the bit line.

This circuit configuration eliminates the need to apply a special voltage to the gate of the MOS transistor M1. Further, the level of the bit line is sensed so that the inverter can control the MOS transistor M1. Consequently, the circuit is simple.

However, since the inverter controls the precharge level of the bit line, a drain of the MOS transistor M1 has a voltage equal to or higher than the bit line voltage and equal to or lower than the power supply voltage $V_{DD}$. Accordingly, after precharging, the charge on the drain of the MOS transistor M1 migrates to the bit line. As a result, the bit line is continuously charged weakly. This charging does not affect reading from the memory cell in an off state. However, when the bit line is discharged with the memory cell in the on state, the output from the inverter changes so that the MOS transistor M1 is turned on. Consequently, the charge on the drain of the MOS transistor M1 further charges the bit line. This operation charges the bit line being discharged by the memory cell in the on state. This is a factor delaying the operation of reading from the memory cell in the on state.

Further, the inverter need not operate for practical use while the bit line is being discharged. However, an input to the inverter is at an intermediate level between 0 V and $V_{DD}$ after the end of the read operation and before the potential across the bit line is reset to ground potential GND. Thus, during the read operation, the inverter continues to pass a through current. The through current is useless current consumption that is not related to operations.

BRIEF SUMMARY OF THE INVENTION

According to an aspect of the present invention, there is provided a semiconductor storage device comprising a precharge circuit configured to precharge a bit line connected to a selected memory cell for a read operation, the precharge circuit including a first MOS transistor of a first conductivity type which has a gate connected to the bit line, a second MOS transistor of a second conductivity type which has a gate connected to the bit line, the second MOS transistor having a current path one end of which is connected to one end of a current path in the first MOS transistor, a third MOS transistor of the first conductivity type which has a current path one end of which is connected to the other end of the current path in the first MOS transistor, the other end of the current path in the third MOS transistor being connected to a power supply, and a fourth MOS transistor of the second conductivity type which has a gate connected to a junction between the current paths in the first and second MOS transistors and which controls a charge level of the bit line; a discharge circuit configured to discharge the bit line using a current flowing through the selected memory cell; and a sense amplifier configured to sense a voltage across the bit line.

According to another aspect of the present invention, there is provided a semiconductor storage device comprising a precharge circuit configured to precharge a bit line connected to a selected memory cell for a read operation, the precharge circuit including a first MOS transistor of a first conductivity type which has a gate connected to a read global bit line, a second MOS transistor of a second conductivity type which has a gate connected to the read global bit line, the second MOS transistor having a current path one end of which is connected to one end of a current path in the first MOS transistor, a third MOS transistor of the first conductivity type which has a current path one end of which is connected to the other end of the current path in the first MOS transistor, the other end of the current path in the third MOS transistor being connected to a power supply, the third MOS transistor having a gate to which a precharge signal is supplied, a fourth MOS transistor of the second conductivity type which has a gate connected to a junction between the current paths in the first and second MOS transistors and which has a current path one end of which is connected to one end of the bit line, the fourth MOS transistor controlling a charge level of the bit line, and a fifth MOS transistor of the second conductivity type which has a current path one end of which is connected to the other end of the bit line, the other end of the current path in the fifth MOS transistor being connected to one end of the read global bit line, the fifth MOS transistor having a gate to which a separation signal is supplied; a discharge circuit configured to discharge the bit line using a current flowing through the selected memory cell; and a sense amplifier configured to sense a voltage across the bit line.

BRIEF DESCRIPTION OF THE SEVERAL VIEWS OF THE DRAWING

FIG. 6 is a circuit diagram showing an example of the configuration of a first precharge circuit in the circuit shown in FIG. 5;

FIG. 7A is a circuit diagram showing an example of the configuration of a second precharge circuit in the circuit shown in FIG. 5;

FIG. 13 is a circuit diagram of a memory cell array, a write decoder, and a select gate decoder provided in the 2TR flash memory according to the first embodiment of the present invention;

FIG. 18 is a plan view of the memory cell array provided in the 2TR flash memory according to the first embodiment of the present invention, the view showing the planar pattern of the fourth-level metal interconnect layers;

FIG. 21 is a sectional view taken along line X3-X3' in FIG. 14;

FIG. 41 is a circuit diagram showing how the prime cell array, the write selector, the write circuit, and the switch group operate during a read operation of the 2Tr flash memory according to the first embodiment of the present invention;

FIG. 53 is a circuit diagram of the memory cell array and the write decoder during a write operation of the 2Tr flash memory according to the second embodiment of the present invention;

FIG. 54 is a circuit diagram of the memory cell array and the write decoder during an erase operation of the 2Tr flash memory according to the second embodiment of the present invention;

FIG. 59 is a timing chart of various signals output during a read operation of the 2Tr flash memory according to the third embodiment of the present invention;

FIG. 60 is a timing chart of various signals output during the read operation of the 2Tr flash memory according to the third embodiment of the present invention;

FIG. 61 is a timing chart of various signals output during the read operation of the 2Tr flash memory according to the third embodiment of the present invention;

FIG. 62 is a timing chart of various signals output during the read operation of the 2Tr flash memory according to the third embodiment of the present invention;

FIG. 74 is a block diagram of a memory cell array provided in a 2Tr flash memory according to a third variation of any of the first to fourth embodiment of the present invention;

FIG. 75 is a block diagram of a memory card comprising the flash memory according to any of the first to fourth embodiment of the present invention;

FIG. 78 is a diagram showing the appearance of a connection device used to connect the memory card comprising the flash memory according to any of the first to fourth embodiment of the present invention;

FIG. 79 is a diagram showing the appearance of the connection device used to connect the memory card comprising the flash memory according to any of the first to fourth embodiment of the present invention;

FIG. 80 is a diagram showing the appearance of an IC card comprising a flash memory according to any of the first to fourth embodiments of the present invention.

DETAILED DESCRIPTION OF THE INVENTION

Figure 1:
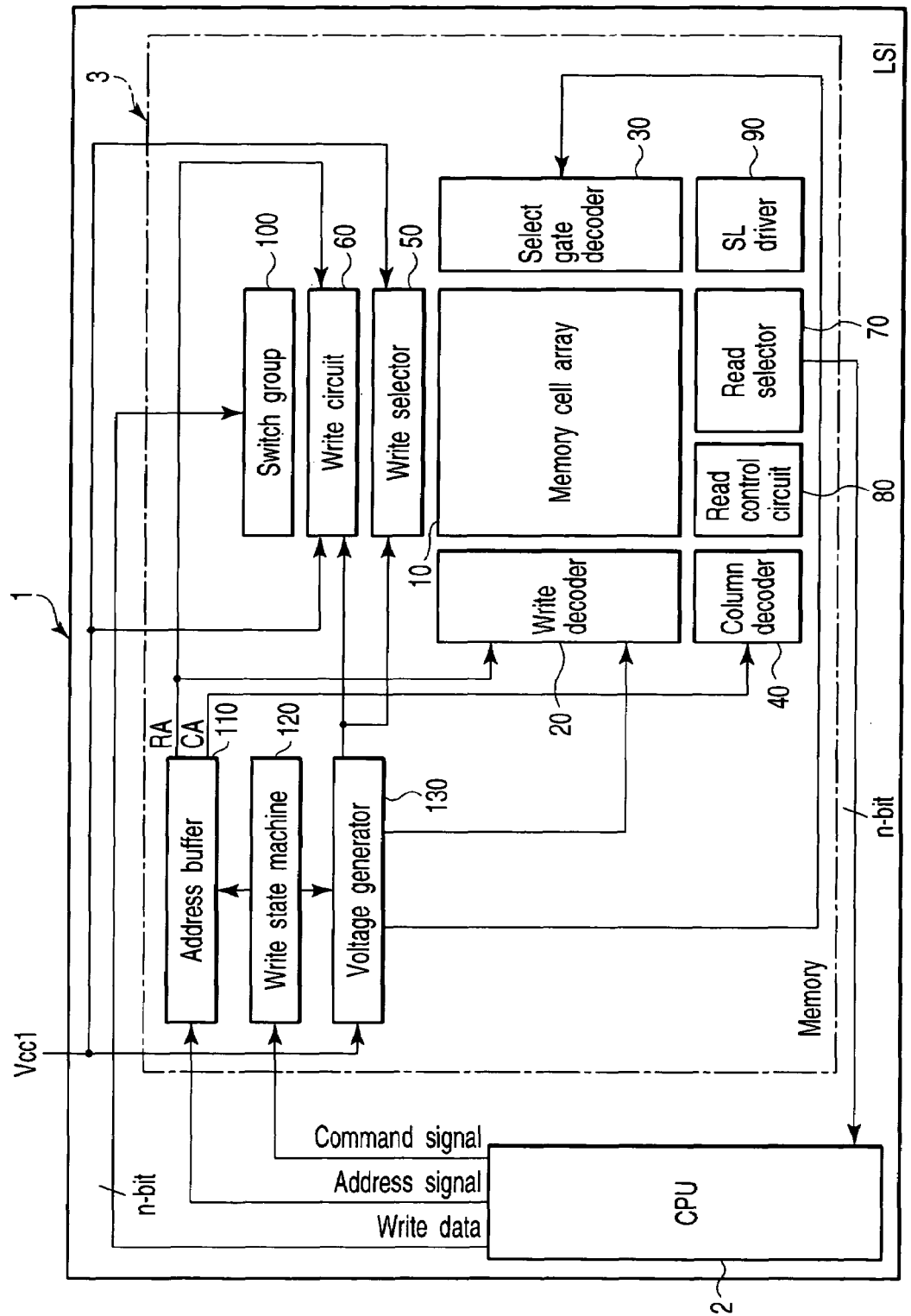
FIG. 1 is a block diagram of a system LSI according to a first embodiment of the present invention.

With reference to FIG. 1, description will be given of a semiconductor storage device according to a first embodiment of the present invention. FIG. 1 is a block diagram of a system LSI according to the present invention.

As shown in the figure, a system LSI 1 comprises CPU 2 and a 2Tr flash memory 3. The CPU 2 transmits and receives data to and from the flash memory 3. The flash memory 3 comprises a memory cell array 10, a write decoder 20, a select gate decoder 30, a column decoder 40, a write selector 50, a write circuit 60, a read circuit 70, a read control circuit 80, a source line driver 90, a switch group 100, an address buffer 110, a write state machine 120, and a voltage generator 130. The LSI 1 is supplied with an external voltage Vcc1 (up to 3 V) that is provided to the voltage generator 130, the write circuit 60, and the write selector 50.

Figure 2:
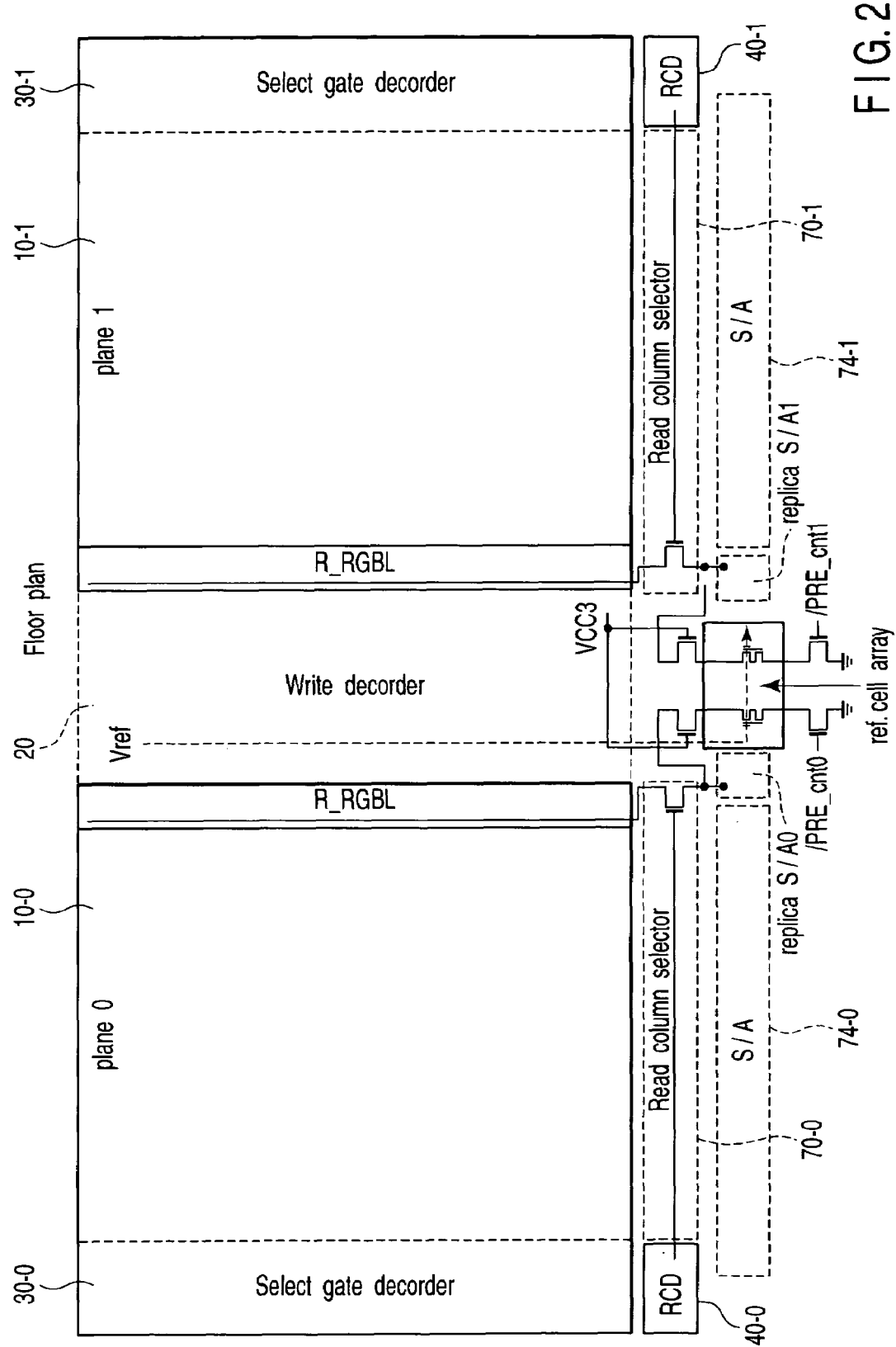
FIG. 2 is a block diagram showing an example of a plan view in which a memory cell array and its periphery are extracted from the system LSI shown in FIG. 1.

FIG. 2 shows a specific example of a plan view (floor plan) of the memory cell array 10 and its periphery extracted from the system LSI shown in FIG. 1. The memory cell array 10 is divided into two planes, plane 0 10-0 and plane 1 10-1. The write decoder 20 is placed between the plane 10-0 and 10-1. Further, select gate decoders 30-0 and 30-1 are arranged on the respective sides of the set of planes 10-0 and 10-1.

Read circuits (read column selectors) 70-0 and 70-1 and sense amplifiers (S/A) 74-0 and 74-1 are provided in association with the planes 10-0 and 10-1, respectively. Column decoders (read column decoders RCD) 40-0 and 40-1 are arranged in association with the select gate decoders 30-0 and 30-1, respectively.

replica sense amplifier amplifiers (replica S/A0 and replica S/A1) and a reference cell array (ref. cell array) are arranged in the region between the sense amplifiers (S/A) 74-0 and 74-1. The reference cell array is shared by the two planes 10-0 and 10-1. Each of the reference cells in the reference cell array is provided for one corresponding block. In other words, one reference cell is provided for each replica sense amplifier. Signal /PRE cnt0 enables the reference cells to discharge the Replica RGBL and LBL in the plane 10-0 (plane 0) and Signal/PRE cnt1 enables the reference cells to discharge the Replica RGBL and LBL in the plane 10-1 (plane 1). The gate voltage of the reference cells is the same for the two planes 10-0 and 10-1. The reference cells are connected to transistors with gates to which power supply voltage VCC3 is applied.

Figure 3:
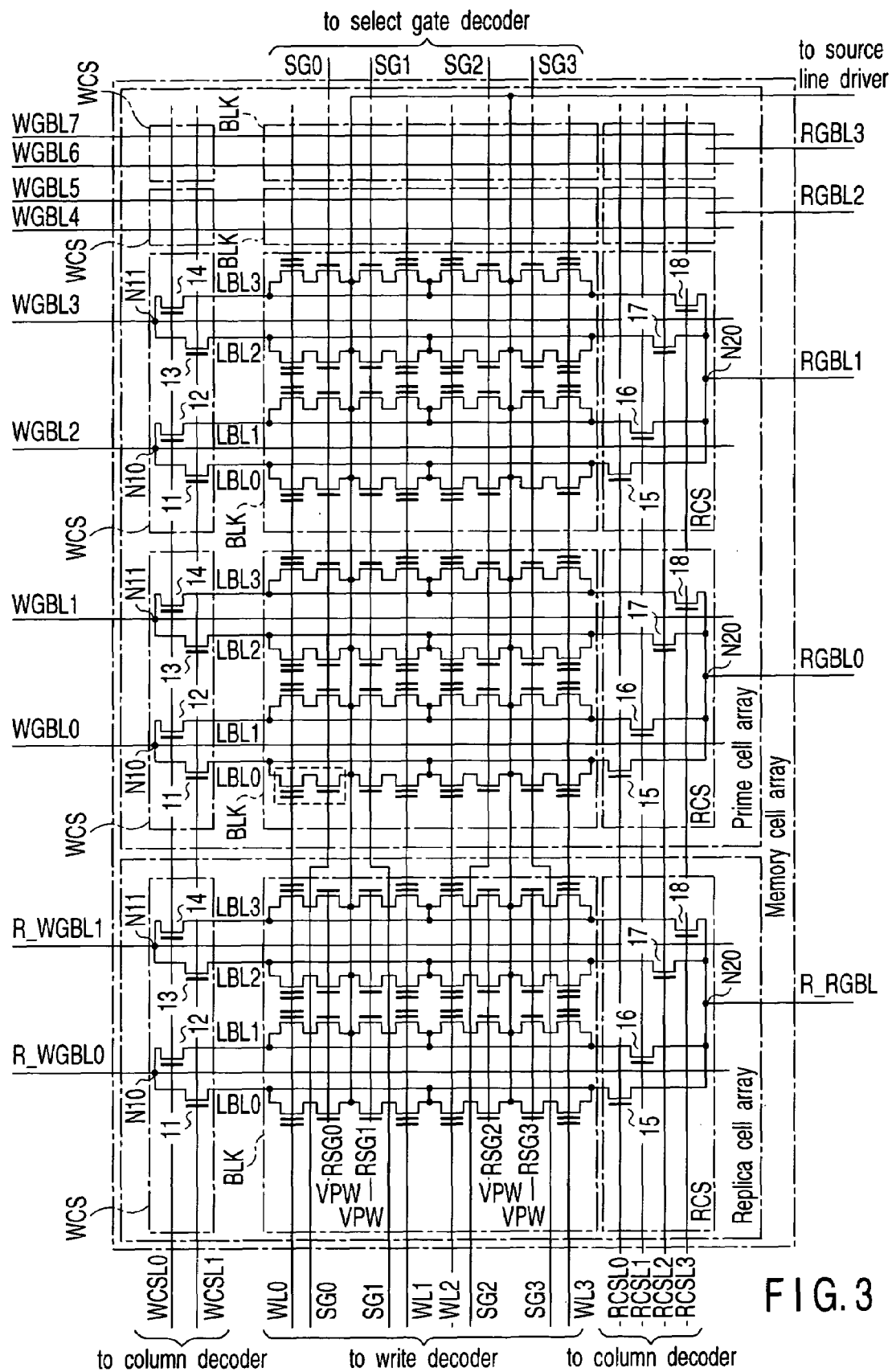
FIG. 3 is a circuit diagram of a memory cell array in a 2Tr flash memory according to a first embodiment of the present invention.

The memory cell array (planes 10-0 and 10-1) has a plurality of memory cells arranged in a matrix. The configuration of the memory cell array 10 will be described with reference to FIG. 3. FIG. 3 is a circuit diagram of a particular region of the plane 10-0 or 10-1.

As shown in the figure, each of the planes 10-0 and 10-1 comprises a prime cell array PCA and a replica cell array RCA.

The prime cell array PCA has ((m+1)×(n+1); m and n are natural numbers) memory cell blocks BLK and a first column selector WCS and a second column selector RCS provided for each of the memory cell blocks BLK. The replica cell array RCA has ((m+1)×1) memory cell blocks BLK and the first column selector WCS and second column selector RCS provided for each of the memory cell blocks BLK. In FIG. 3, the number of columns in each of the memory cell blocks included in the replica cell array RCA is 1. However, this is only an example and a plurality of columns may be provided.

Each memory cell block BLK includes a plurality of memory cells MC. The memory cells MC are of a 2Tr flash memory. That is, each memory cell MC has a memory transistor MT and a select transistor ST. A source of the memory cell transistor MT is connected to a drain of the select transistor ST. The memory cell transistor MT comprises a stacked gate structure having a floating gate formed on a semiconductor substrate via a gate insulating film and a control gate structure formed on the floating gate via a gate insulating film. Memory cells MC adjacent to each other across the columns share a drain region of the memory cell transistor MT or a source region of the select transistor ST. Each memory cell block BLK includes (4×4) memory cells (MC). In FIG. 3, four memory cells MC are arranged across the columns. However, this is only an example, and for example, 8 or 16 memory cells MC may be provided in this direction. The number of memory cells is not limited. A drain region of each of the memory cell transistors MT in the four memory cells MC is connected to the corresponding one of four local bit lines LBL0 to LBL3. One end of each of the local bit lines LBL0 to LBL3 is connected to the first column selector WCS. The other end local bit line is connected to the second column selector RCS. The memory cells MC in the prime cell array PCA are used to actually store data. On the other hand, the memory cells MC in the replica cell array RCA are not used to store data but to control operations of reading data from the prime cell array PCA. In the description below, to distinguish the memory cells in the prime cell array PCA from those in the replica cell array RCA, the former will be called prime cells PC and the latter will be called replica cells RC.

In each of the planes 10-0 and 10-1, the control gates of all the memory cell transistors MT on the same row are connected to one of word lines WL0 to WL(4m−1). Each of the local bit lines LBL0 to LBL3 connects the memory cell transistors only in the corresponding memory cell block BLK. However, the word line WL connects the memory cell transistors in all the memory cell blocks on the same row. Moreover, the word line WL connects the memory cell transistors in the prime cell array PCA and replica cell array RCA.

In the prime cell array PCA, the gates of the select transistors ST on the same row are connected to one of select gate lines SG0 to SG(4m−1). Each select gate line connects the gates of all the select transistors on the same row in all the memory cell blocks BLK. Moreover, in the replica cell array RCA, the gates of all the select transistors ST on the same row are connected to one of replica select gate lines RSG0 to RSG(4m−1).

The word lines WL0 to WL(4m−1) are connected to the write decoder 20. One end of each of the select gate lines SG0 to SG(4m−1) is connected to a select gate decoder 30-0 or 30-1. The other end of the select gate line traverses the replica cell array RCS and is connected to the write decoder 20. That is, the replica cell array RCA is placed at the inner end of the plane 10-0 or 10-1 and at the position farthest from the select gate decoder 30. The replica select gate lines RSG0 to RSG(4m−1) are separated from the select gate lines SG0 to SG(4m−1) and have the same potential (VPW) as that of a well region in which the planes 10-1 and 10-1 are formed. The source regions of the select transistors in a plurality of memory cell blocks BLK are connected together and to a source line driver 90.

Now, the configuration of the first column selector WCS will be described. Each first column selector WCS comprises four MOS transistors 11 to 14. One end of a current path in each of the MOS transistors 11 to 14 is connected to one end of the corresponding one of the local bit lines LBL0 to LBL3. The other ends of the current paths in the MOS transistors 11 and 12 are connected together. The other ends of the current paths in the MOS transistors 13 and 14 are connected together. A common connection node connecting the MOS transistors 11 and 12 together will be called a node N10 below. A common connection node connecting the MOS transistors 13 and 14 together will be called a node N11 below. The gate of each of the MOS transistors 11 to 14 is connected to one of write column select lines WCSL0 to WCSL(2m−1). The MOS transistors 11 and 13 included in all the first column selectors WCS on the same row are connected to the same write column select line WCSLi (i: 1, 3, 5, ... ). The MOS transistors 12 and 14 included in the first column selectors WCS on the same row are connected to the same write column select line WCSL(i−1). For a write operation, the column decoder 40-0 or 40-1 selects one of the write column select lines WCSL0 to WCSL(2m−1).

The nodes N10 and N11 in the prime cell array PCA are each connected to the corresponding one of write global bit lines WGBL0 to WGBL(2n−1). On the other hand, the nodes N10 and N11 in the replica cell array RCA are connected to replica write global bit lines R_WGBL0 and R_WGBL1, respectively. Each of the write global bit lines WGBL0 to WGBL(2n−1) and replica write global bit lines R_WGBL0 and R_WGBL1 connects the nodes N10 or N11 in all the first column selectors WCS on the same column.

Now, the configuration of the second column selector RCS will be described. Each second column selector RCS comprises four MOS transistors 15 to 18. One end of a current path in each of the MOS transistors 15 to 18 is connected to the other end of the corresponding one of the local bit lines LBL0 to LBL3. The other ends of the current paths in the MOS transistors 15 to 18 are connected together. The common connection node connecting the MOS transistors 15 to 18 together will be called a node N20 below. The gates the MOS transistors 15 to 18 are connected to different read column select lines RCSL0 to RCSL(4m−1). The MOS transistors 15 to 18 included in all the second column selectors RCS on the same row are connected to read column select lines RCSL0 to RCSL(4m−1), respectively. For a read operation, the column decoder 40-0 or 40-1 selects one of the read column select lines RCSL0 to RCSL(4m−1).

The nodes N20 in the prime cell array PCA are each connected to the corresponding one of read global bit lines RGBL0 to RGBL(n−1). On the other hand, the nodes N20 in the replica cell array RCA are connected to a replica read global bit line R_RGBL. Each of the read global bit lines RGBL0 to RGBL(n−1) and replica read global bit line R_RGBL connects the nodes N20 in all the first column selectors RCS on the same column.

Another description may be given of the configuration of the memory cell array 10 (planes 10-0 and 10-1) according to the present embodiment. A plurality of memory cells are arranged in a matrix in the memory cell array 10. A common word line connects to the control gates of the memory cell transistors MT in all the memory cells MC on the same row. A common select gate line connects to the gates of the select transistors in all the memory cells on the same row. One of the local bit lines LBL0 to LBL3 connects to the drains of the memory cell transistors MT in the four memory cells MC on the same row. That is, of the plurality of memory cells MC in the memory cell array 10, every four memory cells MC arranged in a line are connected to a different one of the local bit lines LBL0 to LBL3. One end of each of the local bit lines LBL0 and LBL1 on the same column is connected to the same one of the write global bit lines WGBL0 to WGBL(2n−1) via the MOS transistors 11 and 12, respectively. One end of each of the local bit lines LBL2 and LBL3 on the same column is connected to the same one of the write global bit lines WGBL0 to WGBL(2n−1) via the MOS transistors 13 and 14, respectively. The other end of each of the local bit lines LBL0 to LBL3 on the same column is connected to the same one of the write global bit lines RGBL0 to RWGBL(2n−1) via the corresponding one of the MOS transistors 15 to 18. The sources of the select transistors ST in the memory cells MC are connected together and to the source line driver. In the memory cell array configured as described above, one memory cell block BLK is composed of four columns of the four memory cells MC connected to the same local bit line. The same memory cell block is connected to the common write global bit line and the common read global bit line. In the above configuration, the memory cells MC in the memory cell block BLK located farthest from the select gate decoder 30 function as replica cells.

The number of memory cells in the memory cell block, the number of read global bit lines RGBL, and the number of read global bit lines WGBL are not limited to those in the present example of the configuration. Further, each of the local bit lines LBL0 to LBL3 in the prime cell array PCA has a parasitic capacitance smaller than that of each of the local bit lines LBL0 to LBL3 in the replica array RCA. This relationship is established even when all the prime cells connected to each of the local bit lines LBL0 to LBL3 in the prime cell array PCA.

FIG. 1 will be referred to again. The write circuit 60 latches write data.

The write selector 50 applies a write voltage or a write inhibition voltage to the write global bit line and the replica global bit line.

The switch group 100 transfers write data provided by CPU 2 to the write circuit 60.

Figure 4:
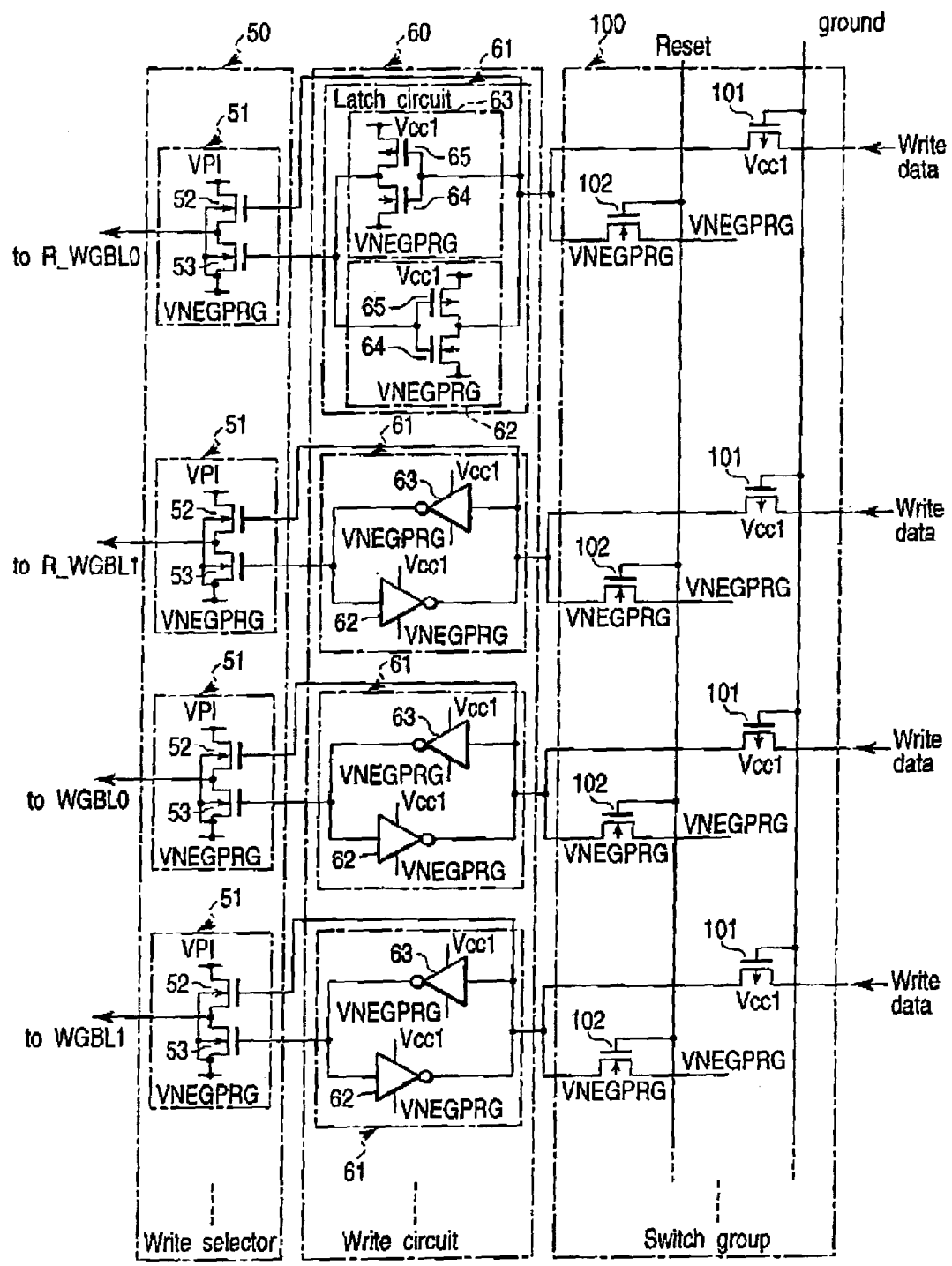
FIG. 4 is a circuit diagram of a write selector, a write circuit, and a switch group provided in the 2Tr flash memory according to the first embodiment of the present invention.

With reference to FIG. 4, description will be given of the configuration of the write selector 50, write circuit 60, and switch group 100. FIG. 4 is a circuit diagram of the write selector 50, write circuit 60, and switch group 100.

First, the write selector 50 will be described. The write selector 50 comprises select circuits 51 each provided for the corresponding one of the write global bit lines WGBL0 to WGBL(2n−1), R_WGBL0, and R_WGBL1. Each of the select circuits 51 comprises two n channel MOS transistors 52 and 53. The write inhibition voltage VBI is applied to a source of the n channel MOS transistor 52. A drain of the n channel MOS transistor 52 is connected to corresponding write global bit line. The write voltage VNEGPRG is applied to a source of the n channel MOS transistor 53. A drain of the n channel MOS transistor 53 is connected to the corresponding write global bit line and to the drain of the n channel MOS transistor 52. The write voltage VNEGPRG is applied to back gates of the n channel MOS transistors 52 and 53.

Now, the write circuit 60 will be described. The write circuit 60 comprises latch circuits 61 each provided for the corresponding one of the write global bit lines WGBL0 to WGBL(2n−1), R_WGBL0, and R_WGBL1. Each of the latch circuits 61 comprises two inverters 62 and 63. An input end of the inverter 62 is connected to an output end of the inverter 63. An output end of the inverter 62 is connected to an input end of the inverter 63. An output node of the latch circuit 61 is composed of a connection node connecting the input end of the inverter 62 and the output end of the inverter 63. The output node is connected to the corresponding bit line. The inverters 62 and 63 each comprise an n channel MOS transistor 64 and a p channel MOS transistor 65. The write voltage VNEGPRG is applied to a source of the n channel MOS transistor 64. The voltage Vcc1 (=3 V: constant) is applied to a source of the p channel MOS transistor 65. That is, the inverters 62 and 63 each operate using Vcc1 and VNEGPRG as low and high power supply voltages, respectively. A gate of the n channel MOS transistor 64 is connected to a gate of the p channel MOS transistor 65. A connection node connecting drains of the p and n channel MOS transistors 65 and 64 in the inverter 63 is connected to a connection node connecting the gates of the p and n channel MOS transistors 65 and 64 in the inverter 62. The connection node connecting drains of the p and n channel MOS transistors 65 and 64 in the inverter 63 is further connected to the corresponding write global bit line. A connection node connecting drains of the p and n channel MOS transistors 65 and 64 in the inverter 62 is connected to a connection node connecting the gates of the p and n channel MOS transistors 65 and 64 in the inverter 63. These connection nodes constitute an input node of the latch circuit 61.

The switch group 100 includes p channel MOS transistors 101 and n channel MOS transistors 102 so that each pair of the p channel MOS transistor 101 and n channel MOS transistor 102 is provided for the corresponding latch circuit 61 (the MOS transistor 102 will be referred to as a reset transistor below). Write data is input to one end of a current path in the p channel MOS transistor 101. The other end of the current path is connected to the input node of the corresponding latch circuit 61. A gate of the MOS transistor 101 is always grounded. The voltage Vcc1 is applied to a back gate of the MOS transistor 101. The write voltage VNEGPRG is applied to one end of a current path in the reset transistor and to a back gate of the reset transistor. The other end of the reset transistor is connected to the input node of the latch circuit 61 and the other end of the current path in the p channel MOS transistor 101. The gates of all the reset transistors 102 are connected together. A reset signal Reset is input to these connected gates. The same ends of the current paths in the reset transistors 102 are also connected together. The voltage VNEGPRG is collectively applied to these ends.

With reference to FIG. 1 again, LSI 1 will be described.

The column decoder 40 decodes a column address signal to obtain a column address decode signal. On the basis of the column address decode signal, the column select lines WCSL and RSCL perform a selecting operation.

For a read operation, the read circuit 70 precharges the read global bit lines RGBL0 to RGBL(n−1). The read circuit 70 then amplifies data read onto the read global bit lines RGBL0 to RGBL(n−1).

For a read operation, the read control circuit 80 precharges and discharges the replica read global bit line R_RGBL. The read circuit 70 is then controlled on the basis of the times required to precharge and discharge the replica read global bit line R_RGBL.

Figure 5:
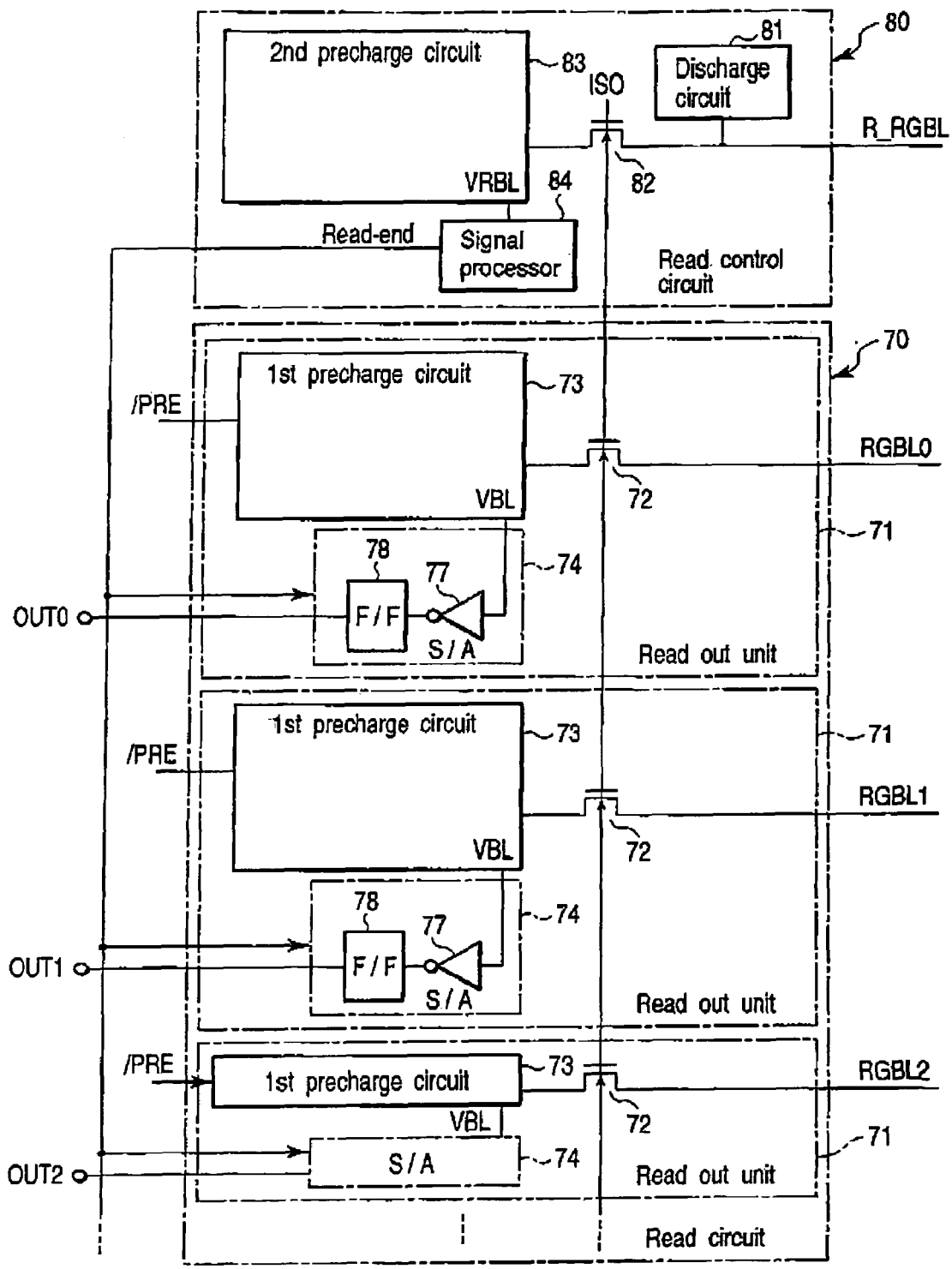
FIG. 5 is a circuit diagram of a read circuit and a read control circuit provided in the 2Tr flash memory according to the first embodiment of the present invention.

With reference to FIG. 5, description will be given of the configuration of the read circuit 70 and read control circuit 80. FIG. 5 is a circuit diagram of the read circuit 70 and read control circuit 80.

First, the read circuit 70 will be described. The read circuit 70 comprises read out units 71 each provided for the corresponding one of the read global bit lines RGBL0 to RGBL(n−1). Each of the read out units 71 comprises an isolating MOS transistor 72, a first precharge circuit 73, and a sense amplifier 74.

For a read operation, the first precharge circuit 73 precharges the corresponding one of the read global bit lines RGBL0 to RGBL(n−1). The first precharge circuit 73 is composed of, for example, p channel MOS transistors Q1, Q3, and Q5 and n channel MOS transistors Q2, Q4, Q6, and Q7 as shown in FIG. 6. A source of the MOS transistor Q1 is connected to the power supply VDD. A precharge signal /PRE is supplied to a gate of the MOS transistor Q1. A drain of the MOS transistor Q2 is connected to a drain of the MOS transistor Q1. A source of the MOS transistor Q2 is connected to an input end of an inverter 77 in the sense amplifier 74 and to a source of the isolating MOS transistor 72. Current paths in the MOS transistors Q5, Q3, Q4, and Q6 are connected in series between the power supply VDD and a ground point. Gates of the MOS transistors Q3 and Q4 are connected to the source of the MOS transistor Q2. The precharge signal /PRE is supplied to a gate of the MOS transistor Q5. A gate of the MOS transistor Q6 is connected to the power supply VDD. The junction between drains of the drains of the MOS transistors Q3 and Q4 is connected to a gate of the MOS transistor Q2. A drain of the MOS transistor Q7 is connected to the gate of the MOS transistor Q2. A source of the MOS transistor Q7 is connected to the ground point. The precharge signal /PRE is supplied to a gate of the MOS transistor Q7.

In the above configuration, in the MOS transistors Q5, Q3, Q4, and Q6 with the current paths connected in series, when the precharge signal /PRE is made low, the MOS transistor Q5 is turned on to output a bias voltage BIAS. The gate voltage of the MOS transistor Q2 is thus adjusted to control the level of the corresponding bit line. After the bit line is charged, the precharge signal /PRE goes high to turn off the MOS transistor Q5. The MOS transistors Q4 and Q6 discharge the gate (bias voltage BIAS) of the MOS transistor Q2 to ground potential. This turns off the MOS transistor Q2 to prevent the charge present at the drains of the MOS transistors Q1 and Q2 from migrating to the bit line. It is therefore possible to eliminate the effect of weakly charging the bit line after precharging.

If the bit line is low and the MOS transistor Q4 has a high threshold voltage, when the precharge signal /PRE goes high, the MOS transistor Q7 sets the gate voltage of the MOS transistor Q2, in other words, the bias voltage BIAS, to the ground potential. That is, the MOS transistors Q5, Q3, Q4, and Q6 with the current paths connected in series make it possible to increase operation speed and reduce power consumption. However, the MOS transistors Q5, Q3, Q4, and Q6 prevent a delay in setting the level of the bias voltage BIAS at 0 V if the bit line and the input end of the inverter 77 are at a low precharge level and if the MOS transistor Q4 has a high threshold voltage. Further, precharging sets the bit line at a voltage level of about VDD/2. Accordingly, the MOS transistor Q4 cannot discharge the gate (bias node) of the MOS transistor Q2 rapidly. However, since the precharge signal /PRE is input to the gate of the MOS transistor Q4, the bias voltage BIAS can be logically set at 0 V quickly. Thus, the high precharge signal /PRE enables the MOS transistor Q2 to be turned off quickly. Thus makes it possible to more quickly shut down migration of the charge present at the drains of the MOS transistors Q1 and Q2 to the bit line. The speed of a read operation performed on a memory cell in the on state can be increased.

Further, during discharging, that is, while the precharge signal /PRE is high, the MOS transistor Q5 is off. Consequently, no through current flows through the MOS transistors Q5, Q3, Q4, and Q6 with the current paths connected in series between the power supply VDD and the ground point. This reduces power consumption. Furthermore, since the MOS transistors Q5 and Q7 are controlled using the precharge signal /PRE, no new signal needs to be added. Controlled can be simply performed.

Figure 8:
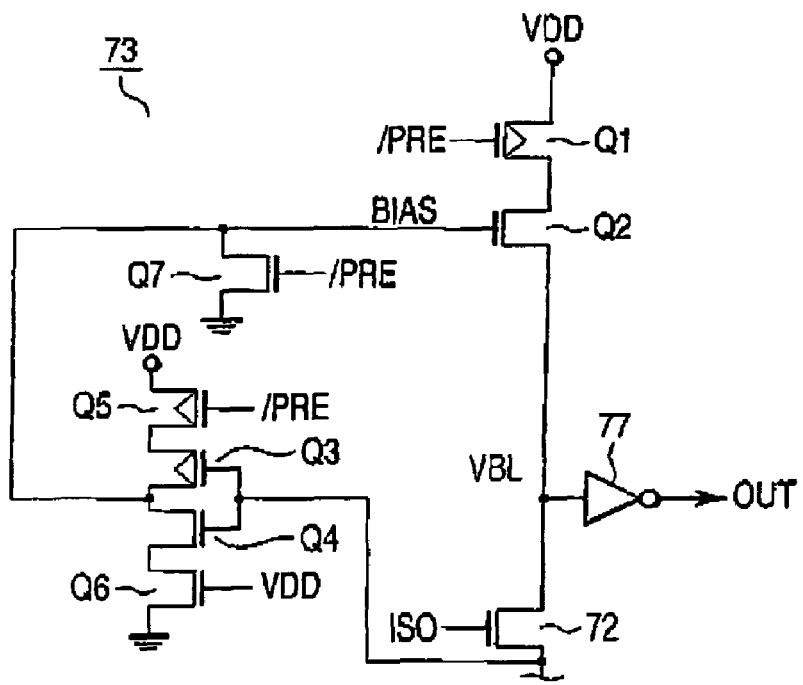
FIG. 8 is a circuit diagram showing another example of the configuration of the first precharge circuit in the circuit shown in FIG. 5.

In the first precharge circuit 73, the gates of the MOS transistors Q3 and Q4 may be connected to the source of the MOS transistor 72 as shown in FIG. 8. In the configuration shown in FIGS. 6 and 8, the source of the MOS transistor Q4 may be connected to the ground point with the MOS transistor Q6 not provided. Moreover, instead of connecting the gate of the MOS transistor to the power supply VDD, it is possible to feed back an output signal CMOUT from the inverter 77 via an inverter INV.

Figure 9:
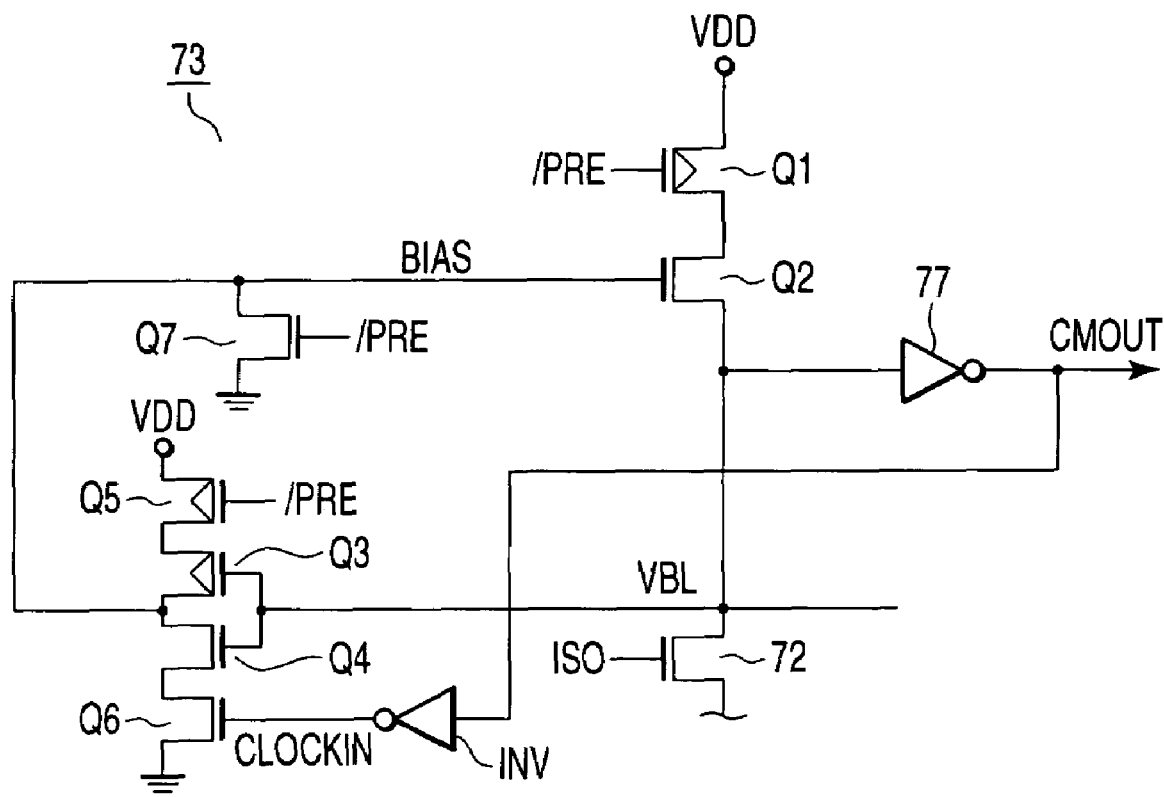
FIG. 9 is a circuit diagram showing yet another example of the configuration of the first precharge circuit in the circuit shown in FIG. 5.

In the configuration shown in FIG. 9, in an initial state, a voltage VBL is reset to 0 V. Accordingly, an output signal CLOCKIN from the inverter INV is low. When the precharge signal /PRE goes low to start precharging. Then, when the potential VBL is at a low level, the signal CLOCKIN stays low. Consequently, the bias node (bias voltage BIAS) is high. When the potential VBL and bit line are raised to a sufficiently high level, the signal CLOCKIN goes high. This enables feedback to be applied according to the level of the potential VBL.

The provision of the inverter INV allows the potential VBL to reach the threshold value faster than the bit line. Consequently, feedback is applied before the bit line is sufficiently precharged. The provision of the inverter allows precharging to be accomplished more quickly. Thus, the speed of precharging can be increased by applying feedback while monitoring the output signal CMOUT from the inverter 77.

Figure 7B:
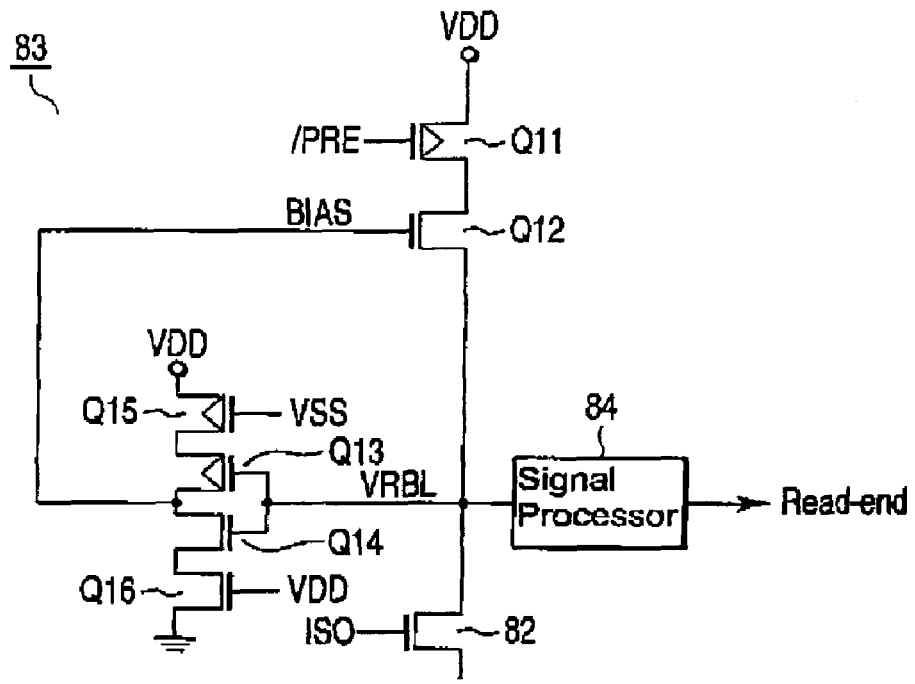
FIG. 7B is a circuit diagram showing another example of the configuration of the second precharge circuit in the circuit shown in FIG. 5.
Figure 11:
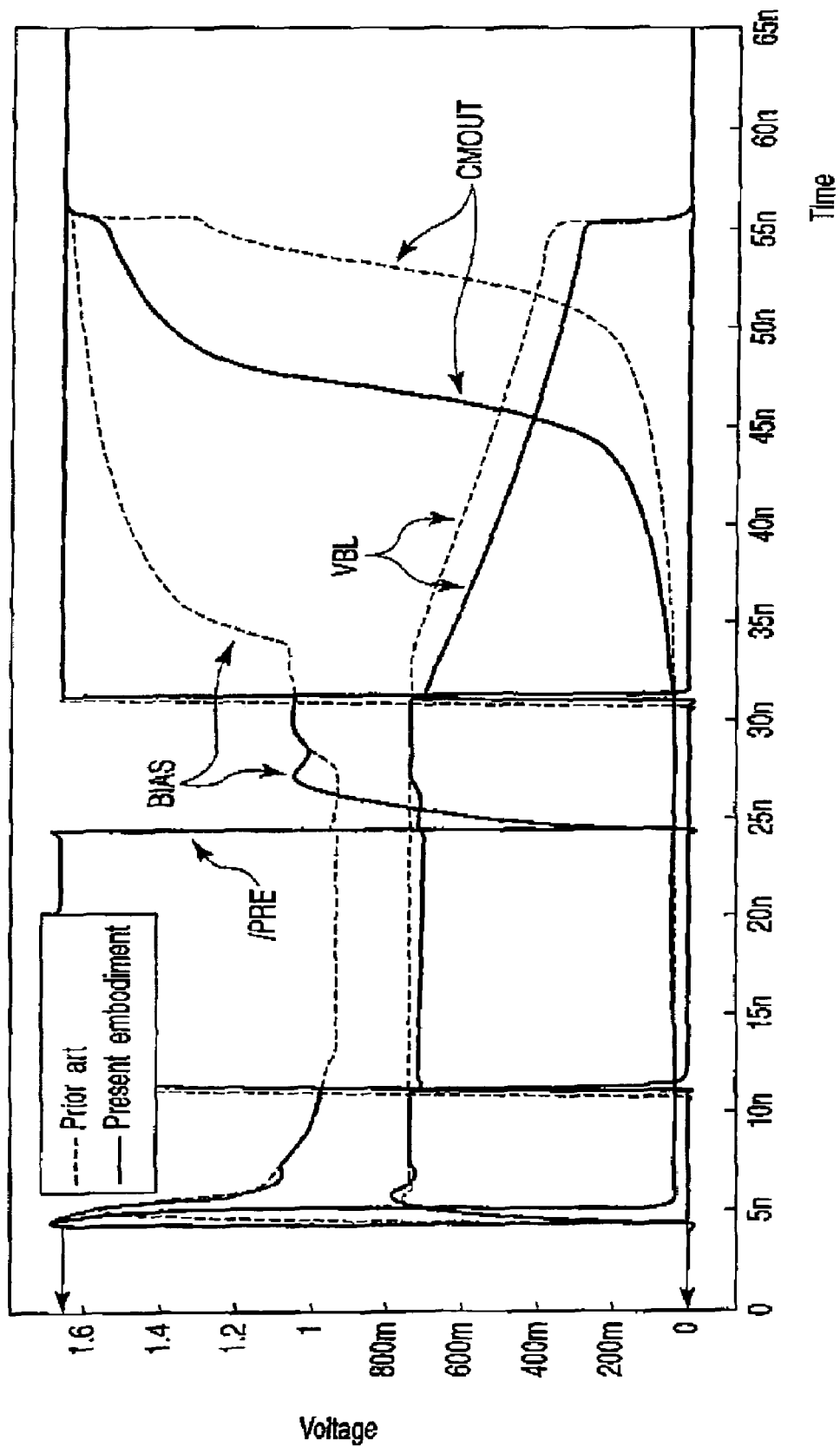
FIG. 11 is a waveform diagram showing variations in the potentials of nodes of a read circuit described in FIG. 7($b$) in Non-Patent Document 1 and of the read circuit according to the first embodiment.

FIG. 11 is a waveform diagram of variations in the potentials of the nodes of the read circuit described in FIG. 7(b) of Non-Patent Document 1 and of the read circuit according to the present embodiment. As shown in the figure, the bias voltage BIAS rises rapidly in response to transition of the precharge signal /PRE. This makes it possible to suppress wasteful current consumption. Further, a reduced amount of charge is present at the input node of the sense amplifier. The inversion speed of the output node CMOUT of the inverter 77 is increased.

For a read operation, the sense amplifier 74 amplifies the read data read onto the corresponding one of the read global bit lines RGBL0 to RGBL(n-1). The sense amplifier 74 comprises the inverter 77 and a flip flop 78. The input node of the inverter 77 is connected to the source of the MOS transistor Q2. The output node of the inverter 77 is connected to an input node of the flip flop 78. Output nodes OUT0 to OUTn of the flip flop 78 output the amplified read data.

The isolating MOS transistor 72 is an n channel MOS transistor having a current path one end of which is connected to the corresponding one of the read global bit lines RGBL0 to RGBL(n-1). The other end of the current path is connected to the source of the MOS transistor Q2 and to the input node of the inverter 77. That is, the first precharge circuit 73 and the sense amplifier 74 are connected to the corresponding ones of the read global bit lines RGBL0 to RGBL(n-1) via the isolating MOS transistor 72.

Now, the read control circuit 80 will be described. The read control circuit 80 comprises a discharge circuit 81, an isolating MOS transistor 82, a second precharge circuit 83, and a signal processor (or signal generator) 84.

For a read operation, the second precharge circuit 83 precharges the replica read global bit line R_RGBL. The second precharge circuit 83 has a configuration basically similar to that of the first precharge circuit and has the precharge capability as that of the first precharge circuit. That is, as shown in FIG. 7A, the second precharge circuit 83 is composed of p channel MOS transistors Q11, Q13, and Q15 and n channel MOS transistors Q12, Q14, and Q16. A source of the MOS transistor Q11 is connected to the power supply VDD. The precharge signal /PRE is supplied to a gate of the MOS transistor Q11. A drain of the MOS transistor Q12 is connected to a drain of the MOS transistor Q11. A source of the MOS transistor Q12 is connected to the input end of the inverter 77 in the sense amplifier 74 and to a drain of the isolating MOS transistor 82. Current paths in the MOS transistors Q15, Q13, Q14, and Q16 are connected in series between the power supply VDD and the ground point. Gates of the MOS transistors Q13 and Q14 are connected to a source of the MOS transistor Q12. The precharge signal /PRE is supplied to a gate of the MOS transistor Q15. A gate of the MOS transistor Q16 is connected to the power supply VDD. The junction between drains of the MOS transistors Q13 and Q14 is connected to a gate of the MOS transistor Q12.

As described above, the read circuit free from the MOS transistor Q7 is used as the read control circuit (replica read control circuit) 83. Then, this read circuit performs a reliably slower read operation than the read circuit 73 of the main body. Consequently, the read control circuit 83 is more accurate. Further, a delay circuit is not required which is used to output a signal (Read-end) indicating that the read operation has been finished. This circuit also eliminates the need to tune an additional capacitance compared to a circuit that uses a replica circuit having a configuration similar to that of the read circuit and memory cell array in the main body and having an additional capacitance.

In the circuit shown in FIG. 7A, the precharge signal /PRE is supplied to the gate of the MOS transistor Q15. However, ground potential VSS may be applied to the gate of the MOS transistor Q15 as shown in FIG. 7B. By thus applying the ground potential VSS to the gate of the MOS transistor Q15, it is possible to more reliably reduce the speed of a read operation performed on the replica circuit.

The second precharge circuit 83 may have a configuration similar to that of the first precharge circuit 73. Accordingly, it is possible to apply the circuit shown in FIGS. 6 and 8 and from which the MOS transistor Q6 is removed and the circuit shown in FIGS. 8 and 9 and from which the MOS transistor Q7 is removed.

The isolating MOS transistor 82 is an n channel MOS transistor having a current path one end of which is connected to the replica read global bit line R_RGBL. The other end of the current path is connected to the source of the MOS transistor Q12. That is, the second precharge circuit 83 is connected to the corresponding ones of the read global bit lines RGBL0 to RGBL(n-1) via the isolating MOS transistor 82. A gate of the MOS transistor 82 is connected to the gates of the isolating MOS transistors 72. A signal ISO is input to the gate of the MOS transistor 82.

For a read operation, the signal processor 84 generates a read end signal Read-end on the basis of the source potential of the MOS transistor Q12, that is, the potential across the replica read global bit line R_RGBL. The read end signal Read-end is input to the flip flop 78 of the sense amplifier 74.

The read end signal Read-end causes the flip flop 78 to establish the output.

Figure 10:
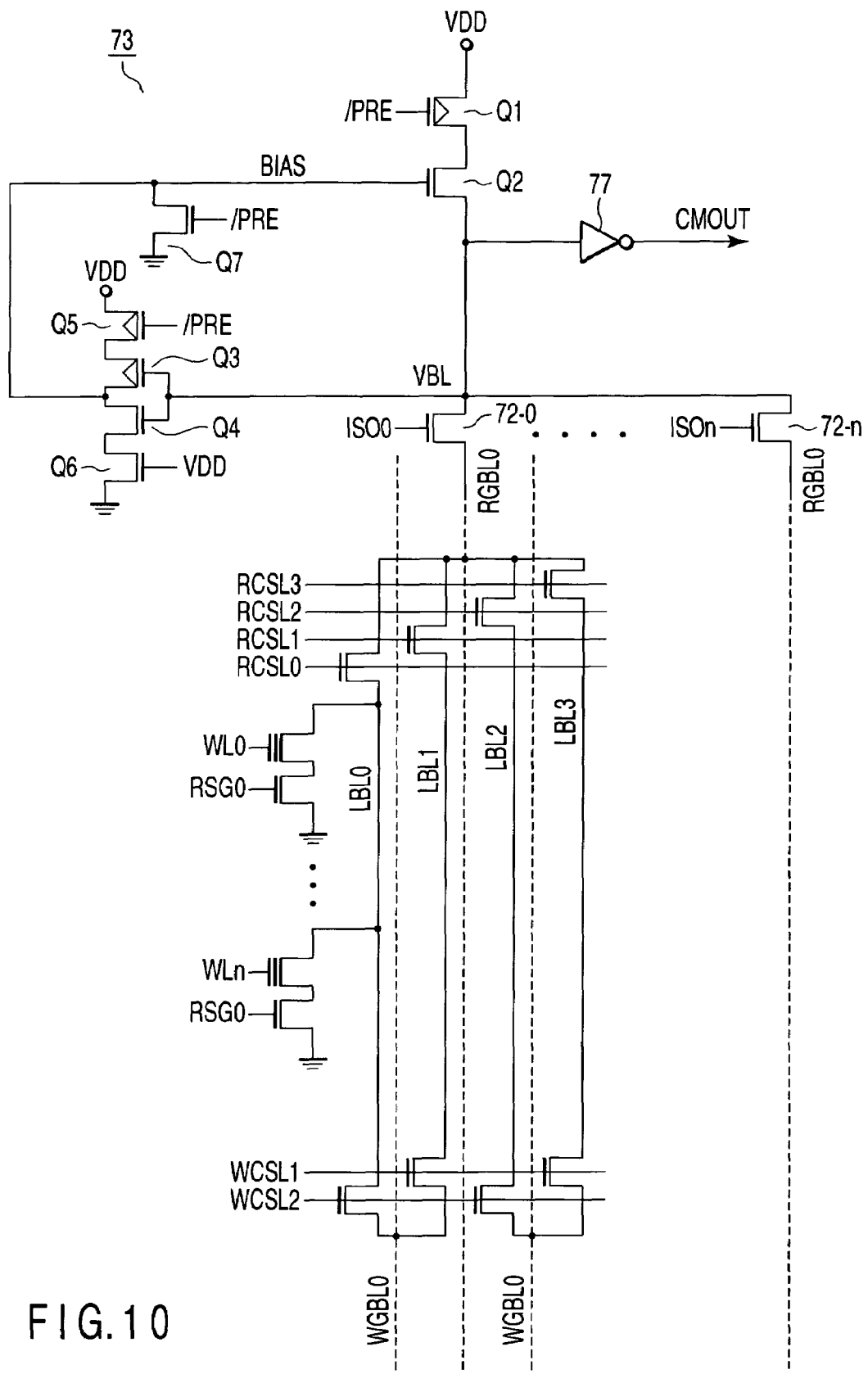
FIG. 10 is a circuit diagram illustrating another example of the configuration of the read circuit and read control circuit provided in the 2Tr flash memory according to the first embodiment of the present invention.

In the example shown in FIG. 5, one isolating MOS transistor is provided for each sense node. However, the present invention is also applicable to a configuration in which a plurality of (for example, 16) isolating MOS transistors 72-0 to 72-n are provided for each sense node as shown in FIG. 10.

Figure 12:
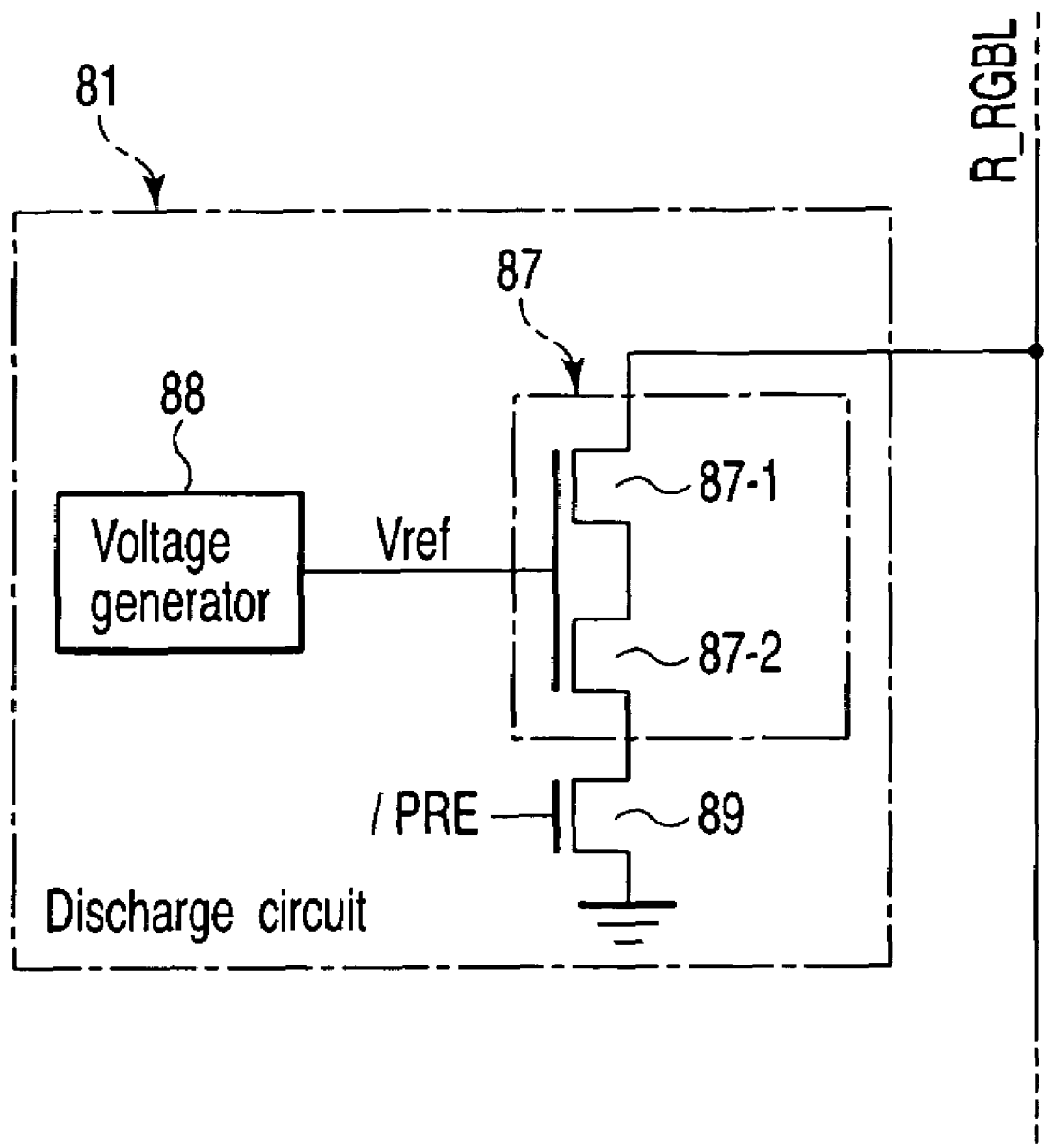
FIG. 12 is a circuit diagram of a discharge circuit provided in the 2Tr flash memory according to the first embodiment of the present invention.

The discharge circuit 81 discharges the replica read global bit line R_RGBL. The configuration of the discharge circuit 81 will be described with reference to FIG. 12. FIG. 12 is a circuit of the discharge circuit 81. As shown in the figure, the discharge circuit 81 comprises a current source circuit 87, a voltage generator 88, and an n channel MOS transistor 89.

The voltage generator 88 outputs a constant voltage Vref when discharging the replica read global bit line R_RGBL.

The current source circuit 87 conducts a current corresponding to the constant voltage Vref to discharge the replica read global bit line R_RGBL. The current source circuit 87 has n channel MOS transistors 87-1 and 87-2. A drain of the MOS transistor 87-1 is connected to the replica read global bit line R_RGBL. A source of the MOS transistor 87-1 is connected to a drain of the MOS transistor 87-2. A source of the MOS transistor 87-2 is connected to a drain of the MOS transistor 89. Gates of the MOS transistors 87-1 and 87-2 are connected together. The constant voltage Vref is applied to these gates.

A source of the MOS transistor 89 is grounded. The precharge signal /PRE is supplied to a gate of the MOS transistor 89. This makes the precharge signal /PRE high, that is, turns on the discharge circuit 81 on after precharging has been finished.

The current source circuit 87 may have for example, the same structure as that of the memory cell MC in the memory cell array 10. That is, the MOS transistor 87-1 corresponds to the memory cell transistor MT. The MOS transistor 87-2 corresponds to the select transistor ST. A contact plug is provided which is connected to floating gates of both transistors. The constant voltage Vref is applied to the contact plug.

FIG. 1 will be referred to again.

The source line driver 90 supplies a voltage to source lines SL.

An address buffer 110 retains an address signal provided by CPU 2. The address buffer 110 then supplies a column address signal CA to the column decoder 40 and a row address signal RA to the write decoder 20, select gate decoder 30, and write circuit 60.

On the basis of an instruction signal provided by CPU 2, a write state machine 120 controls the operation of each of the circuits contained in the flash memory 3. The write state machine 120 also controls timings for a data write, erase, and read operations. The write state machine 120 further executes a predetermined algorithm determined for each operation.

The voltage generator 130 generates a plurality of internal voltages on the basis of an externally input voltage Vcc1 (about 3 V). The voltage generator comprises a negative charge pump circuit and a positive charge pump circuit. The voltage generator generates negative voltages VBB1 (=−6 V), VBB2 (=−3.5 V), and VBB3 as well as a positive voltage VPP (=10 V). The write decoder 20 is supplied with the negative voltage VBB1 and the positive voltage VPP. The write selector 50 is supplied with the negative potentials VBB1, VBB2, and VBB3. The negative potential VBB1 is further supplied to the write circuit 60.

Now, with reference to FIG. 13, description will be given of the configuration of the write decoder 20 and select gate decoder 30. For a write operation, the write decoder 20 selects one of the word lines WL0 to WL(4m−1) and applies the positive potential VPP (10 V) to the selected word line. The write decoder 20 applies the negative potential VBB1 (−6 V) to all the select gate lines SG0 to SG(4m−1). Further, for an erase operation, the write decoder 20 applies the negative potential VBB1 to all the word lines and the positive potential VPP to all the select gate lines SG0 to SG(4m−1).

For a read operation, the select gate decoder 30 selects one of the select gate lines SG0 to SG(4m−1) and applies the positive potential Vcc1 to the selected select gate line. The select gate decoder 30 also controls the signal ISO and thus the operation of the isolating MOS transistor 82.

First, the configuration of the select gate decoder 30 will be described. The select gate decoder 30 comprises a row address decode circuit 31 and a switch element group 32. The row address decode circuit 31 operates at the power supply voltage Vcc1 to decode row address signals RA0 to RAi of (i+1) bits to obtain a row address decode signal. The row address decode circuit 31 has a NAND circuit 33 and an inverter 34 provided for each of the select gate lines SG0 to SG(4m−1). The NAND circuit 33 executes a NAND operation on the bits of the row address signals RA0 to RAi. The inverter 34 inverses the result of the NAND operation and outputs the inverted result as a row address decode signal.

The switch element group 32 has an n channel MOS transistor 35. The n channel MOS transistor 35 is provided for each of the select gate lines SG0 to SG(4m−1). An output from the inverter 34 is provided to the select gate lines SG0 to SG(4m−1) via the current path in the n channel MOS transistor 35. A control signal ZISOG is input to a gate of the n channel MOS transistor 35. The control signal ZISOG turns off the MOS transistor 35 for a write operation and turns it on for a read operation.

Now, the configuration of the write decoder 20 will be described. The write decoder 20 comprises a row address decode circuit 21 and a switch element group 22. The row address decode circuit 21 decodes the row address signals RA0 to RAi of (i+1) bits to obtain a row address decode signal. The row address decode circuit 21 has a NAND circuit 23 and an inverter 24 provided for each of the word lines WL0 to WL(4m−1). The NAND circuit 23 and the inverter 24 each have a positive power supply voltage node connected to a power supply voltage node VCGNW and a negative power supply voltage node connected to the power supply voltage node VCGPW. The NAND circuit 23 executes a NAND operation on the bits of the row address signals RA0 to RAi. The power supply voltage nodes VCGNW and VCGPW are provided with the positive voltage VPP, negative voltage VBB1, and 0 V generated by the voltage generator 130. The inverter 24 then inverses the result of the NAND operation and outputs the inverted result as a row address decode signal.

The switch element group 22 has an n channel MOS transistor 25. The n channel MOS transistor 25 is provided for each of the select gate lines SG0 to SG(4m−1). One end of a current path in the MOS transistor 25 is connected to the corresponding one of the select gate lines SG0 to SG(4m−1). The negative potential VBB1 and the positive potential VPP are applied to the other end of the current path. The control signal WSG is input to a gate of the MOS transistor 25. The control signal WSG turns on the MOS transistor 25 for a write and erase operations.

Moreover, the write decoder 20 applies the voltage VPW to the semiconductor substrate (well region) in which the memory cell array 10 is formed. The voltage VPW is provided to the replica select gate lines RSG0 to RSG(4m−1) connected to the well region.

Figure 14:
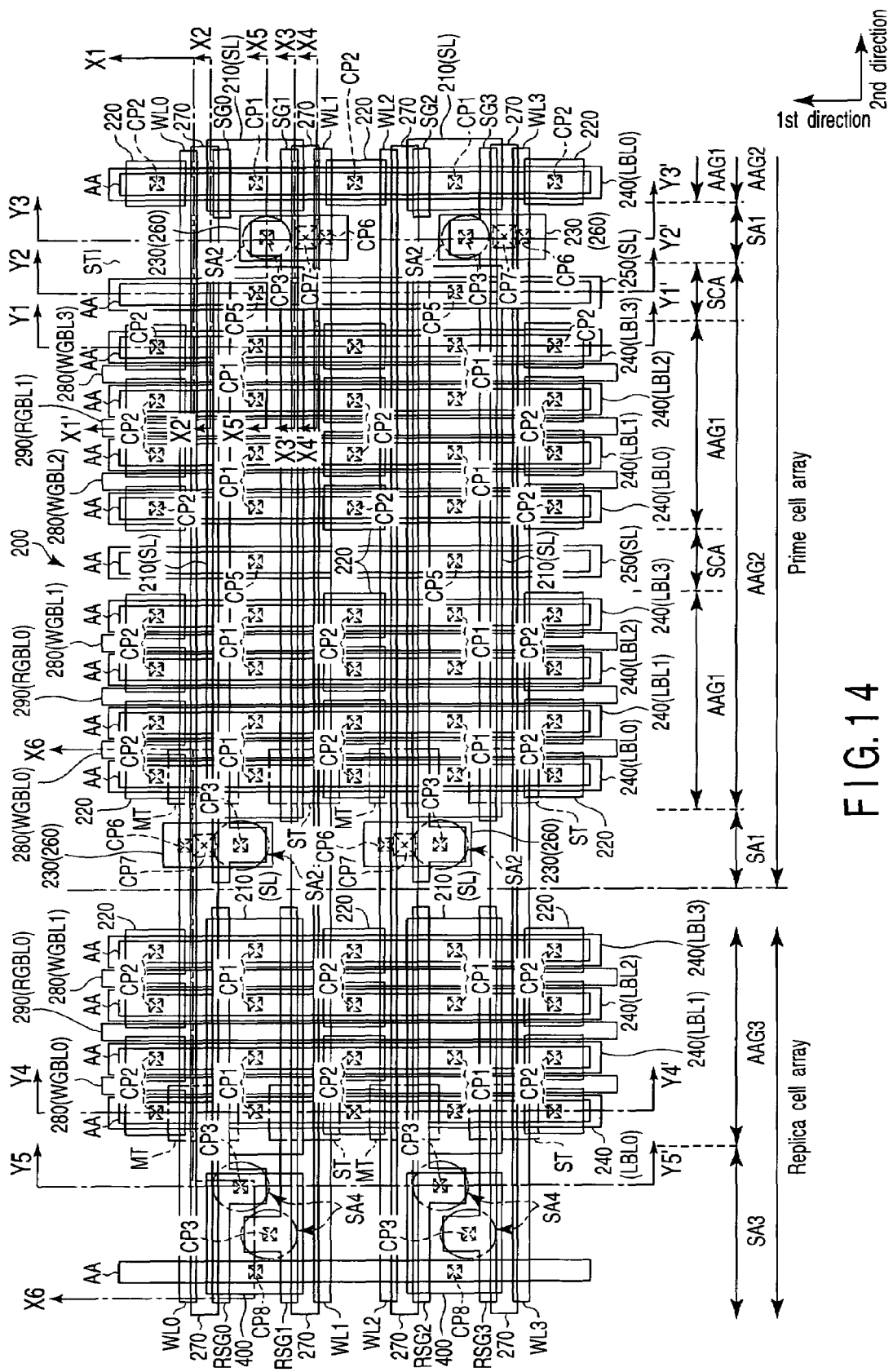
FIG. 14 is a plan view of a memory cell array provided in the 2TR flash memory according to the first embodiment of the present invention.

Now, with reference to FIGS. 14 to 18, description will be given of the planar structure of the memory cell array 10 provided in the 2Tr flash memory 3. FIG. 14 is a plan view of a particular region of the memory cell array 10. FIGS. 14 to 18 are plan views showing a planar pattern of the first to fourth-level metal interconnect layers in addition to element regions, word lines, and select gate lines. The area illustrated corresponds to FIG. 14.

As shown in FIGS. 14 to 18, a plurality of stripe-shaped element regions AA each extending in a first direction are formed in a semiconductor substrate (p-type well region) 200 along a second direction orthogonal to the first direction. The stripe-shaped word lines WL0 to WL(4m−1) are formed to stride the plurality of element regions AA; each of the stripe-shaped word lines WL0 to WL(4m−1) extends in the second reaction. Within the prime cell array PCA, the select gate lines SG0 to SG(4m−1) are formed parallel to the word lines WL0 to WL(4m−1). Within the replica cell array RCA, the replica select gate lines RSG0 to RSG(4m−1) are formed parallel to the word lines WL0 to WL(4m−1). The word lines WL0 to WL(4m−1) electrically connect the prime cell array PCA and the replica cell array RCA together. In contrast, the select gate lines SG0 to SG(4m−1) are electrically separated from the replica select gate lines RSG0 to RSG(4m−1). The memory cell transistor MT is formed in the region where any of the word lines WL0 to WL(4m−1) crosses the element region AA. On the other hand, the select transistor ST is formed in the region where any of the select gate lines SG0 to SG(4m−1) crosses the element region AA and in the region where any of the replica select gate lines RSG0 to RSG(4m−1) crosses the element region AA. The floating gates (not shown) of the memory cell transistors MT are each formed in the region where any of the word lines WL0 to WL(4m−1) crosses the element region AA; the floating gates are separated from one another. The select transistor ST has a control gate and a floating gate similarly to the memory cell transistor MT. However, in contrast to the memory cell transistors MT, the floating gates of the select transistors ST adjacent to each other in the second direction are connected together. The select gate lines SG or word lines WL in the adjacent prime cells are adjacent to each other. The replica select gate lines RSG or word lines WL in the adjacent replica cells are adjacent to each other.

In the prime cell array PCA, the four element regions AA are collectively called a first element region group AAG1. The region between the adjacent first element region groups AAG1 in which one element region AA is formed is called a source contact region SCA. The memory cells MC formed in the first element region group AAG1 are used to store data. However, the memory cells MC in the source contact region SCA are dummies and are not used to store data. Further, a stitch region SA1 is formed for every two first element region groups AAG1. In the present embodiment, no element region AA is formed in the stitch region SA1. The width of the stitch region SA1 is equal to that of one element region AA plus an isolation region STI formed between the element regions AA. The word lines WL0 to WL(4m−1) and the select gate lines SG0 to SG(4m−1) are also formed on the stitch region SA1. However, the word lines WL0 to WL(4m−1) and select gate lines SG0 to SG(4m−1) present in the stitch region SA1 do not substantially constitute prime cells. Further, the select gate lines SG0 to SG(4m−1) are formed to be partly wider in the stitch region SA1. In particular, this part is formed so as to project toward to the adjacent select gate lines. This region will be a shunt region SA below. The shunt region SA2 alternates with the select gate lines SG0 to SG(4m−1). Specifically, in a certain stitch region SA1, the shunt region SA2 is formed for each of the select gate lines SG0, SG2, SG4, . . . . In another stitch region SA1 adjacent to the above stitch region, the shunt region SA2 is formed for each of the select gate lines SG1, SG3, SG5, . . . . Select gate lines for which the shunt region SA2 is not formed are partly removed in the stitch region SA1. The first element region group AAG1 and the source contact region SCA will be collectively referred to as a second element region group AAG2.

A group of four element regions AA in the replica cell array RCA will be referred to as a third element region group AAG3. The following region will be referred to as a stitch area SA3: the region which is adjacent to the third element region group AAG3 and which includes one element region AA. The word lines WL0 to WL(4m−1) and the replica select gate lines RSG0 to RSG(4m−1) are also formed on the stitch region SA3. However, the word lines WL0 to WL(4m−1) and replica select gate lines RSG0 to RSG(4m−1) present in the stitch region SA3 do not substantially constitute replica cells. Further, the replica select gate lines RSG0 to RSG(4m−1) are formed to be partly wider in the stitch region SA3 as in the case of the stitch region SA1. In particular, this part is formed so as to project toward to the adjacent select gate lines. This region will be a shunt region SA4 below.

Figure 15:
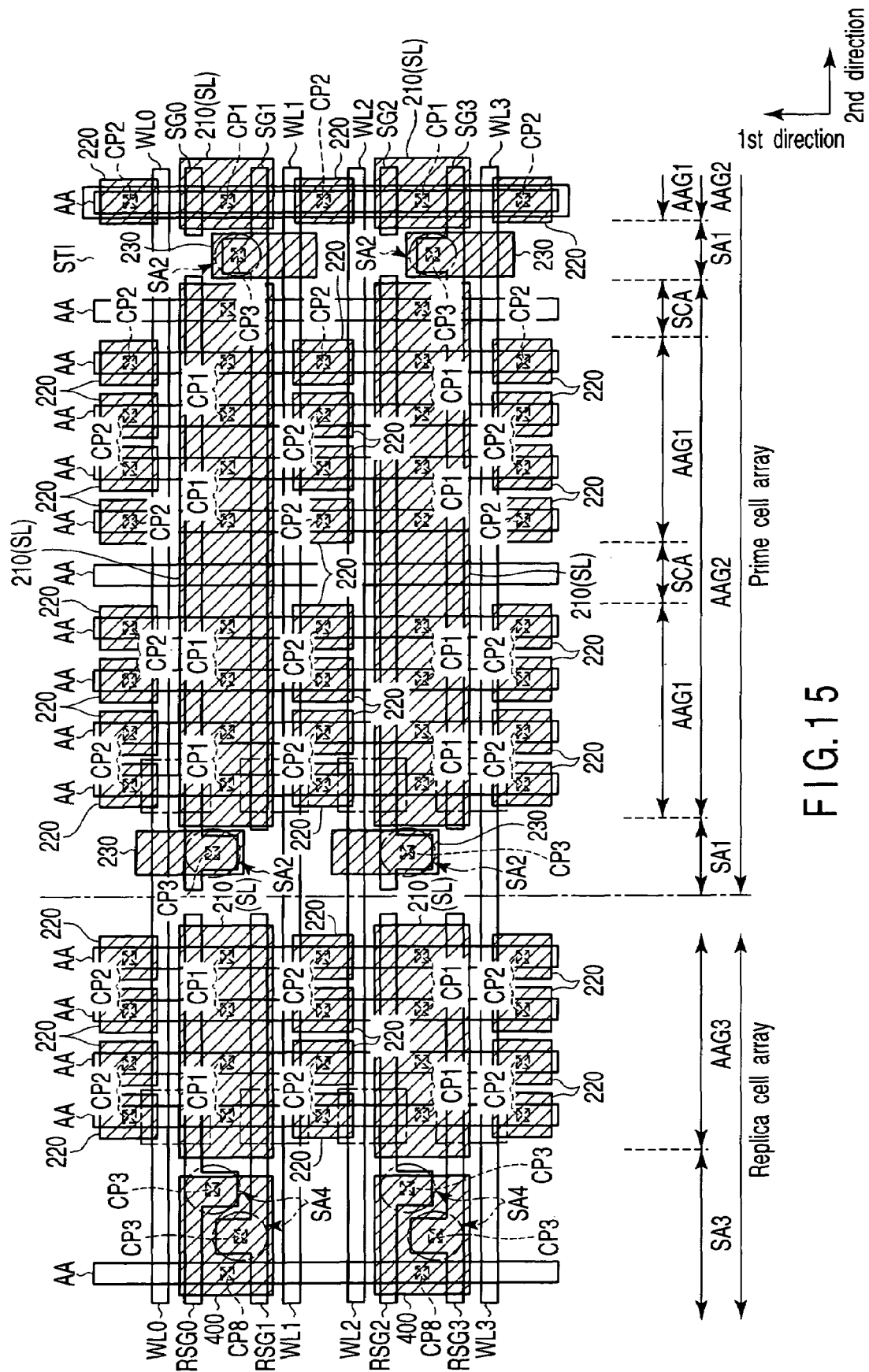
FIG. 15 is a plan view of the memory cell array provided in the 2TR flash memory according to the first embodiment of the present invention, the view showing the planar pattern of the first-level metal interconnect layers.

Now, with reference to FIGS. 14 and 15, description will be given of the first-level metal interconnect layer presents on the word lines WL0 to WL(4m−1), select gate lines SG0 to SG(4m−1), and replica select gate lines RSG0 to RSG (4m−1). The first-level metal interconnect regions are hatched in FIG. 15.

First, description will be given of the configuration of interior of the prime cell array PCA. As shown in the figures, a stripe-shaped metal interconnect layer 210 is formed between the adjacent select gate lines SG (SG0 and SG1, SG2 and SG3, . . . ); the metal interconnect layer 210 extends along the second direction. The metal interconnect layer 210 constitutes a part of the corresponding source line SL in the prime cell array PCA. The metal interconnect layer 210 is separated into parts by the stitch regions SA1 in the longitudinal direction (second direction). That is, the metal interconnect layer 210 has an independent shape for each second element region group AAG2. The metal interconnect layers 210 are connected together by the source regions of select transistors ST in the prime cells and the contact plugs CP1. In the present example, no contact plugs CP1 are formed in the source contact region SCA. Accordingly, the metal interconnect layer 210 is not electrically connected to the source region of the memory cell in the source contact region SCA. Further, an island-shaped metal interconnect layer 220 is formed on the drain region of each of the memory cell transistor MT in the first element region group AAG1. The metal interconnect layers 220 are separated from one another and connected by respective contact plugs CP2 to the drain regions of the corresponding memory cell transistors MT. Therefore, the plurality of metal interconnect layer 220 groups and the stripe-shaped metal interconnect layers 210 are alternately arranged along the first direction; the metal interconnect layer 220 groups are arranged in the second direction and the metal interconnect layers 210 extend along the second direction. Moreover, an island-shaped metal interconnect layer 230 is formed on each of the shunt regions SA2. The metal interconnect layer 230 is connected by a contact plug CP3 to the shunt region SA2 of the corresponding select gate line SG. The metal interconnect layer 230 is extended from the upper part of the corresponding select gate line SG to the upper part of the corresponding word line WL.

Now, description will be given of the interior of the replica cell array RCA. As shown in the figures, the stripe-shaped metal interconnect layer 210 is formed between the adjacent replica select gate lines RSG (RSG0 and RSG1, RSG1 and RSG2, . . . ); the metal interconnect layer 210 extends along the second direction. The metal interconnect layer 210 constitutes a part of the corresponding source line SL in the replica cell array RCA. The metal interconnect layers 210 are connected together by the source regions of the select transistors ST and the contact plugs CP1. Further, as in the case of the prime cell array PCA, the island-shaped metal interconnect layer 220 is formed on the drain region of each of the memory cell transistors MT in the third element region group AAG3. The metal interconnect layer 220 is connected by the contact plug CP2 to the drain region of the corresponding memory cell transistor MT. Further, metal interconnect layers 400 are formed in the stitch region SA3; each of the metal interconnect layers 400 is separated from the metal interconnect layer 210. The metal interconnect layer 400 is connected by the corresponding contact plug CP3 to the shunt regions SA4 of the corresponding ones of the replica select gate lines RSG0 to RSG(4m−1). The metal interconnect layer 400 is further connected to the element region AA by a contact plug CP8.

Figure 16:
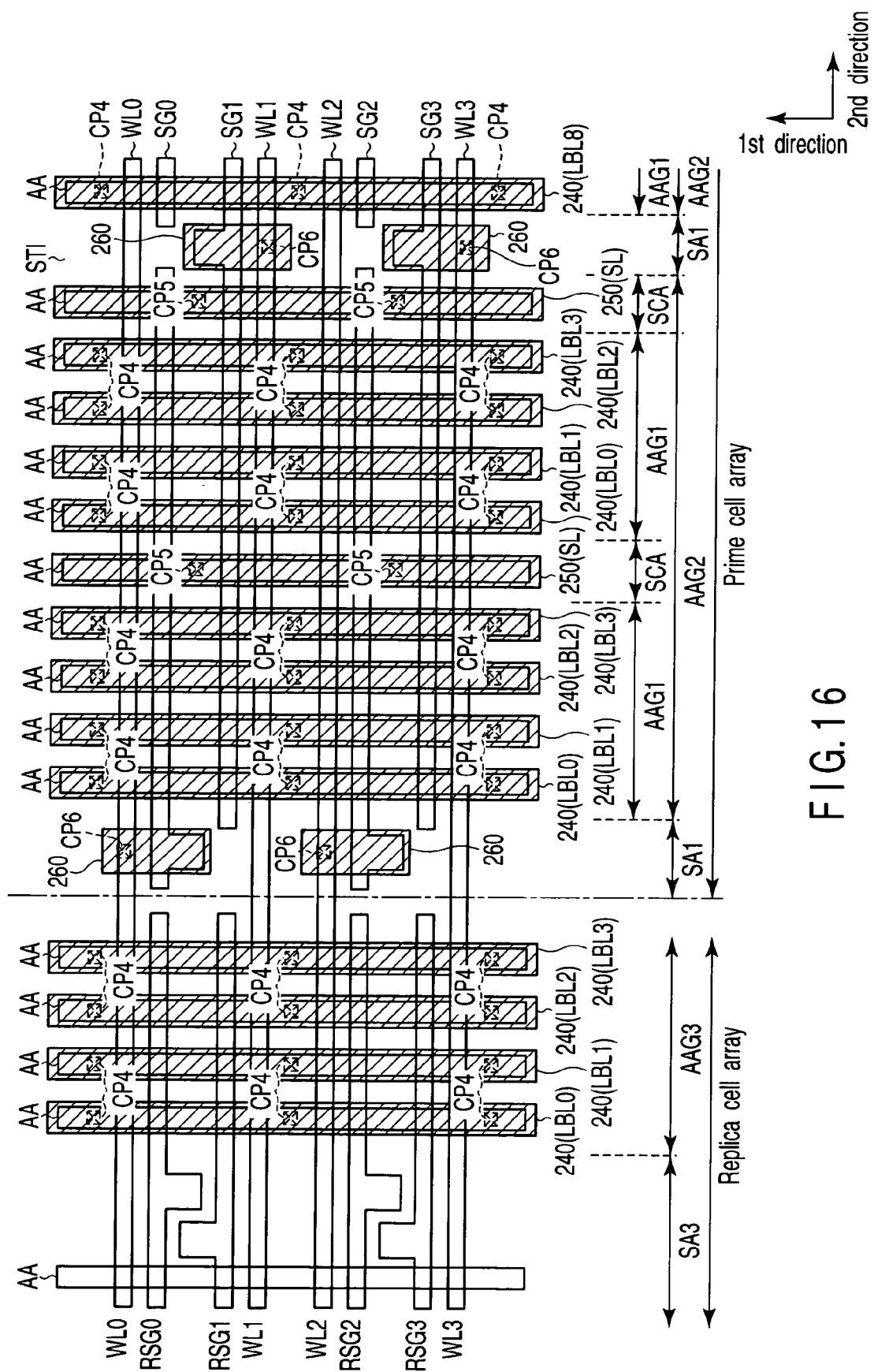
FIG. 16 is a plan view of the memory cell array provided in the 2TR flash memory according to the first embodiment of the present invention, the view showing the planar pattern of the second-level metal interconnect layers.

Now, with reference to FIGS. 14 and 16, description will be given of the pattern of the second-level metal interconnect layers present on the first-level metal interconnect layers 210 to 230 and 400. The second-level metal interconnect layers are hatched in FIG. 16.

As shown in the figures, in the first element region group AAG1 and third element region group AAG3, a stripe-shaped metal interconnect layer 240 extending along the first direction is formed on each element region AA. The metal interconnect layer 240 functions as the local bit line LBL0 or LBL1. The metal interconnect layer 240 is connected to the corresponding first-level metal interconnect layer 220 by a contact plug CP4. A metal interconnect layer 250 similar to the metal interconnect layer 240 is formed in each source contact region SCA. Accordingly, the line width of the metal interconnect layer 250 is the same as that of the metal interconnect layer 240. The metal interconnect layer 250 functions as a part of the corresponding source line SL. The metal interconnect layer 240 is connected to the corresponding first-level metal interconnect layer 210 by a contact plug CP5. That is, the plurality of metal interconnect layers 210 are connected together by the metal interconnect layer 250; the plurality of metal interconnect layers 210 are separated from one another in the first direction. Further, island-shaped metal interconnect layers 260 are formed in each stitch region SA1. The metal interconnect layers 260 are formed in association with the corresponding first-level metal interconnect layers 230. The metal interconnect layers 260 have substantially the same geometrical pattern as that of the metal interconnect layers 230. The metal interconnect layers 260 overlap the respective metal interconnect layers 230. In FIGS. 14 and 16, a contact plug CP6 is located immediately above the corresponding word line WL. However, the position of the contact plug CP6 is not limited provided that it enables the metal interconnect layers 230 and 260 to be connected together.

Figure 17:
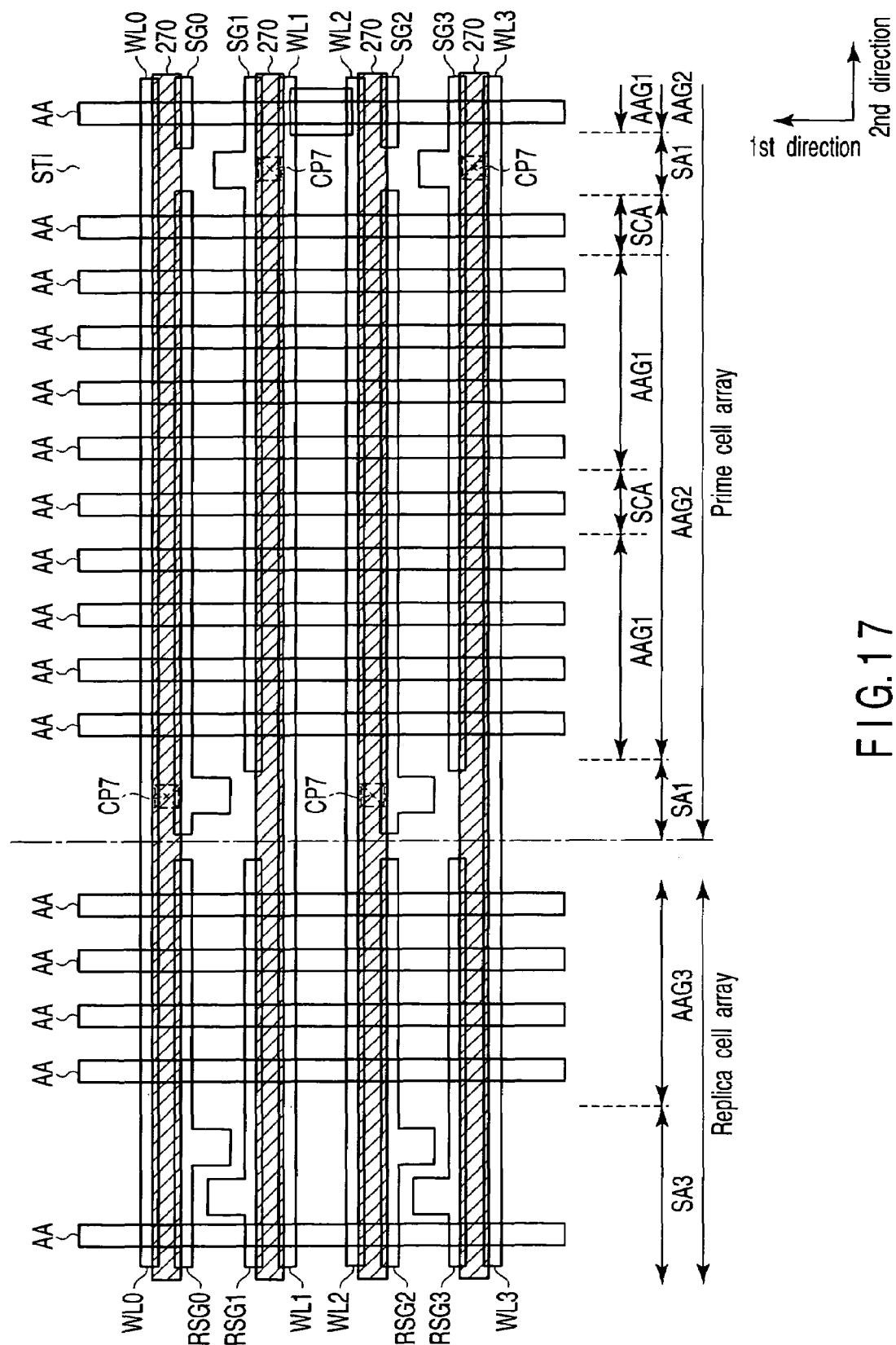
FIG. 17 is a plan view of the memory cell array provided in the 2TR flash memory according to the first embodiment of the present invention, the view showing the planar pattern of the third-level metal interconnect layers.

Now, with reference to FIGS. 14 and 17, description will be given of the pattern of the third-level metal interconnect layers present on the second-level metal interconnect layers 240 to 260. The third-level metal interconnect layers are hatched in FIG. 17.

As shown in the figures, stripe-shaped metal interconnect layers 270 are formed and extend along the second direction. Each of the metal interconnect layers 270 is provided for a set of a word line and a select gate line (a set of WL0 and SG1, a set of WL1 and SG1, . . . ). The metal interconnect layer 270 is connected by a contact plug CP7 to the corresponding second-level metal interconnect layer 260 electrically connected to the corresponding select gate line. That is, each metal interconnect layer 270 functions as a shunt interconnect for the corresponding one of the select gate lines SG0 to SG(4m−1). Further, the metal interconnect layer 270 is formed in the region between a central portion of the corresponding word line WL and a central portion of the select gate line SG corresponding to the word line WL. In other words, the plurality of metal interconnect layers 270 are arranged at equal intervals along the first direction. Each metal interconnect layer 270 connects the second element region groups AAG2 located adjacent to each other in the second direction. One end of the metal interconnect layer 270 is connected to the select gate decoder 30. The other end of the metal interconnect layer 270 passes over the replica cell array RCA and is connected to the write decoder 20.

Now, with reference to FIGS. 14 and 18, description will be given of the pattern of the fourth-level metal interconnect layers present on the third-level metal interconnect layer 270. The third-level metal interconnect layers are hatched in FIG. 18.

As shown in the figures, stripe-shaped metal interconnect layers 280 and 290 are formed and extend along the first direction. Each of the metal interconnect layers 280 functions as one of the write global bit lines WGBL0 to WGBL(2n−1) or the replica write global bit line R_WGBL0 or R_WGBL1. Each of the metal interconnect layers 290 functions as one of the read global bit lines RGBL0 to RGBL(2n−1) or the replica read global bit line R_RGBL. Two metal interconnect layers 280 and one metal interconnect layer 290 form a set. Each metal interconnect layer 280 is provided in association with a set of the two local bit lines LBL0 and LBL1 or a set of the two local bit lines LBL2 and LBL3. Each metal interconnect layer 290 is provided in association with a set of the local bit lines LBL0 to LBL3.

In the above drawings, the source contact area SCA may be provided in the replica cell array RCA.

Figure 23:
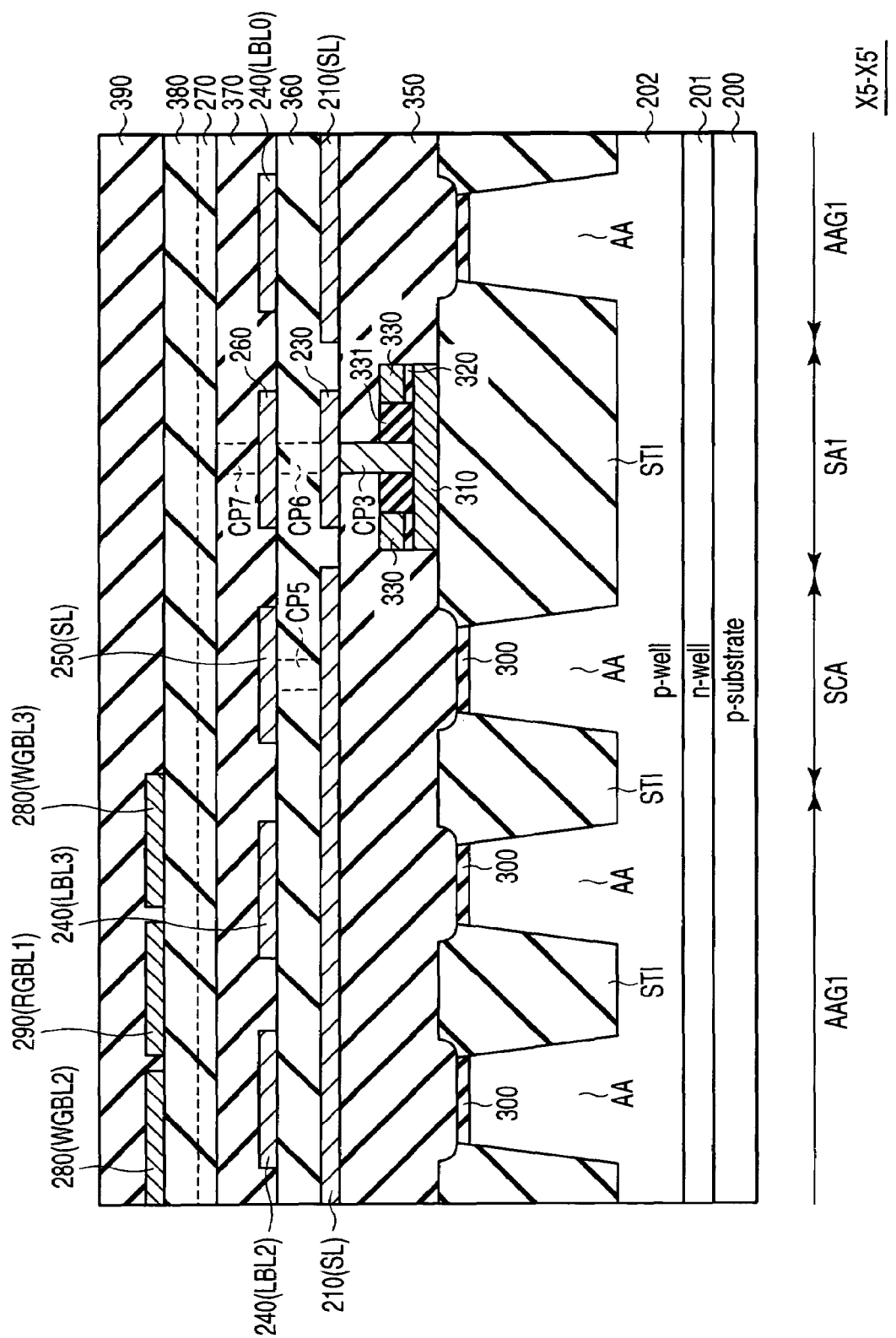
FIG. 23 is a sectional view taken along line X5-X5' in FIG. 14.
Figure 24:
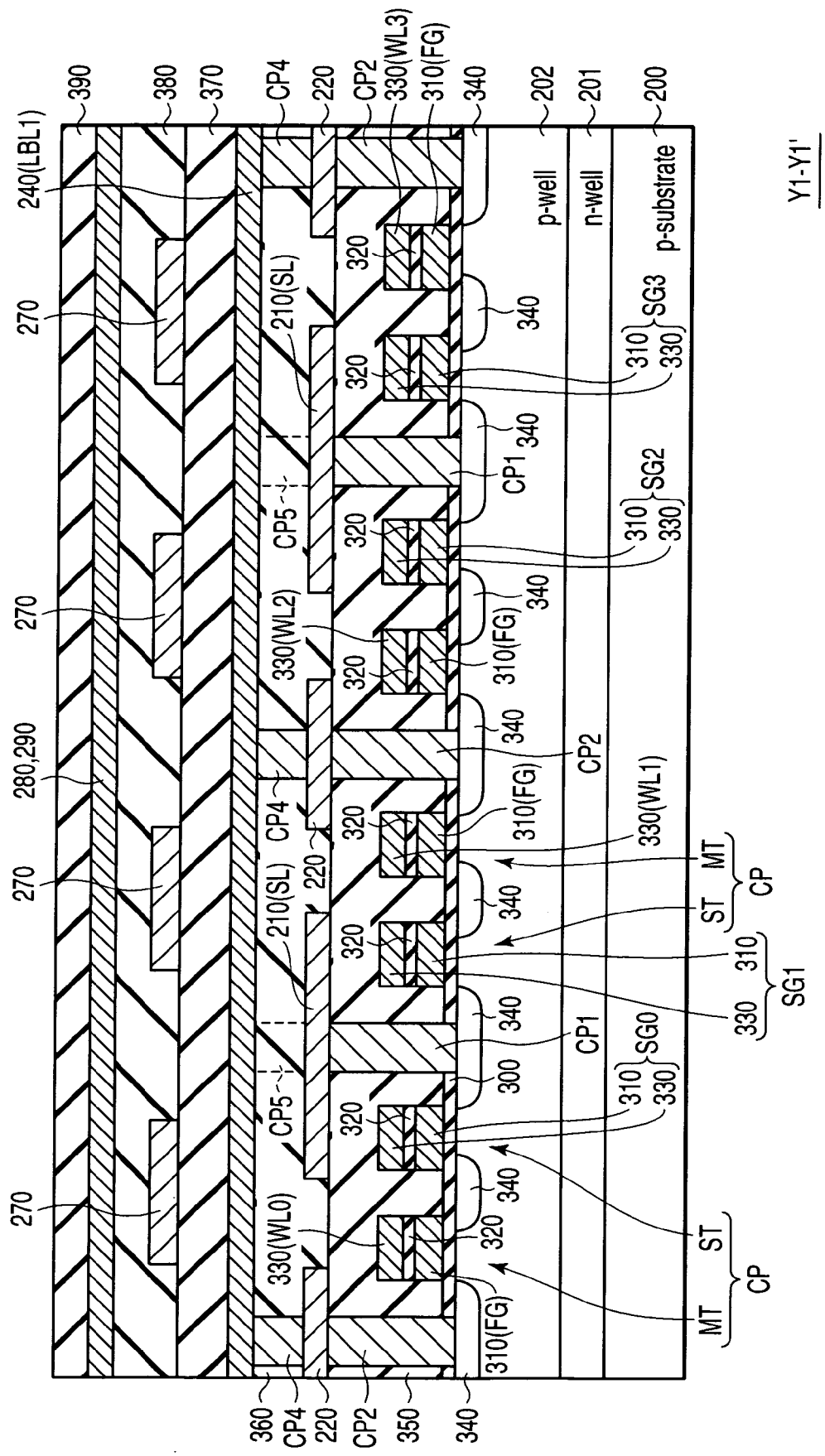
FIG. 24 is a sectional view taken along line Y1-Y1' in FIG. 14.
Figure 25:
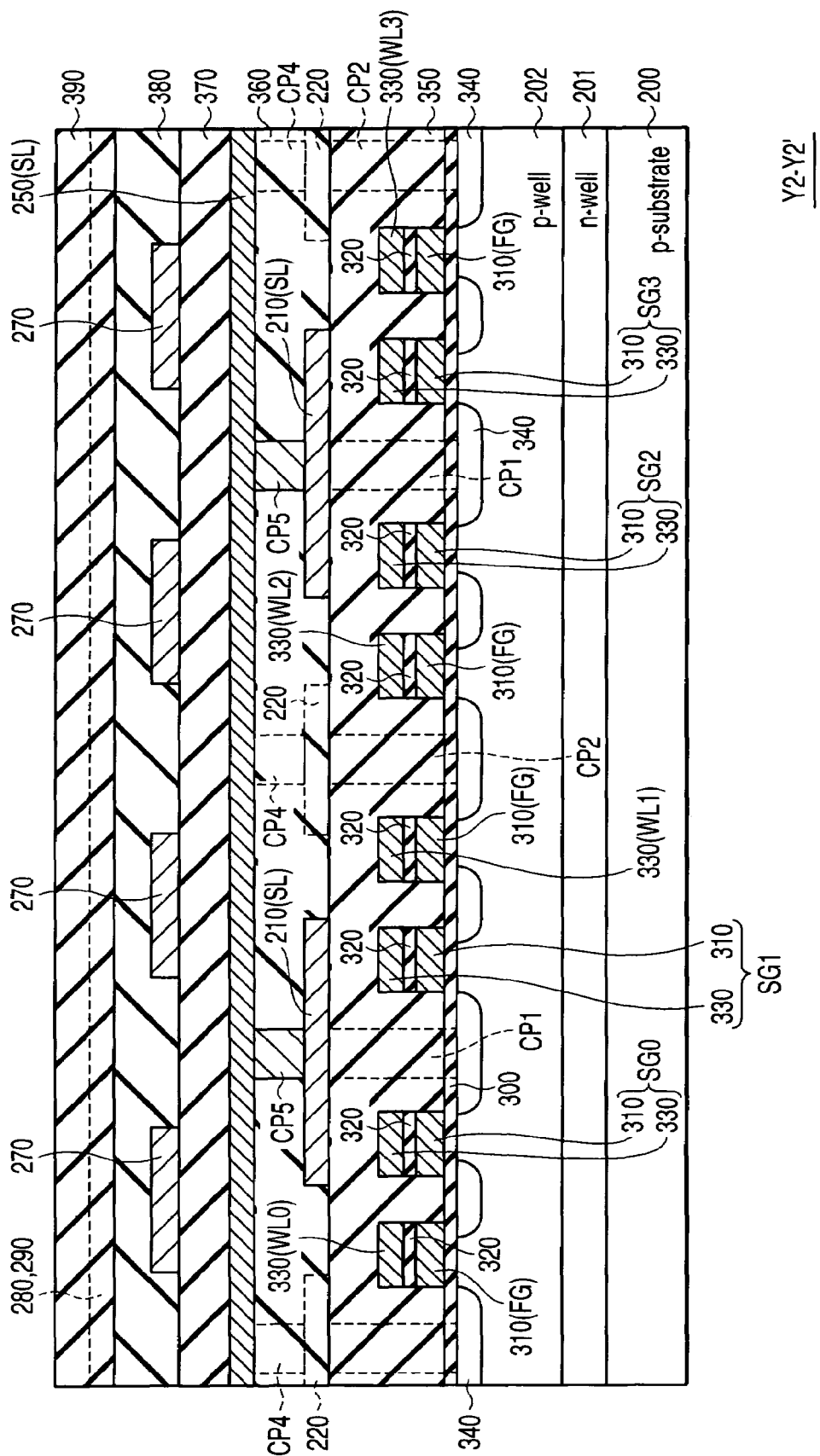
FIG. 25 is a sectional view taken along line Y2-Y2' in FIG. 14.

Now, description will be given of the sectional structure of the flash memory configured as described above. First, with reference to FIGS. 19 to 25, description will be given of the sectional structure of the second element region group AAG2 in the prime cell array PCA. FIGS. 19 to 23 are sectional views taken along lines X1-X1', X2-X2', X3-X3', X4-X4', and X5-X5', respectively. FIGS. 24 and 25 are sectional views taken along lines Y1-Y1' and Y2-Y2', respectively, in FIG. 14.

As shown in the figures, an n-type well region 201 is formed in a surface region of a p-type semiconductor substrate 200. A p-type well region 202 is formed in a surface region of the n-type well region 201. An isolation region STI is formed in the p-type well region 202. The element regions AA are each surrounded by the isolation region STI. A gate insulating film 300 is formed on the element region AA of the p-type well region 201. The gate electrodes of the memory cell transistor MT and select transistor ST are formed on the gate insulating film 300. The gate electrodes of the memory cell transistors MT and select transistors ST each have a polycrystalline silicon layer 310, an inter-gate insulating film 320 formed on the polycrystalline silicon layer 310, and a polycrystalline silicon layer 330 formed on the inter-gate insulating film 320. The inter-gate insulating film 320 is formed of for example, a silicon oxide film or an ON film, an NO film, or an ONO film having a stacked structure of a silicon oxide film and a silicon nitride film.

Figure 19:
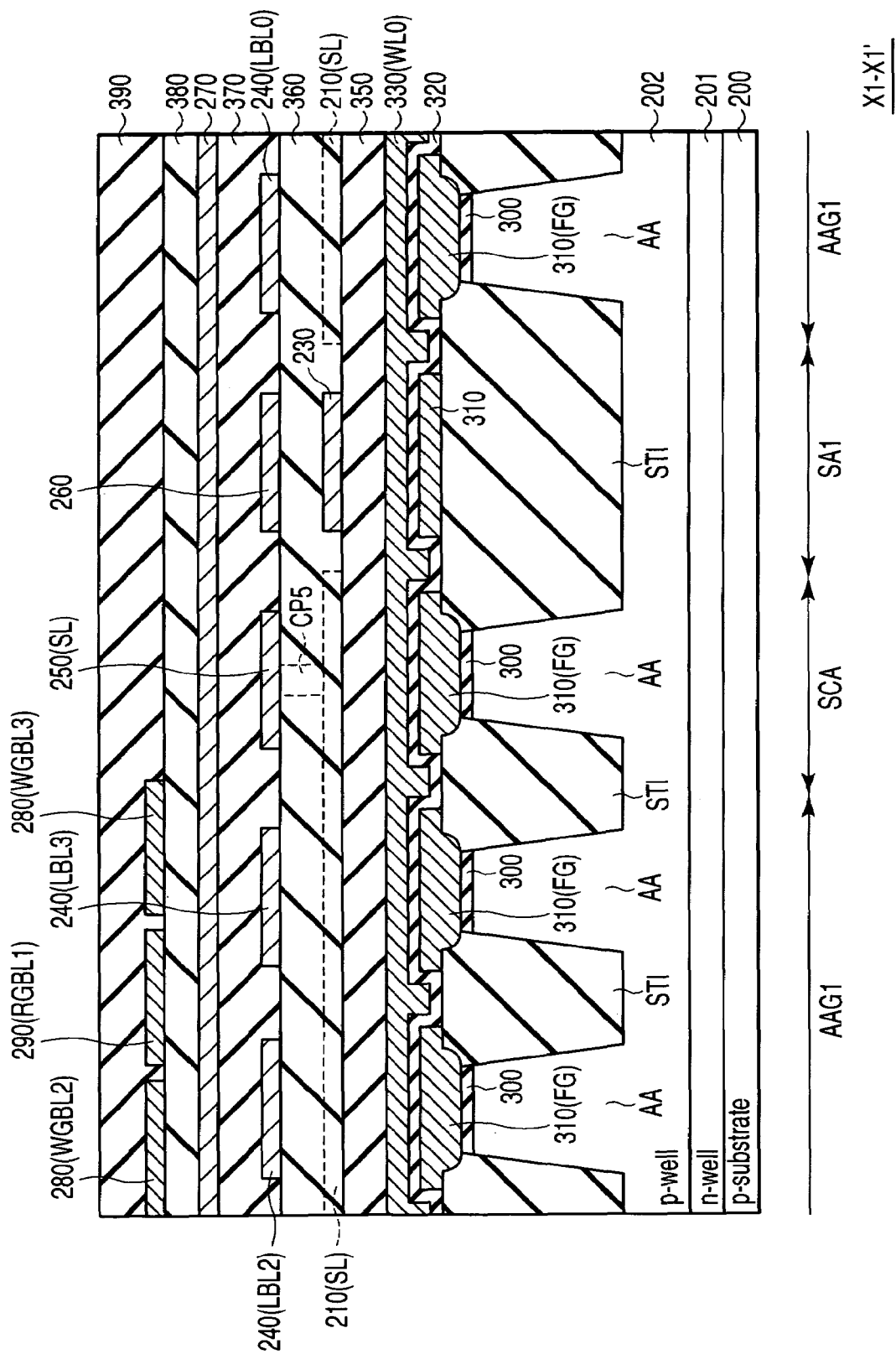
FIG. 19 is a sectional view taken along line X1-X1' in FIG. 14.
Figure 22:
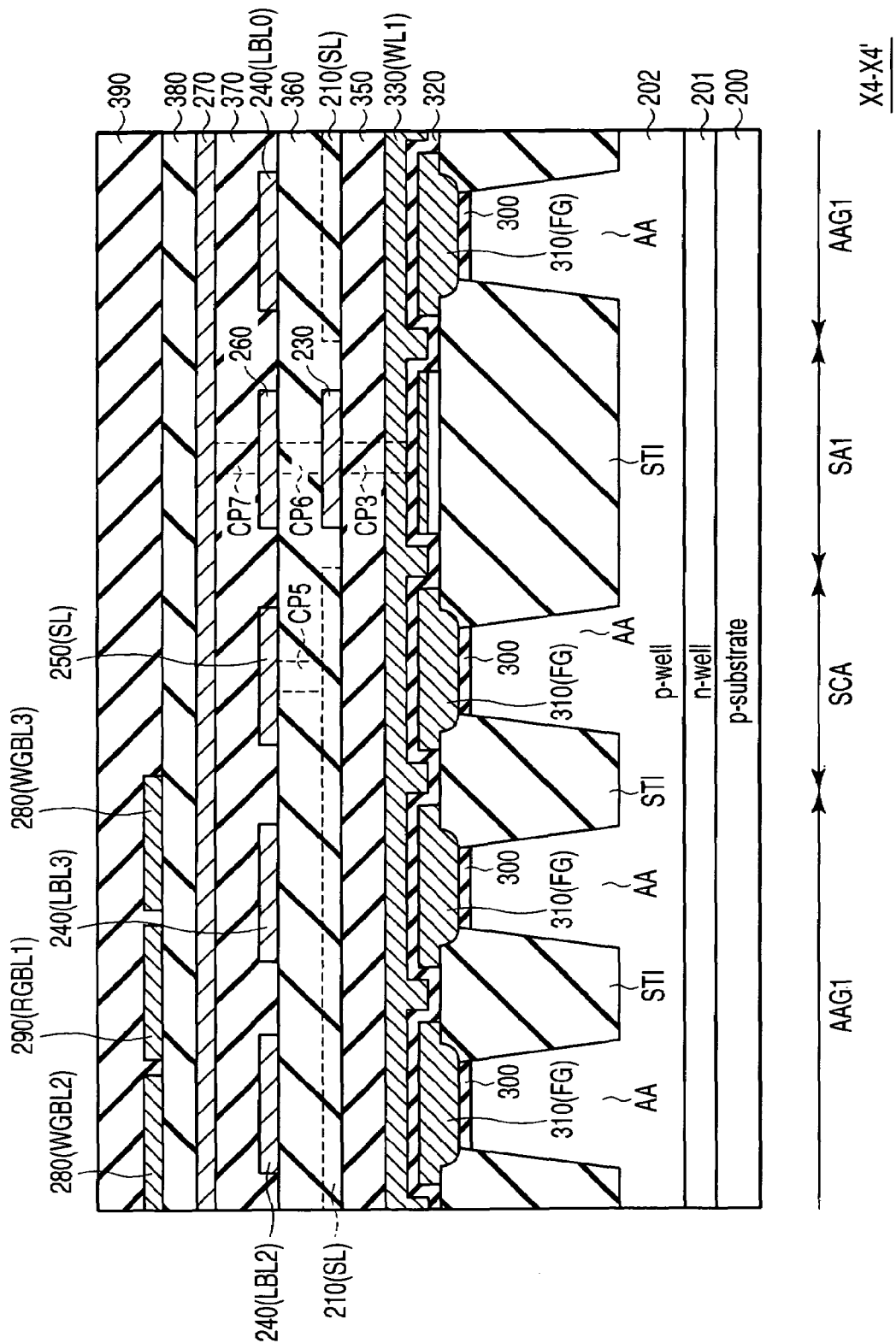
FIG. 22 is a sectional view taken along line X4-X4' in FIG. 14.

In the memory cell transistor MT, as shown in FIGS. 19 and 22, the polycrystalline silicon layer 310 is separated into parts each located between the adjacent element regions AA. The polycrystalline silicon layer 310 thus functions as a floating gate (FG). On the other hand, the polycrystalline silicon layer 330 connects the adjacent element regions AA together and thus functions as control gates (word lines WL).

Figure 20:
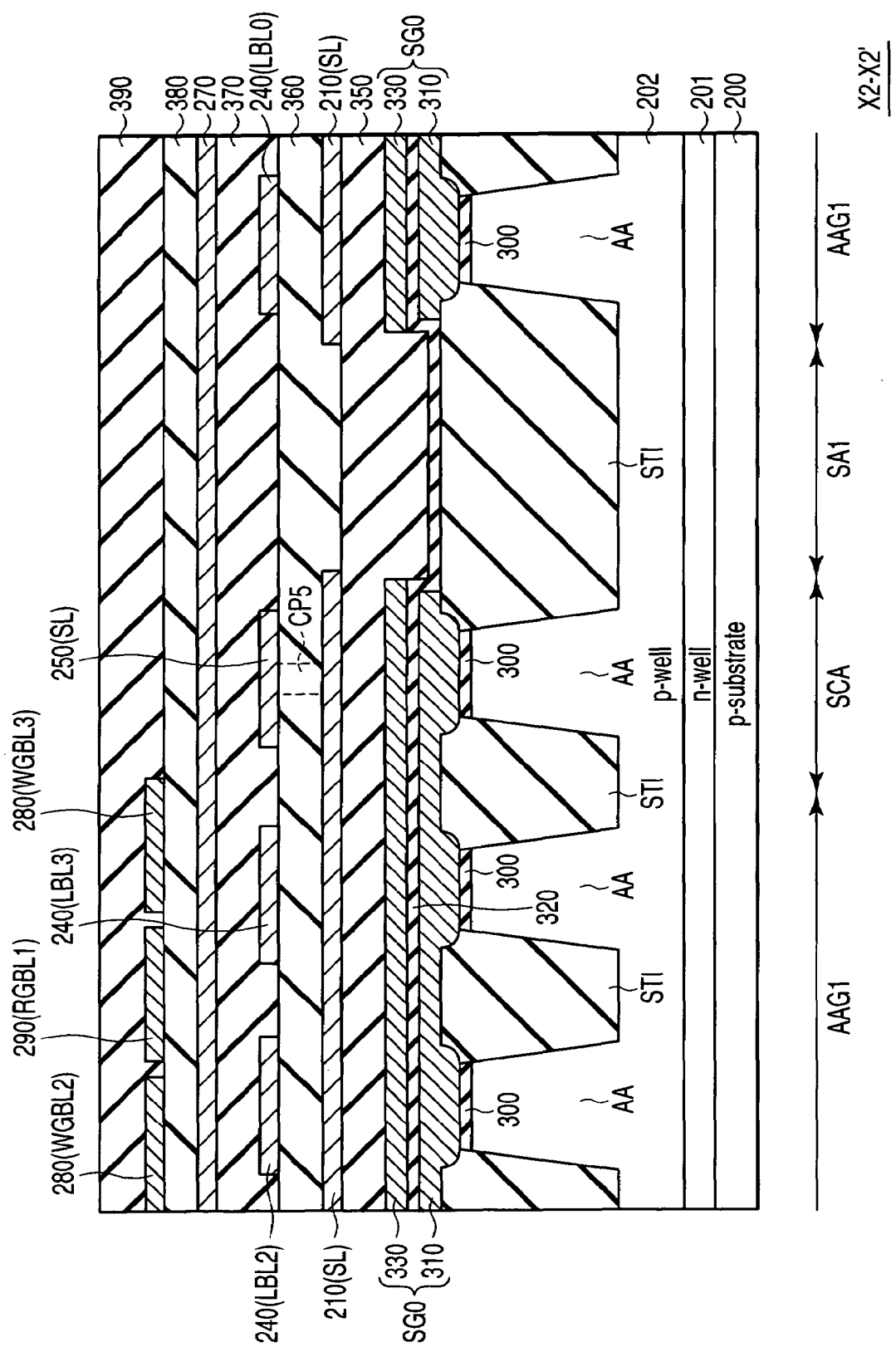
FIG. 20 is a sectional view taken along line X2-X2' in FIG. 14.

In the select transistor ST, as shown in FIGS. 20 and 21, the polycrystalline silicon layers 310 and 320 each connect the adjacent element regions AA together. The polycrystalline silicon layers 310 and 330 function as select gate lines SG. However, only the polycrystalline silicon layer 310 substantially functions as the select gate lines (this will be described later in detail).

An impurity diffusion layer 340 is formed in a surface of the p-type well region 202 located between the adjacent gate electrodes. The impurity diffusion layer 340 is shared by the adjacent transistors.

As preciously described, the prime cell PC, including the memory cell transistor MT and the select transistor ST is formed to have the relationship described below. The select transistors ST in the adjacent prime cells PC are adjacent to each other. The memory cell transistors MT in the adjacent prime cells PC are adjacent to each other. The impurity diffusion layer 340 is shared by the adjacent select transistors ST or memory cell transistors MT. Accordingly, if the select transistors ST are adjacent to each other, the two adjacent prime cells PC and PC are arranged symmetrically with respect to the impurity diffusion layer 340 shared by the two select transistors ST and ST. In contrast, if the memory cell transistors MT are adjacent to each other, the two adjacent prime cells PC and PC are arranged symmetrically with respect to the impurity diffusion layer 340 shared by the two memory cell transistors MT and MT.

An inter-level insulating film 350 is formed on the p-type well region 202 so as to cover the memory cell transistors MT and select transistors ST. The contact plug CP1 is formed in the inter-level insulating film 350; the contact plug CP1 reaches the impurity diffusion layer (source region) 340 shared by the two select transistors ST and ST. The metal interconnect layer 210 connected to the contact plug CP1 is formed on the inter-level insulating film 350. The metal interconnect layer 210 functions as the source line SL. The contact plug CP2 is formed in the inter-level insulating film 350; the contact plug CP2 reaches the impurity diffusion layer (drain region) 340 shared by the two memory cell transistors MT and MT. The metal interconnect layer 220 connected to the contact plug CP2 is formed on the inter-level insulating film 350.

An inter-level insulating film 360 is formed on the inter-level insulating film 350 so as to cover the metal interconnect layers 210 and 220. The contact plug CP4, reaching the metal interconnect layer 240, is formed in the inter-level insulting film 360 (see FIG. 24). The metal interconnect layer 240, connected to the plurality of contact plugs CP4, is formed on the inter-level insulating film 360 (see FIG. 24).

The metal interconnect layer 240 functions as one of the local bit lines LBL0 to LBL3. The contact plug CP5, reaching the metal interconnect layer 210, is formed in the inter-level insulating film 360 (see FIG. 25; source contact region SCA). The metal interconnect layer 250 is formed on the inter-level insulating film 360; the metal interconnect layer 250 connect the plurality of contact plugs CP5 across the bit lines (see FIG. 25; source contact region SCA). The metal interconnect layer 250 functions as a part of the source line SL.

An inter-level insulating film 370 is formed on the inter-level insulating film 360 so as to cover the metal interconnect layers 240 and 250. The metal interconnect layer 270 is formed on the inter-level insulating film 370. The metal interconnect layer 270 functions as the shunt interconnect of the select gate line. The interconnects are arranged at equal intervals. An inter-level insulating film 380 is formed on the inter-level insulating film 370 so as to cover the metal interconnect layer 270.

The metal interconnect layers 280 and 290 are formed on the inter-level insulating film 380 and functions as a write global bit line and a read global bit line, respectively. An inter-level insulating film 390 is further formed on the inter-level insulating film 380.

Figure 26:
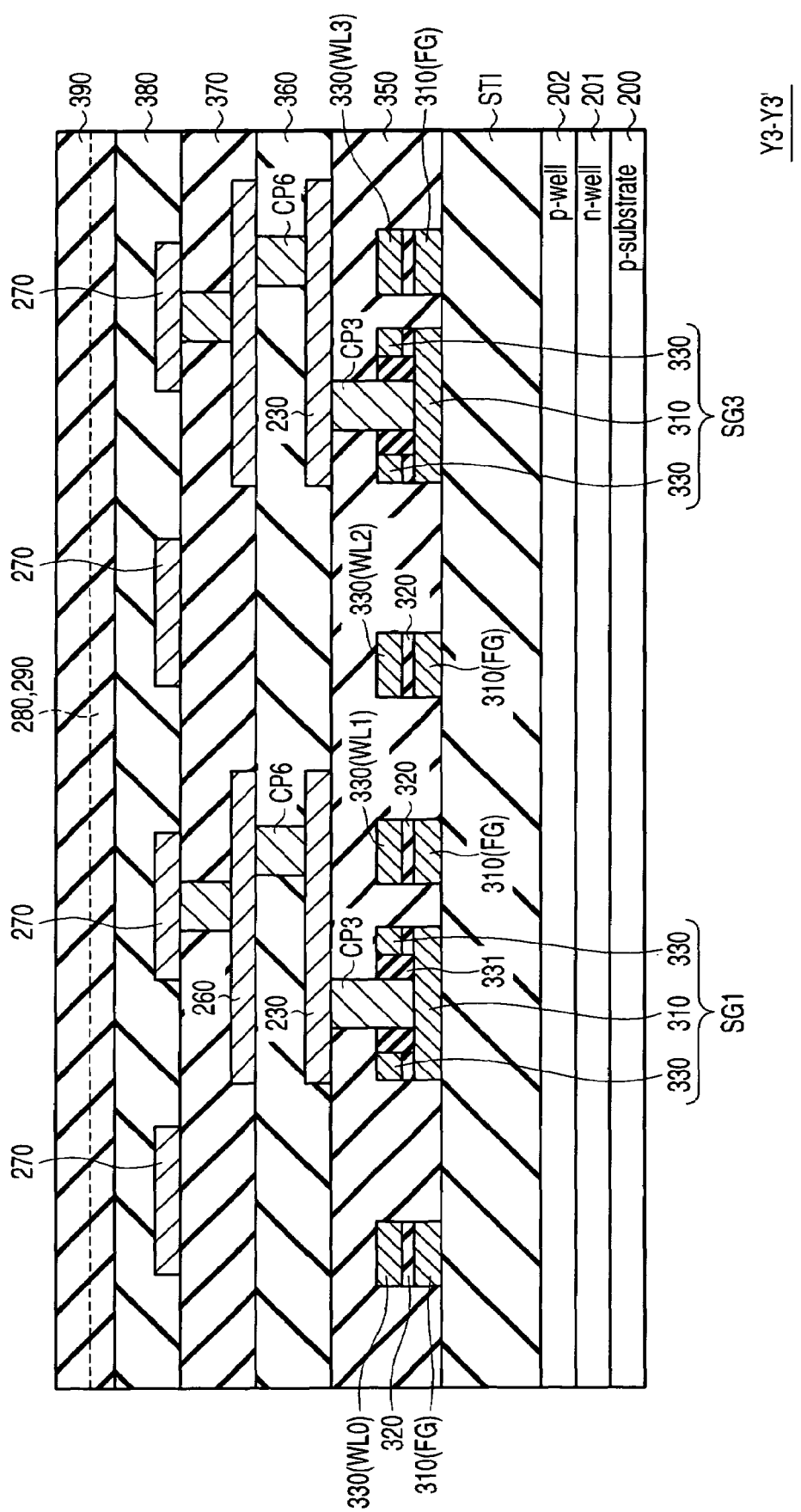
FIG. 26 is a sectional view taken along line Y3-Y3' in FIG. 14.

Now, with reference to FIGS. 20, 23, and 26, description will be given of the sectional structure of the stitch region SA1 in the prime cell array. FIG. 26 is a sectional view taken along line Y3-Y3' in FIG. 14.

As shown in the figures, the isolation region STI is formed in the p-type well region 202. The floating gate 310 and control gate 330 of the memory cell transistor MT are formed on the isolation region STI. Select gate lines not having the shunt region SA2 in the stitch region SA1 are free from the polycrystalline silicon layer 310 and 330 (see FIG. 20). That is, these select gate lines are each divided into two parts across the stitch region SA1. Select gate lines having the shunt region SA2 have the stacked gate formed even in the stitch region, the stacked gate containing the polycrystalline silicon layers 310 and 330. The stacked gate is formed to project toward the adjacent select gate lines (see FIG. 26). Moreover, as shown in FIGS. 23 and 26, in the shunt region SA2, the polycrystalline silicon layer 330 and the inter-gate insulating film 320 are removed to expose the polycrystalline silicon layer 310. The contact plug CP3 is formed in contact with the polycrystalline silicon layer 310 in this region. The contact plug CP3 is electrically separated from the polycrystalline silicon layer 330 by an insulating film 331 (see FIGS. 23 and 26). The contact plug CP3 is formed so as to extend from a surface of the inter-level insulating film 350 to the polycrystalline silicon layer 310.

The metal interconnect layer 230 is formed on the inter-level insulating film 350. The metal interconnect layer 230 is extended so as to cover the upper part of the gate electrode of the corresponding select transistor ST and to cover the upper part of the stacked gate electrode of the memory cell transistor MT corresponding to the above select transistor (see FIG. 26). The metal interconnect layer 230 is connected to the contact plug CP3 connected to the corresponding to the select transistor ST. An inter-level insulating film 360 is formed on the inter-level insulating film 350 so as to cover the metal interconnect layer 230. The contact plug CP6, reaching the metal interconnect layer 230, is formed in the inter-level insulating film 360. The metal interconnect layer 260, connected to the contact plug CP6, is formed on the inter-level insulating film 360. Like the metal interconnect layer 230, the metal interconnect layer 260 is extended so as to cover the upper part of the gate electrode of the corresponding select transistor ST and to cover the upper part of the stacked gate electrode of the memory cell transistor MT corresponding to the above select transistor (see FIG. 26). The inter-level insulating film 370 is formed on the inter-level insulating film 360. The contact plug CP7, reaching the metal interconnect layer 260, is formed in the inter-level insulating film 370. As shown in FIG. 26, the contact plug CP7 is located in a central portion of the memory cell. In other words, the contact plug CP7 is formed in the region between a central portion of the stacked gate of the memory cell transistors MT and a central portion of the gate electrode of the select transistor ST. The plurality of metal interconnect layers 270 are arranged on the inter-level insulating film 370 at equal intervals as shown in FIG. 26. Interlayer insulating films 380 and 390 are formed on the inter-level insulating film 370 so as to cover the metal interconnect layer 270.

Figure 27:
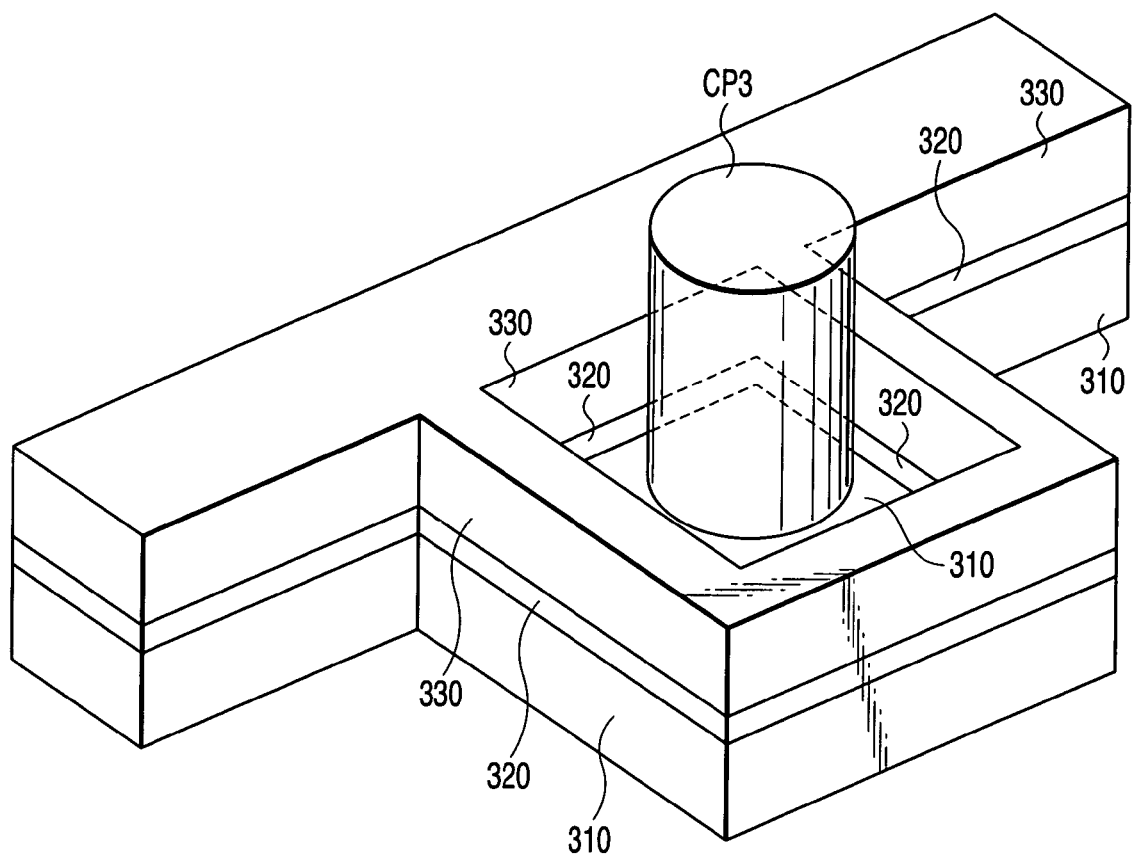
FIG. 27 is a perspective view of a shut region in FIG. 14.

FIG. 27 is a perspective view of the shunt region SA2. As shown in the figure, the stacked gate structure forming a select gate line is formed to be partly winder. The polycrystalline silicon layer 330 and inter-gate insulating film 320 are removed from a part of the wider region. The polycrystalline silicon layer 310 is exposed in this part. The contact plug CP3 is formed in contact with the exposed polycrystalline silicon layer 310. Moreover, the contact plug CP3 is electrically separated from the polycrystalline silicon layer 330. That is, the polycrystalline silicon layer 330 is electrically separated from the shunt interconnect 270.

Figure 28:
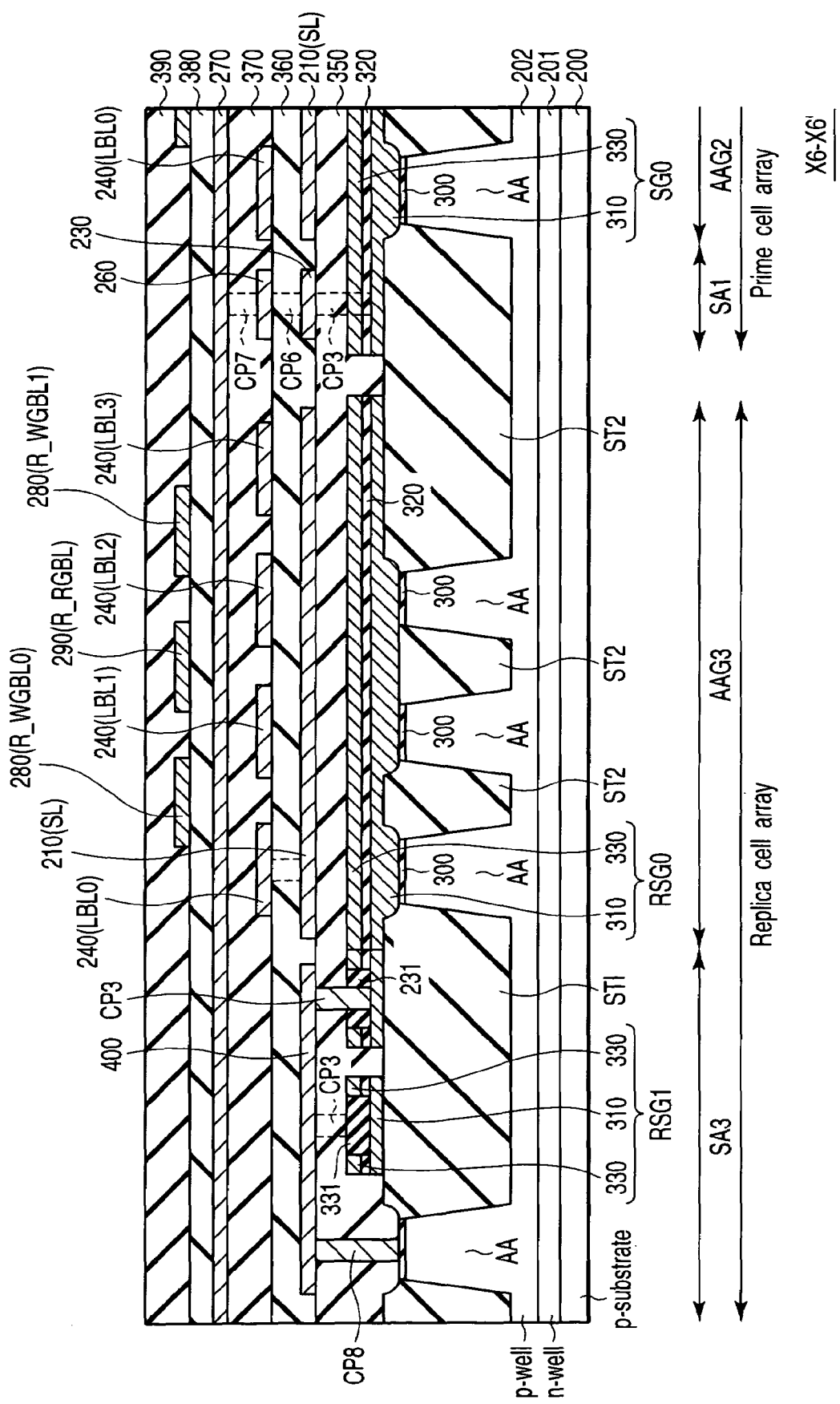
FIG. 28 is a sectional view taken along line X6-X6' in FIG. 14.
Figure 29:
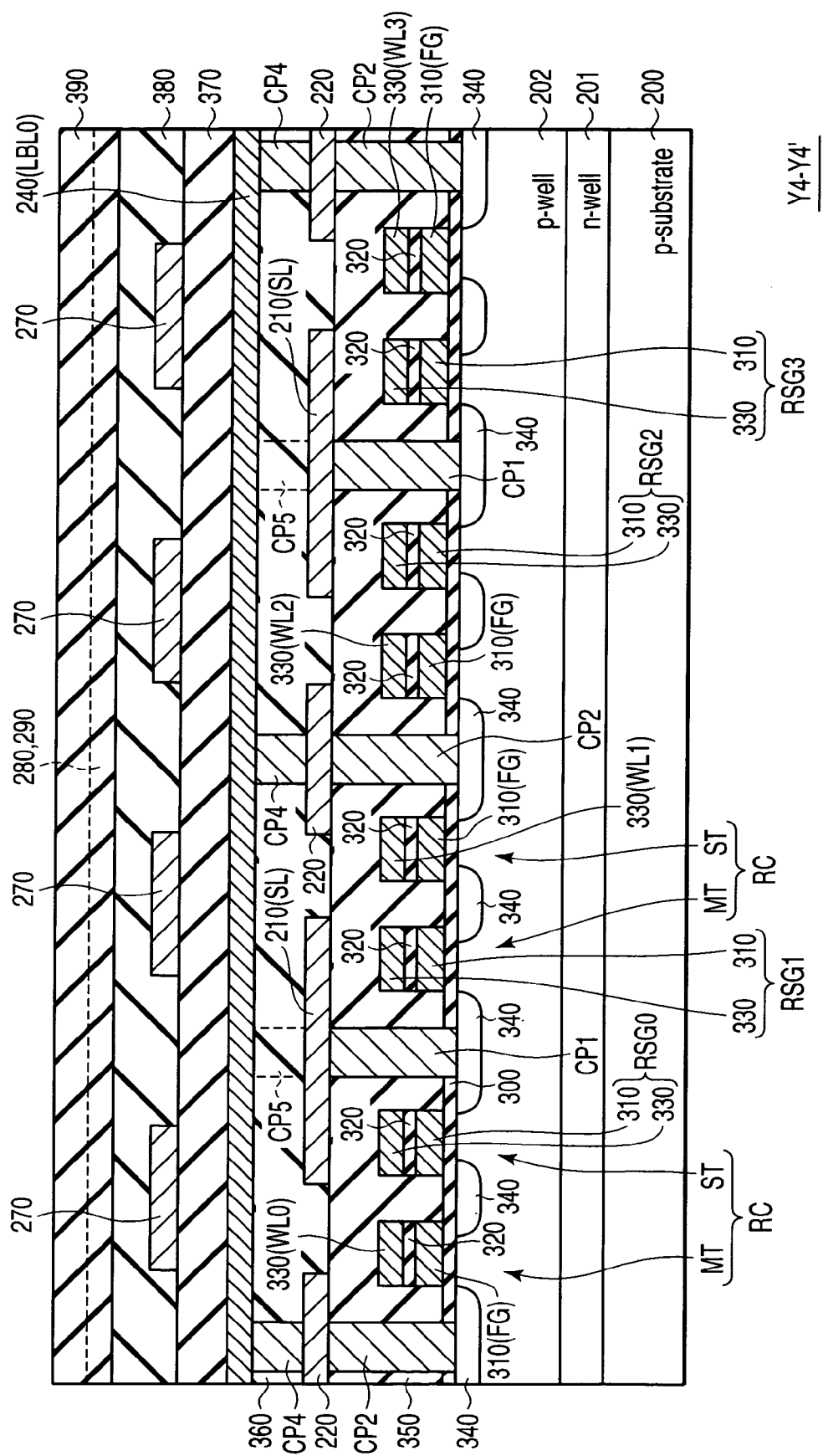
FIG. 29 is a sectional view taken along line Y4-Y4' in FIG. 14.

Now, the replica cell array RCA will be described. Now, with reference to FIGS. 28 and 29, description will be given of the sectional structure of the replica cell array RCA and third element region group AAG3. FIGS. 28 and 29 are sectional views taken along lines X6-X6' and Y4-Y4' in FIG. 14.

As shown in the figures, the configuration of the third element region group AAG3 is the same as that of the prime cell array PCA. That is, the isolation region STI is formed in the p-type well region 202. The element regions AA are each surrounded by the isolation region STI. The gate insulating film 300 is formed on the element region AA of the p-type well region 201. The gate electrodes of the memory cell transistor MT and select transistor ST of the replica cell are formed on the gate insulating film 300.

In the memory cell transistor MT, the polycrystalline silicon layer 310 is separated into parts each located between the adjacent element regions AA. The polycrystalline silicon layer 310 thus functions as a floating gate (FG). On the other hand, the polycrystalline silicon layer 330 connects the adjacent element regions AA together and thus functions as control gates (word lines WL).

In the select transistor ST, the polycrystalline silicon layers 310 and 320 each connect the adjacent element regions AA together. The polycrystalline silicon layers 310 and 330 function as replica select gate lines RSG. However, only the polycrystalline silicon layer 310 substantially functions as the replica select gate lines.

The polycrystalline silicon layer 330 is connected to the control gate of the prime cell PC; The polycrystalline silicon layer 330 constitutes the control gate of the memory cell transistor. On the other hand, the polycrystalline silicon layers 310 and 330 constituting the replica select gate line RSG in the replica cells RC are separated from the polycrystalline silicon layers 310 and 330 constituting the select gate line SG in the prime cell PC, at the boundary between the prime cell array PCA and the replica cell array RCA.

The impurity diffusion layer 340 is formed in the surface of the p-type well region 202 located between the adjacent gate electrodes. The impurity diffusion layer 340 is shared by the adjacent transistors.

As preciously described, the replica cell RC, including the memory cell transistor MT and the select transistor ST is formed to have the relationship described below. The select transistors ST in the adjacent replica cells RC are adjacent to each other. The memory cell transistors MT in the adjacent replica cells RC are adjacent to each other. The impurity diffusion layer 340 is shared by the adjacent select transistors ST or memory cell transistors MT. Accordingly, if the select transistors ST are adjacent to each other, the two adjacent replica cells RC and RC are arranged symmetrically with respect to the impurity diffusion layer 340 shared by the two select transistors ST and ST. In contrast, if the memory cell transistors MT are adjacent to each other, the two adjacent replica cells RC and RC are arranged symmetrically with respect to the impurity diffusion layer 340 shared by the two memory cell transistors MT and MT.

The shunt region 270 of the select gate line SG is formed on the inter-level insulating film 360. However, the shunt interconnect 270 is electrically separated from the polycrystalline silicon layers 310 and 330 constituting the replica select gate line RSG. The metal interconnect layers 280 and 290 are formed on the inter-level insulating film 380 and function as a replica write global bit line and a replica read global bit line.

Figure 30:
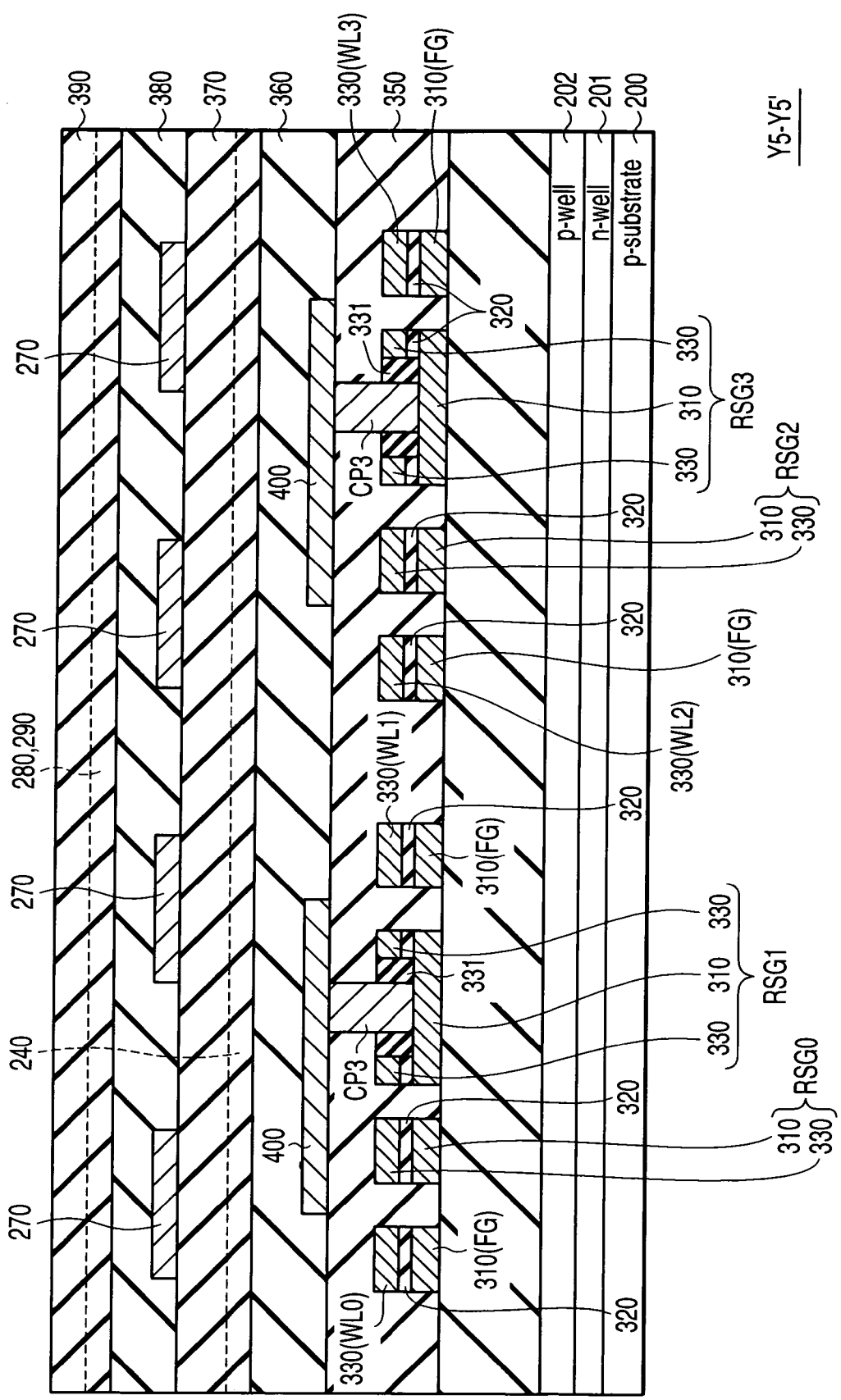
FIG. 30 is a sectional view taken along line Y5-Y5' in FIG. 14.

Now, with reference to FIGS. 28 and 30, description will be given of the sectional structure of the stitch region SA3 in the replica cell array RCA. FIG. 30 is a sectional view taken along line Y5-Y5' in FIG. 14.

As shown in the figures, the shunt regions SA4 of the replica select gate lines RSG0 to RSG(4m−1) and the element regions AA are formed in the stitch region SA3. The structure of the shunt region SA4 is the same as that of the shunt region SA2 of the select gate line SG (see FIGS. 27 and 30). That is, the polycrystalline silicon layer 330 and the inter-gate insulating film 320 are removed to expose the polycrystalline silicon layer 310; the polycrystalline silicon layer 330 and inter-gate insulating film 320 constitute a part of the replica select gate line RSG. The contact plug CP3 is formed in contact with the polycrystalline silicon layer 310 in this region. The contact plug CP3 is electrically separated from the polycrystalline silicon layer 330 by an insulating film 331. The contact plug CP3 is formed so as to extend from the surface of the inter-level insulating film 350 to the polycrystalline silicon layer 310.

Further, the element region AA is formed in the switch region SA3. The contact plug CP8, reaching the element region AA, is formed in the inter-level insulating film 350 (see FIG. 28). The metal interconnect layer 400 is formed on the inter-level insulating film 350. The metal interconnect layer 400 connects the contact plugs CP3 and CP8 together. The polycrystalline silicon layer 310, constituting the replica select gate line RSG, is connected to the p-type well region 202 via the contact plugs CP3 and CP8 and metal interconnect layer 400.

The inter-level insulating films 360 and 370 are sequentially formed on the inter-level insulating film 350. The shunt interconnect 270 is formed on the inter-level insulating film 370. The word lines WL0 to WL(4m−1) are formed in the stitch region SA3. The shunt interconnects 270 and the word lines WL0 to WL(4m−1) are connected to the write decoder 20 through the stitch region SA3. On the other hand, the polycrystalline silicon layers 310 and 330, constituting the replica select gate lines RSG0 to RSG(4m-1), are formed only in the replica cell array RCA.

Figure 31:
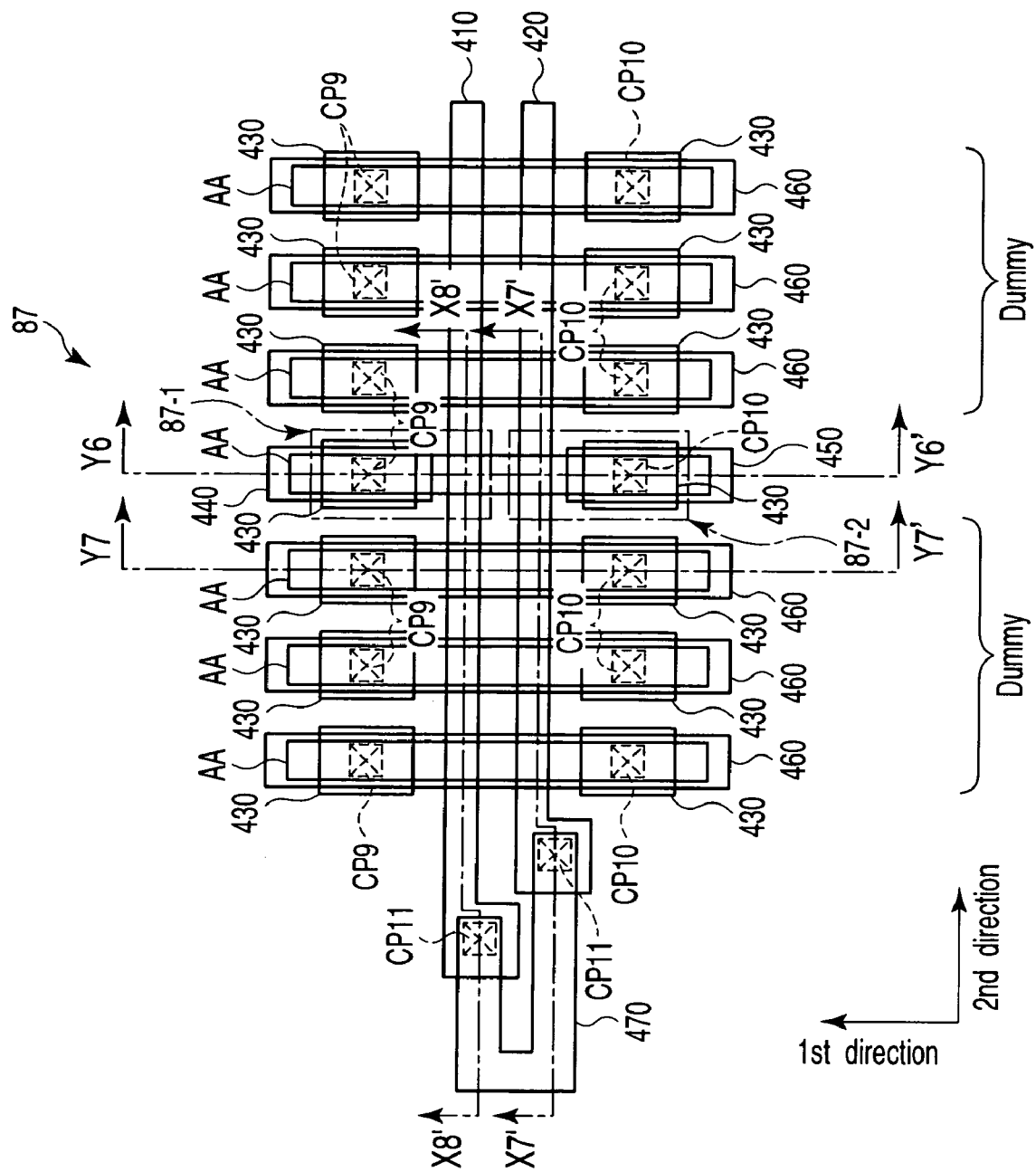
FIG. 31 is a plan view of a current source circuit provided in the 2Tr flash memory according to the first embodiment of the present invention.
Figure 32:
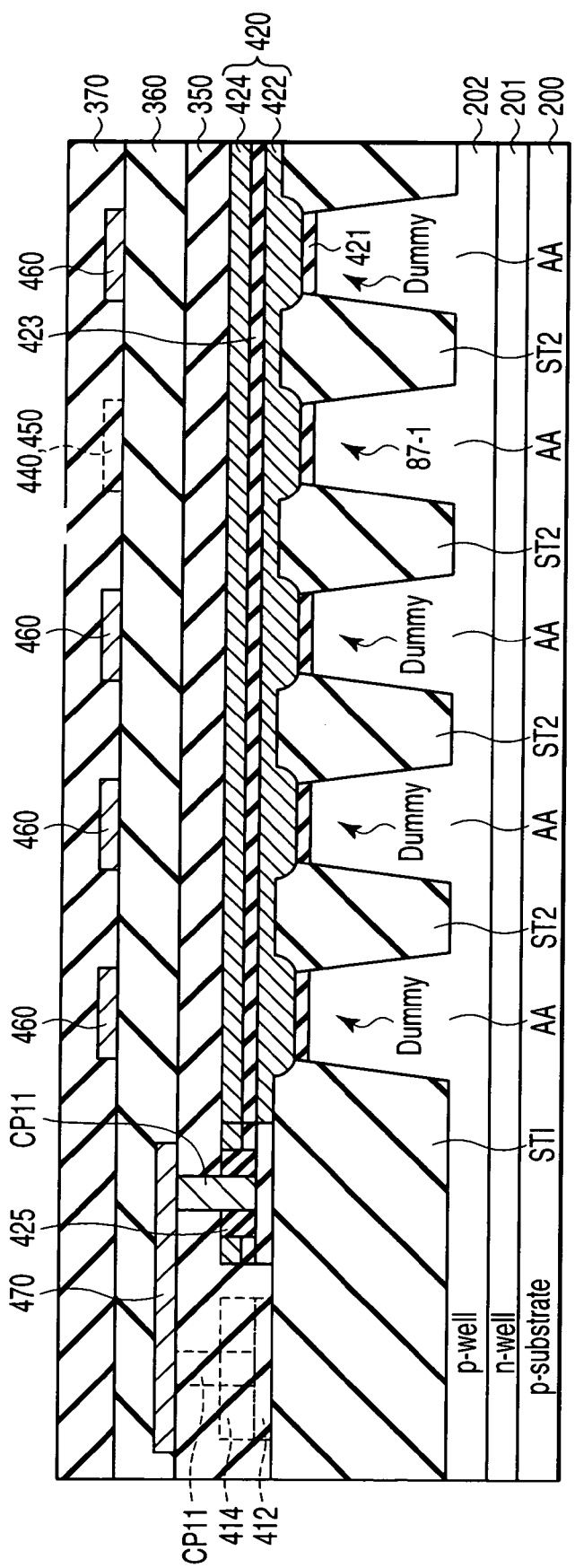
FIG. 32 is a sectional view taken along line X7-X7' in FIG. 31.
Figure 33:
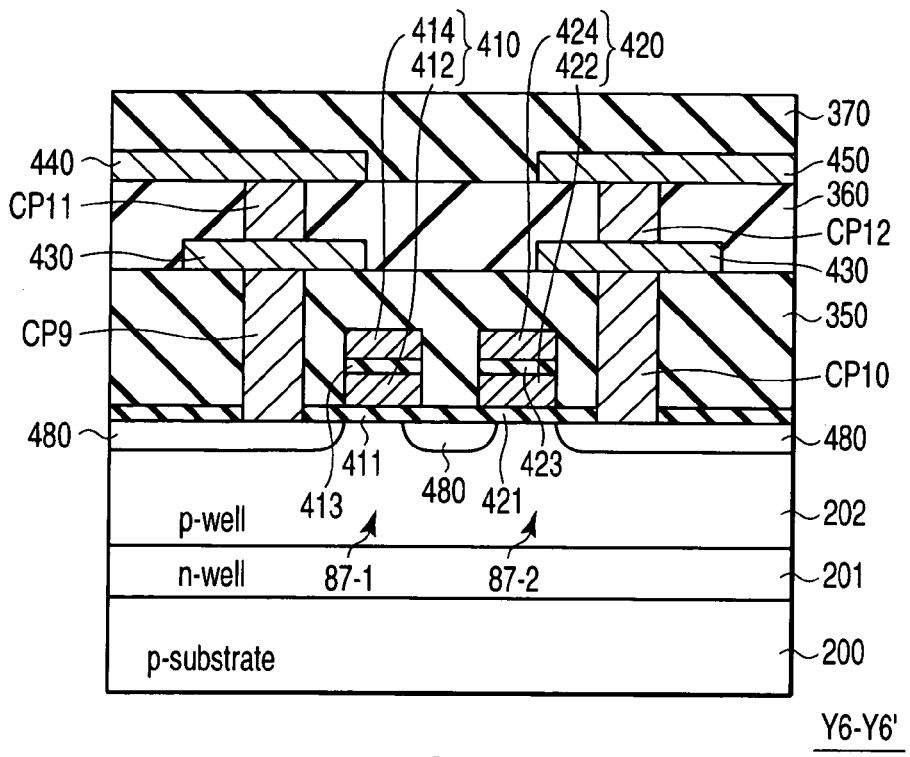
FIG. 33 is a sectional view taken along line Y6-Y6' in FIG. 31.
Figure 34:
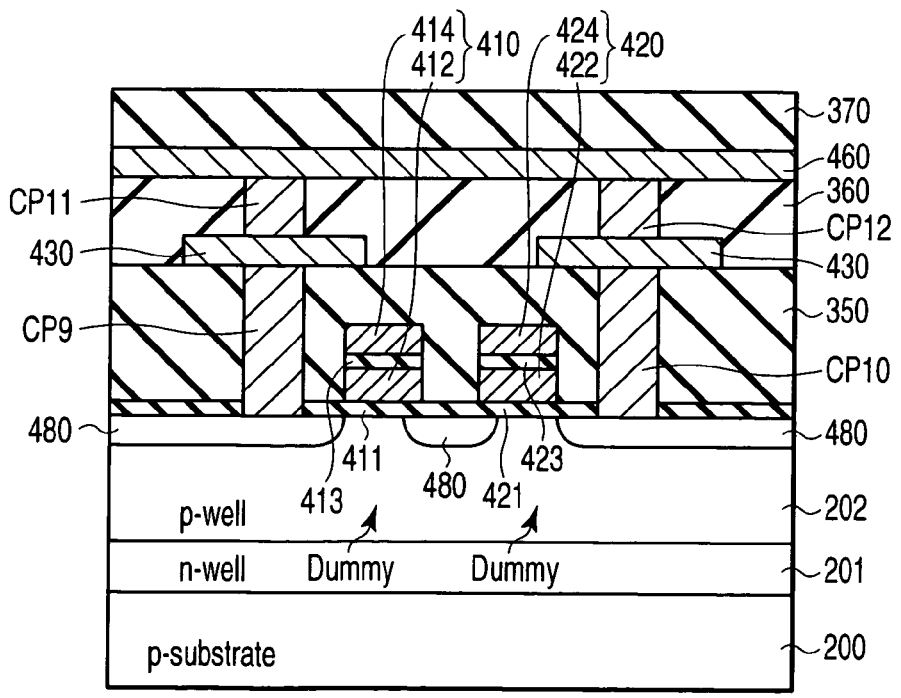
FIG. 34 is a sectional view taken along line Y7-Y7' in FIG. 31.

Now, with reference to FIGS. 31 to 34, description will be given of the configuration of the current source circuit 87, provided in the discharge circuit 81 in the read control circuit 80. FIG. 31 is a plan view of the current source circuit 87. FIGS. 32 to 34 are sectional views taken along lines X7-X7', Y6-Y6', and Y7-Y7', respectively.

As shown in the figures, as in the case of the memory cell array 10, the n-type well region 201 is formed in the surface region of the p-type semiconductor substrate 200. The p-type well region 202 is formed in the surface region of the n-type well region 201. A plurality of the isolation regions STI are formed in the surface of the p-type well region 202. The element regions AA are each a stripe-shaped region which is surrounded by the isolation region STI and in which a longitudinal direction extends along the first direction. Stripe-shaped gate electrodes 410 and 420 are formed on the p-type well region 202 so as to stride the plurality of element regions AA along the second direction, which is orthogonal to the first direction. The gate electrodes 410 and 420 function as the gate electrodes of MOS transistors 87-1 and 87-2, respectively. The gate electrodes 410 and 420 have a stacked structure similar to that of the select transistors ST in the prime cell PC and replica cell RC. That is, the gate electrode 410 comprises a polycrystalline silicon layer 412 formed on the p-type well region 202 via an inter-gate insulating film 411 and a polycrystalline silicon layer 414 formed on the polycrystalline silicon layer 412 via an inter-gate insulating film 413. The polycrystalline silicon layers 412 and 414 are connected together between the adjacent element regions AA. The polycrystalline silicon layer 412 substantially functions as a gate electrode. An impurity diffusion region 480 is formed in the surface of the p-type well region 202; the impurity diffusion layer 480 functions as a source and drain regions of the MOS transistors 87-1 and 87-2. The impurity region 430 is shared by the source region of the MOS transistor 87-1 and the drain region of the MOS transistor 87-2.

A plurality of MOS transistors are formed on the plurality of element regions AA. However, only several of the plurality of MOS transistors function as the MOS transistors 87-1 and 87-2. The other MOS transistors are dummies and do not have the substantial functions of the current source circuit 87.

The gate electrodes 410 and 420 are drawn to an end of the current source circuit 87 to form a region having the same structure as that of the shunt regions SA2 and SA4 of the prime cell PC and replica cell RC. That is, in the isolation region STI, the gate electrodes 410 and 420 are formed to be winder with the polycrystalline silicon layers 414 and 424 and inter-gate insulating films 413 and 423 removed.

The inter-level insulating film 350 is formed on the p-type well region 202 so as to cover the above group of MOS transistors. Contact holes CP9 and CP10 are formed in the inter-level insulating film 350; the contact holes CP9 and CP10 reach the impurity diffusion layer 480 in the MOS transistors 87-1 and 87-2. The contact holes CP9 are connected to the drain of the MOS transistor 87-1 and to the drains of the dummy MOS transistors on the same row as that on which the MOS transistor 87-1 is located. On the other hand, the contact holes CP10 are connected to the source of the MOS transistor 87-2 and to the sources of the dummy MOS transistors on the same row as that on which the MOS transistor 87-2 is located. Moreover, in the region from which the polycrystalline silicon layers 414 and 424 and inter-gate insulating films 413 and 423 are removed, a contact plug CP11 reaching the polycrystalline silicon layers 412 and 422 is formed in the inter-level insulating film 350.

Island-shaped metal interconnect layers 430 are formed on the inter-level insulating film 350. The metal interconnect layers 430, isolated from one another, are each contact with the contact plug CP9 or CP10. Moreover, a metal interconnect layer 470 is formed on the inter-level insulating film 350 so as to be connected to the contact plugs CP11. That is, the polycrystalline silicon layer 412 in the gate electrode 410 is electrically connected to the polycrystalline silicon layer 422 in the gate electrode 420 Via the contact plug CP11 and metal interconnect layer 470.

The inter-level insulating film 360 is formed on the inter-level insulating film 350 so as to cover the metal interconnect layers 430 and 470. Contact plugs CP11 and CP12 are formed in the inter-level insulating film 360; the contact plug CP11 is in contact with the metal interconnect layer 430 connected to the contact plug CP9 and the contact plug CP12 is in contact with the metal interconnect layer 430 connected to the contact plug CP10.

Stripe-shaped metal interconnect layers 440, 450, and 460 are formed on the inter-level insulating film 360; in the metal interconnect layers 440, 450, and 460, the longitudinal direction extends along the first direction. The metal interconnect layer 440 is in contact with the contact plug CP11 electrically connected to the MOS transistor 87-1. The metal interconnect layer 450 is in contact with the contact plug CP12 electrically connected to the MOS transistor 87-2. The metal interconnect layer 460 is in contact with the contact plugs CP11 and CP12 connected to the dummy MOS transistors. The metal interconnect layer 440 is connected to the replica read global bit line R_RGBL. The metal interconnect layer 450 is connected to the ground potential. The metal interconnect layer 370 is formed on the inter-level insulating film 360 so as to cover the metal interconnect layers 440, 450, and 460.

As described above, the current source circuit 87 has a configuration similar to that of the memory cell block BLK in the memory cell array 10. A part of the memory cell block can be diverted to the current source circuit 87. In this case, the memory cell transistor MT and the select transistor ST can each function as the MOS transistor 87-1 or 87-2 of the current source circuit 87. The metal interconnect layer 220 and local bit lines in the memory cell array 10 can be used as the metal interconnect layer 430 and metal interconnect layers 440, 450, and 460, respectively, in the current source circuit 87.

Figure 35:
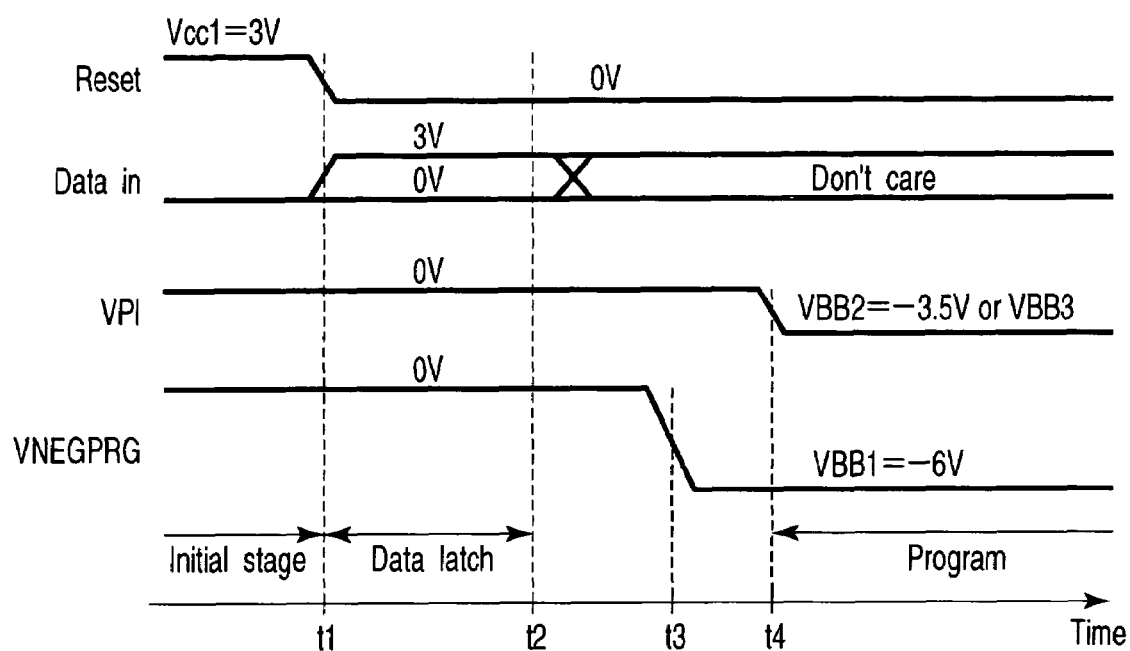
FIG. 35 is a timing chart of various signals output during a write operation of the 2Tr flash memory according to the first embodiment of the present invention.

Now, with reference to FIG. 35, description will be given of operations of the 2Tr flash memory 3 configured as described above. FIG. 35 is a timing chart of a reset signal Reset, a data signal, VPI, and VNEGPRG. In the description below, the following state is defined as the state in which binary 1 has been written: no electrons are injected into the floating gate and the threshold voltage is negative. The following state is defined as the state in which binary 0 has been written: electrons are injected into the floating gate and the threshold voltage is positive.

<Initial Operation>

Figure 36:
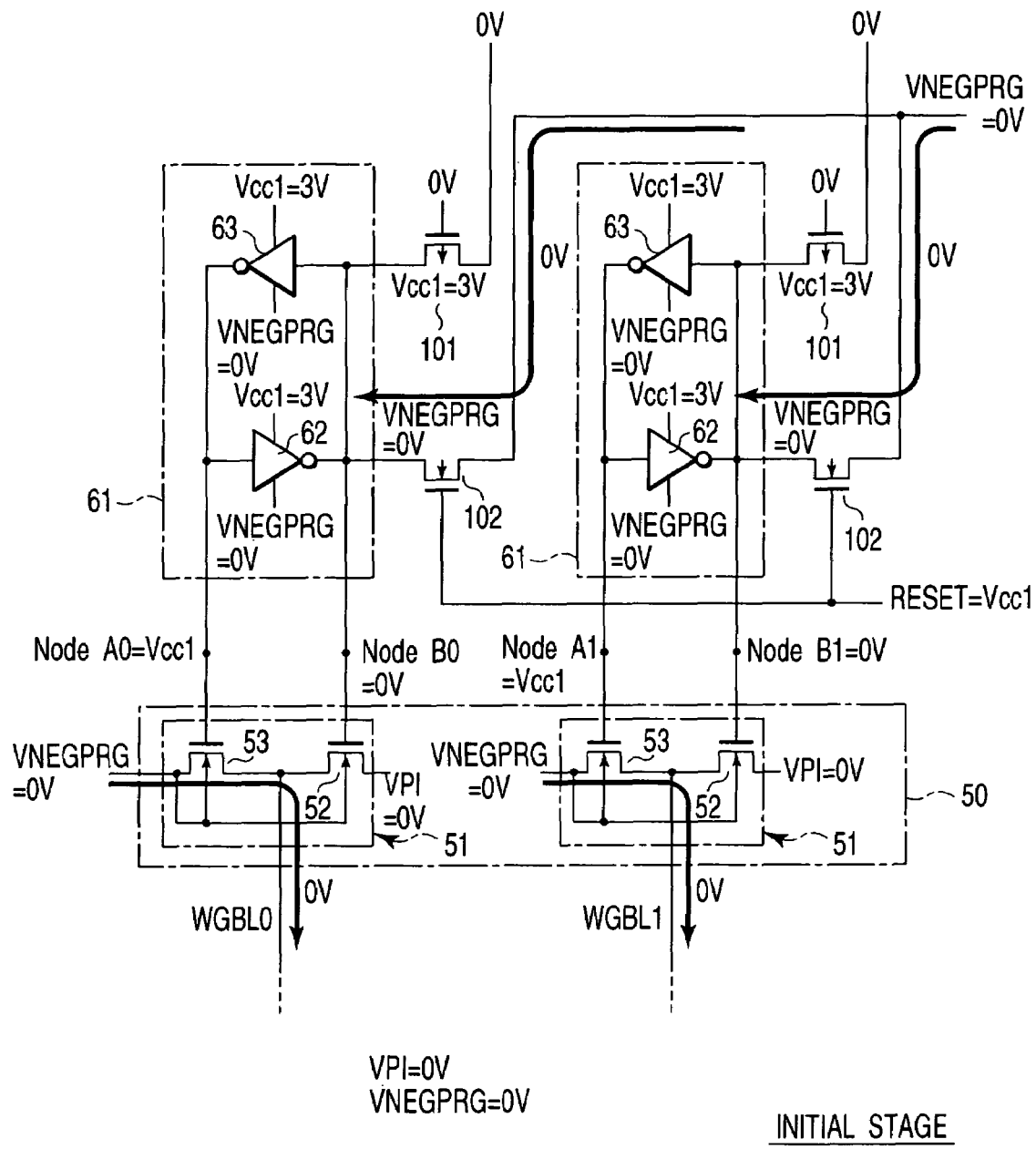
FIG. 36 is a circuit diagram showing how the write selector, the write circuit, and the switch group operate during an initial operation of the 2Tr flash memory according to the first embodiment of the present invention.

First, an initial operation will be described with reference to FIG. 36. The initial operation is performed before a data write, read, or erase operation. The initial operation is performed before time t1. FIG. 36 is a circuit diagram of the write selector 50, write circuit 60, and switch group 100 corresponding to the write global bit lines WGBL0 and WGBL1 during the initial operation. In the description below, the gates of the MOS transistors 52 and 53 in the select circuit 51 which correspond to the write global bit lines WGBL0 to WGBL(2n−1) will be called nodes B0 to B(2n−1) and A0 to A(2n−1). The gates of the MOS transistors 52 and 53 in the select circuit 51 which correspond to the replica write global bit lines R_WGBL0 and R_WGBL1 will be called nodes B0' and B1' and A0' and A1'. FIG. 36 shows only the circuit block corresponding to the write global bit lines WGBL0 and WGBL1. The figure can be changed to one corresponding to the replica cell array RCA by replacing the write global bit lines WGBL0 and WGBL1 with the replica write global bit lines R_WBGL0 and R_WGBL1.

In the initial operation, VPI and VNEGPRG are set to 0 V. The reset signal Reset is set to Vcc1 (=3 V). Then, the reset transistor 102 in the switch group 100 is turned on. Consequently, VNEGPRG=0 V is provided to the input nodes of all the latch circuits 61. Then, since the lower power supply voltage of the inverters 62 and 63 is VNEGPRG=0 V, the input nodes of all the latch circuits 61 are set to 0 V. The output nodes of all the latch circuits 61 are set to Vcc1. Then, the nodes B0 to Bn and B0' and B1' are set to 0 V. The nodes A0 to An and A0' and A1' are set to Vcc1. Therefore, in all the select circuits 51, the MOS transistor 52 is turned off, whereas the MOS transistor 53 is turned on. As result, the source of the MOS transistor 53 provides 0 V to the write global bit lines WGBL0 to WGBLn and to the replica write global bit lines R_WGBL0 and R_WGBL1.

As described above, in the initial operation, 0 V is provided to the input node of the latch circuit.

<Data Latch Operation>

Figure 37:
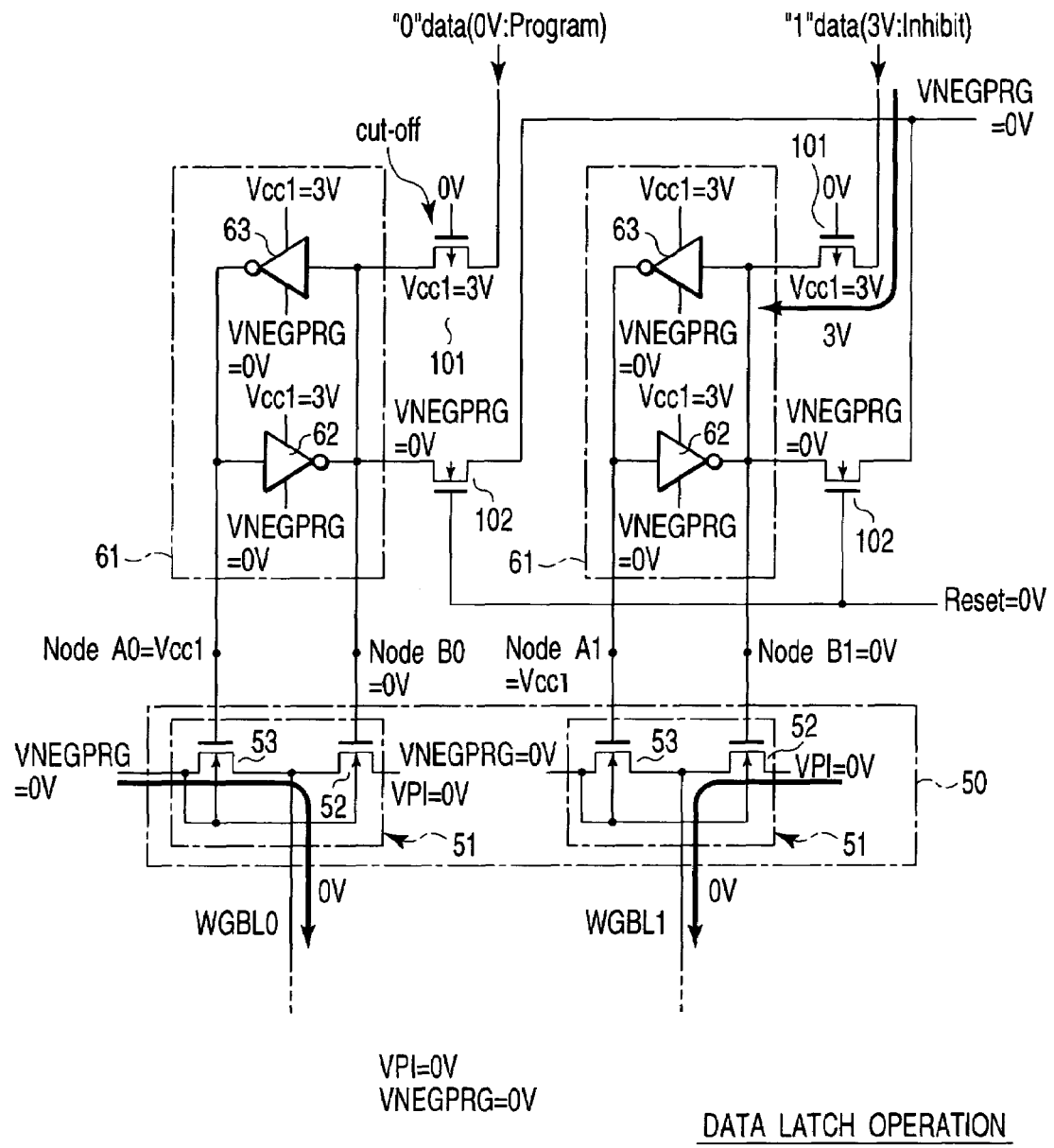
FIG. 37 is a circuit diagram showing how the write selector, the write circuit, and the switch group operate during a data latch operation of the 2Tr flash memory according to the first embodiment of the present invention.

Now, a data latch operation will be described with reference to FIG. 37. The data latch operation inputs write data to each latch circuit 61 before a data write operation. The data latch operation is performed between time t1 and time t2 in FIG. 35. FIG. 37 is a circuit diagram of the write selector 50, write circuit 60, and switch group 100 corresponding to the prime cell array PCA during the data latch operation.

Before the data latch operation, the reset signal Reset is set to 0 V. Write data is input to one end of the MOS transistor 101 corresponding to each of the write global bit lines WGBL0 to WGBL(2n−1). For a 0 write operation (electrons are injected into the floating gates), 0 V is applied to one end of the current path in the MOS transistor 101. For a 1 write operation (electrons are not injected into the floating gates), 3 V is applied to one end of the current path in the MOS transistor 101. Further, VPI and VNEGPRG remain at 0 V. Since the reset signal Reset is set to 0 V, all the MOS transistors 102 are turned off. All the MOS transistors 101 are on.

In the example in FIG. 37, binary 0 is written to the memory cells connected to the write global bit line WGBL0, whereas binary 1 is written to the memory cells connected to the write global bit line WGBL1.

Focusing on the write global bit line WGBL0, description will be given of an operation of writing binary 0. As shown in FIG. 37, 0 V is provided to one end of the current path in the MOS transistor 101. However, since the gate voltage of the MOS transistor is 0 V, the MOS transistor 101 is in a cutoff state. Accordingly, the data in the latch circuit 61 remains the same as that during the initial state. Consequently, the node A0 is at Vcc1 and the node B0 is at 0 V. Thus, in the select circuit 51 corresponding to the write global bit line WGBL0, the MOS transistor 53 is turned on, while the MOS transistor 52 is turned off. The source of the MOS transistor 53 provides VNEGPRG=0 V to the write global bit line WGBL0.

Now, Focusing on the write global bit line WGBL1, description will be given of an operation of writing binary 1. As shown in FIG. 37, 3 V is provided to one end of the current path in the MOS transistor 101. However, since the MOS transistor is on, 3 V reaches the input node of the latch circuit. Then, since VNEGPRG=0 V, the potential of the node A1 changes from Vcc1 to 0 V. The potential of the node B1 changes from 0 V to Vcc1. Thus, in the select circuit 51 corresponding to the write global bit line WGBL1, the MOS transistor 53 is turned off, while the MOS transistor 52 is turned on. The source of the MOS transistor 52 provides VPI=0 V to the write global bit line WGBL1.

When data is stored in the 2Tr flash memory, all the replica cells are unselected for a write operation. Accordingly, the operation of the write selector 50, write circuit 60, and switch group 100 corresponding to the replica write global bit lines R_WGBL0 and R_WGBL1 is the same as that performed in connection with the write global bit line WGBL1 in the prime cell array PCA. That is, 3 V is provided to one end of the current path in the MOS transistor 101. As a result, in the select circuit 51, the MOS transistor 52 is turned on. Thus, the source of the MOS transistor 52 provides VPI=0 V to the replica write global bit lines R_WGBL0 and R_WGBL1.

As described above, for the data latch operation, the data in the latch circuit corresponding to the memory cell to which binary 1 is written is inverted from the initial state. Specifically, for a 0 write operation (electrons are injected), substantially no external data is input. For a 1 write operation (no electrons are injected; unselect), external data is loaded.

<Write Operation>

Figure 38:
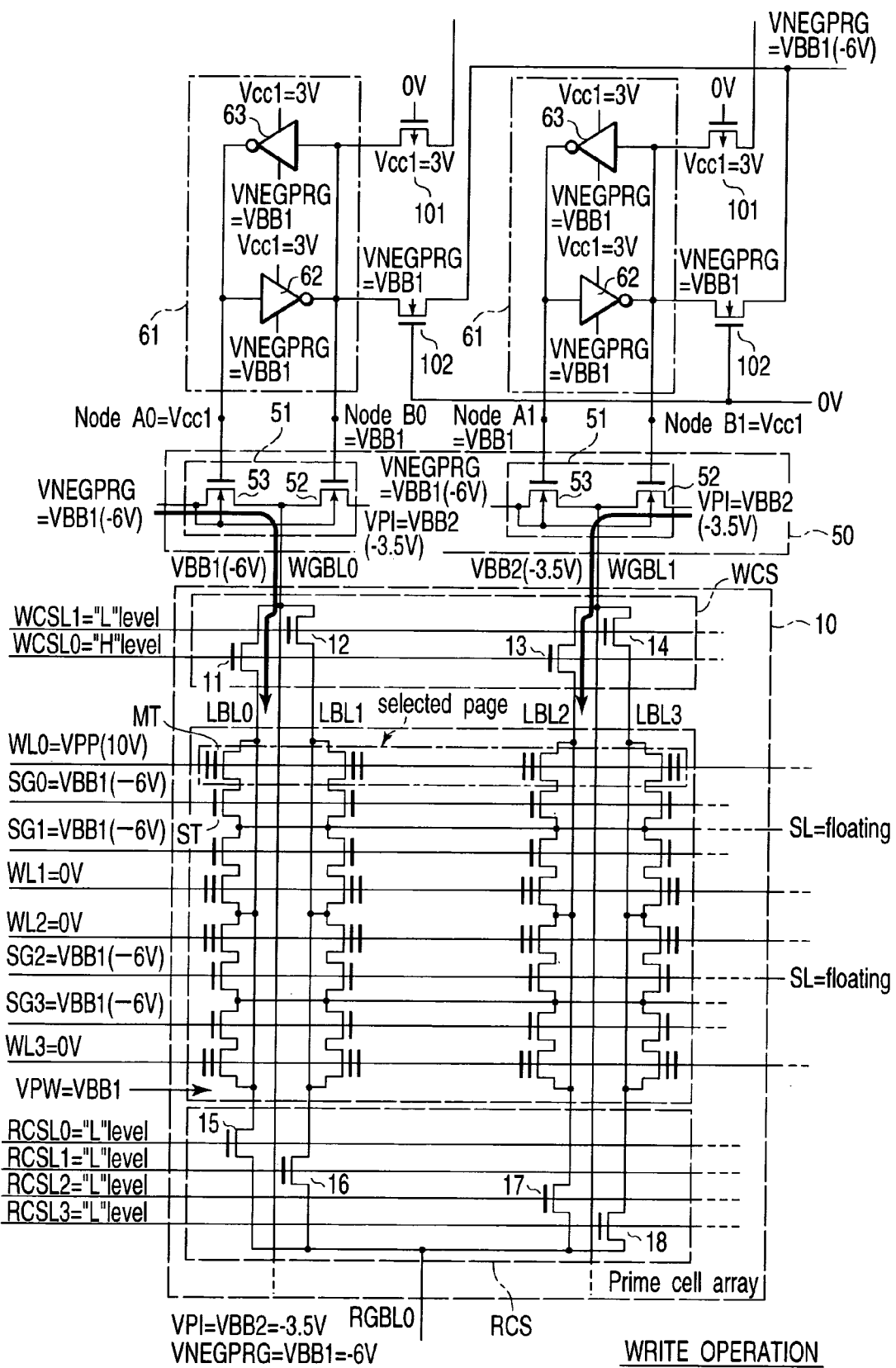
FIG. 38 is a circuit diagram showing how a prime cell array, the write selector, the write circuit, and the switch group operate during a write operation of the 2Tr flash memory according to the first embodiment of the present invention.
Figure 39:
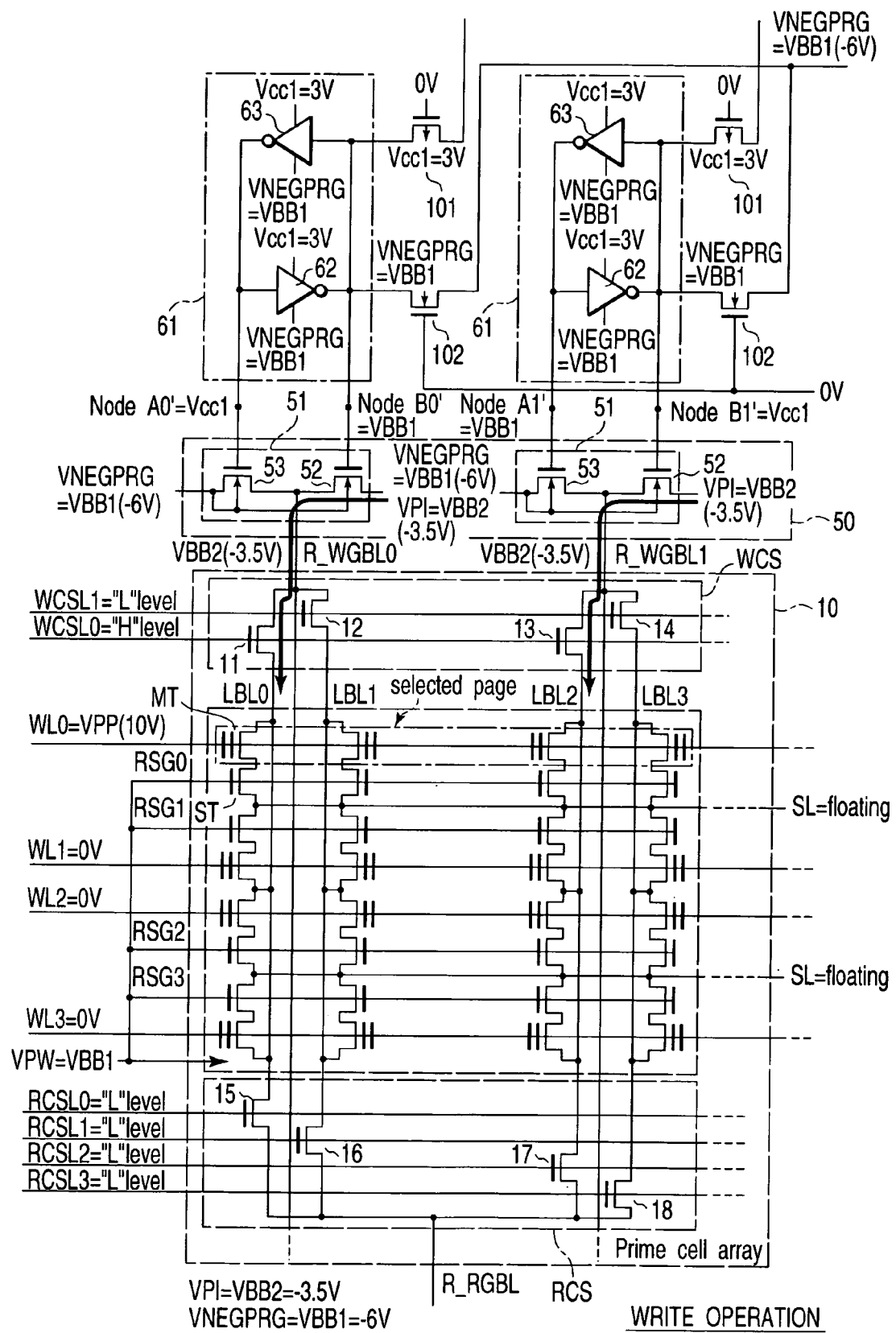
FIG. 39 is a circuit diagram showing how a replica cell array, the write selector, the write circuit, and the switch group operate during the write operation of the 2Tr flash memory according to the first embodiment of the present invention.

Now, a write operation will be described with reference to FIGS. 38 and 39. Data is written to all the memory cell blocks on the same row at a time. However, in each memory cell block, data is simultaneously written to two memory cells: the prime cell connected the local bit line LBL0 or LBL1 and the prime cell connected the local bit line LBL2 or LBL3. Further, binary 1 is always written to the replica cells connected to the selected word line. In other words, the data retained in the replica cells cannot be rewritten.

The write operation is started at time t4. FIG. 38 is a circuit diagram of the prime cell array PCA, write selector 50, write circuit 60, and switch group 100 during the write operation. FIG. 39 is a circuit diagram of the replica cell array RCA, write selector 50, write circuit 60, and switch group 100 during the write operation. In FIG. 38, data is written to the memory cell transistors MT connected to the word line WL0 and local bit lines LBL0 and LBL2. The binary 0 is written to the memory cell transistor MT connected to the local bit line LBL0. The binary 1 is written to the memory cell transistor MT connected to the local bit line LBL2. In other words, the memory cells connected to the local bit line LBL0 are selected. The memory cells connected to the local bit line LBL2 are unselected.

Before the write operation, the reset signal Reset remains at 0 V. At time t3, VNEGPRG is set to VBB1 (=−6 V), and at time t4, VPI is set to VBB2 (=−3.5 V). In response to an instruction from the write state machine 120, the voltage generator 130 outputs the negative potentials VBB1 and VBB2. VPI may be at a negative potential VBB3 instead of VBB2.

Then, the lower power supply voltage of the inverters 62 and 63 in the latch circuit 61 changes from 0 V to VBB1. Consequently, the potential of the nodes B0, A1, and B1' changes from 0 V to VBB1. In the select circuit 51 corresponding to the write global bit line WGBL0, the MOS transistor 53 is turned on. In the select circuits 51 corresponding to the write global bit line WGBL1 and replica write global bit lines R_WGBL0 and R_WGBL1, the MOS transistor 52 is turned on. The source potentials of the MOS transistors 52 and 53 are VPI=VBB2 and VNEGPRG=VBB1, respectively. Accordingly, the write global bit lines WGBL0 and WGBL1 is provided with VBB1 and VBB2, respectively. The replica write global bit lines R_WGBL0 and R_WGBL1 are provided with VBB2.

The write decoder 20 selects the word line WL0 and applies the positive voltage VPP (10 V) to the selected word line WL0. The write decoder 20 also applies the negative voltage VPP1 (−6 V) to all the select gate lines SG0 to SG(4m−1). Moreover, the write decoder 20 provides VBB1 to the substrate (p-type well region 202) in which the memory cells are formed. All the replica select gate lines RSG0 to RSG(4m−1) are set to the same potential as that of the p-type well region 202, that is, the negative potential VBB1.

Further, of the two write column select lines connected to the first column selector WCS corresponding to the memory cell block BLK including the selected word line WL0, the write column select line WCS0 is selected. This turns on the MOS transistors 11 and 13 in the first column selector WCS. As a result, the write global bit line WGBL0 is electrically connected to the local bit line LBL0. The write global bit line WGBL1 is electrically connected to the local bit line LBL2. Moreover, the replica write global bit line R_WGBL0 is electrically connected to the local bit line LBL0. The replica write global bit line R_WGBL1 is electrically connected to the local bit line LBL2.

The write column select lines are all unselected which are connected to the write selector WSEL corresponding to the memory cell block BLK free from the selected word line WL0. Thus, the MOS transistors 11 to 14 in the first column selector WCS are turned off which transistors correspond to the memory cell block BLK not including the selected word line. The column decoder 40 unselects all the read column select lines RCSL0 to RCSL(4m−1). This turns off the MOS transistors 15 to 18 in all the second column selector RCS. Therefore, the read global bit line RGBL and the replica read global bit line R_RGBL are electrically separated from the local bit lines LBL0 to LBL3.

As a result, in the prime cell array PCA, the write global bit line WGBL0 provides the write voltage (VBB1), via the MOS transistor 11 in the first column selector WCS, to the local bit line LBL0 in the memory cell block BLK including the selected word line WL0. Moreover, the write global bit line WGBL1 provides the write inhibition voltage VPI (VBB2), via the MOS transistor 13, to the local bit line LBL2 in the memory cell block BLK including the selected word line WL0. On the other hand, in the replica cell array, the replica write global bit line R_WGBL0 provides the write inhibition voltage VPI, via the MOS transistor 13 in the first column selector WCS, to the local bit line LBL0 in the memory cell block BLK including the selected word line WL0. Further, the replica write global bit line R_WGBL1 provides the write inhibition voltage VPI, via the MOS transistor 13 in the first column selector WCS, to the local bit line LBL2 in the memory cell block BLK including the selected word line WL0.

As a result, there is an insufficient potential difference between the gate and channel of the memory cell transistor MT connected to the write global bit line WGBL1 and word line WL0 (VPP−VBB2=6.5 V). Consequently, no electrons are injected into the floating gate of the memory cell transistor. That is, the threshold voltage for the prime cells PC maintains the negative value. Similarly, no electrons are injected into the memory cell transistors MT connected to the replica write global bit lines R_WGBL1 and R_WGBL1 and word line WL0. The threshold voltage for the replica cells RC maintains the negative value.

In contrast, there is a sufficient potential difference between the gate and channel of the memory cell transistor MT connected to the write global bit line WGBL0 and word line WL0 (VPP−VBB1=16 V). Consequently, FN tunneling causes electrons to be injected into the floating gate of the memory cell transistor. This changes the threshold voltage for the memory cell transistor MT to a positive value. That is, the binary 0 is written.

As described above, data is written to the memory cell transistors for one page at a time. Only the prime cell array PCA is substantially used to store data, whereas the binary 0 is always written to the replica cell array RCA. That is, the write operation does not change the threshold voltage for the replica cells RCs, with substantially no data written to the replica cells RC.

<Erase Operation>

Figure 40:
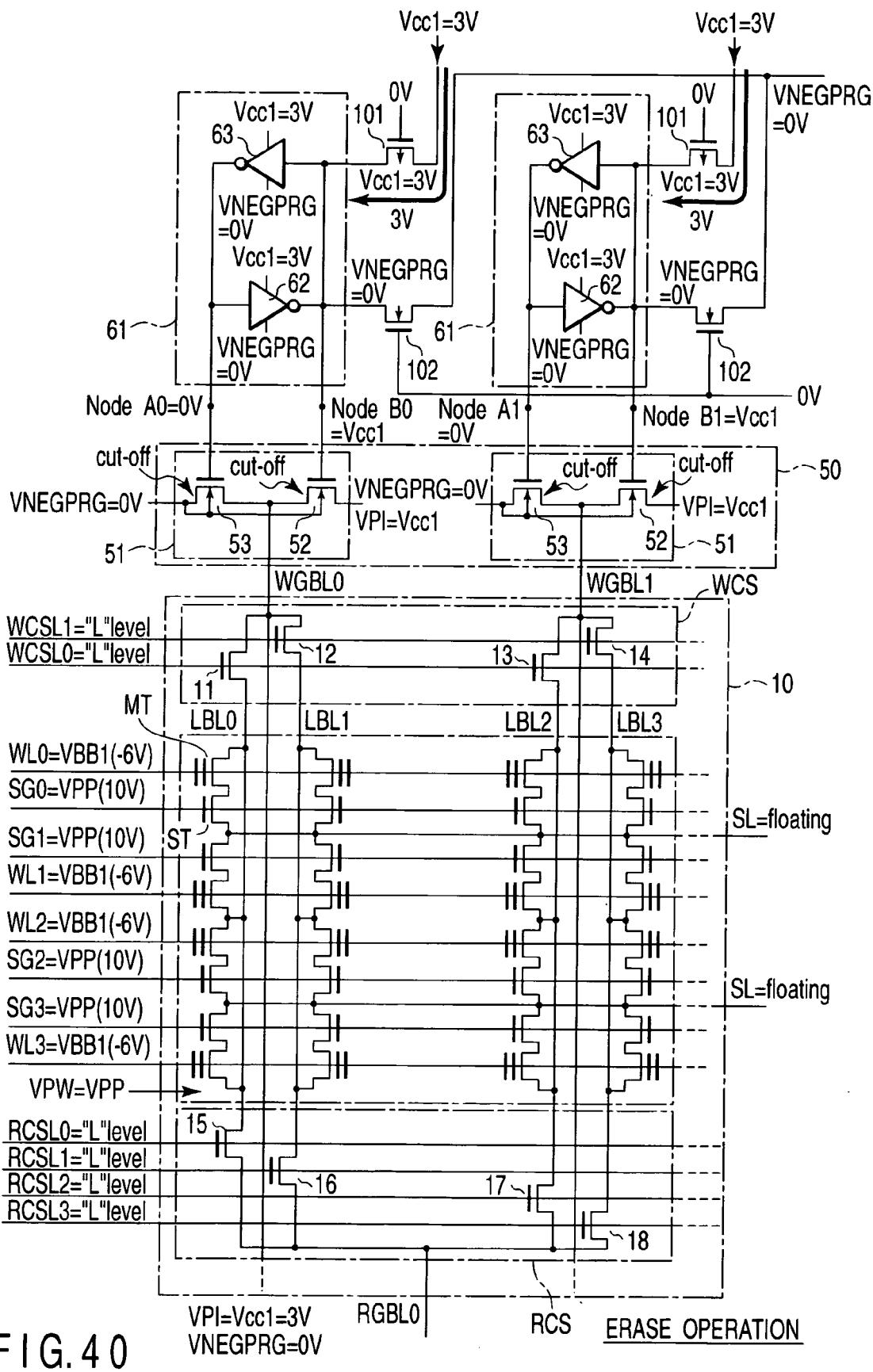
FIG. 40 is a circuit diagram showing how the memory cell array, the write selector, the write circuit, and the switch group operate during an erase operation of the 2Tr flash memory according to the first embodiment of the present invention.

Now, an erase operation will be described with reference to FIG. 40. FIG. 40 is a circuit diagram of the prime cell array PCA, write selector 50, write circuit 60, and switch group 100 during the erase operation. The state of the replica cell array during the erase operation is similar to that shown in FIG. 40. Data is erased from all the memory cells having a common well. The erase operation is performed by drawing electrons out of the floating gate on the basis of FN tunneling.

For the erase operation, the reset signal Reset is set to 0 V, and 3 V is applied to one end of the current path in the MOS transistors 91 corresponding to all the write global bit lines WGBL0 to WGBL(2n−1) and all the replica write global bit lines R_WGBL0 and R_WGBL1. VPI is Cvv1 and VNEGPRG is 0 V. Since the reset signal Reset is set to 0 V, all the MOS transistors 92 are turned off. All the MOS transistors 91 are turned on. Accordingly, 3 V is provided to the input node of the latch circuit 51. Then, since VNEGPRG=0 V, the potential of the nodes A0 to An, A0', and A1' is set to 0 V. The potential of the nodes B0 to Bn, B0', and B1' is set to Vcc1. Consequently, in all the select circuits 51, the MOS transistors 42 and 43 are brought into the cutoff state. Therefore, all the write global bit lines WGBL0 to WGBL(2n−1) and all the replica write global bit lines R_WGBL0 and R_WGBL1 are electrically separated from the latch circuit 51, VNEGPRG, and VPI. These global bit lines thus float.

The column decoder 40 then unselects all the write column select lines WCSL0 to WCSL(2m−1) and read column select lines RCSL0 to RCSL(4m−1). The column decoder 40 makes these column select lines low. This turns off all the MOS transistors 11 to 18.

The write decoder 20 applies the negative voltage VBB1 to all the word lines WL0 to WL(4m−1) in the selected block. The write decoder 20 applies the positive voltage VPP to all the select gate lines SG0 to SG(4m−1) in the selected block. The write decoder 20 further applies VPP to the p-type well region 202 in which the memory cell array is formed. Therefore, the potential of the replica select gate lines RSG0 to RSG(4m−1) is set to VPP.

As a result, FN tunneling causes electrons to be drawn out of the floating gate of the memory cell transistor in the memory cell MC and carried to the semiconductor substrate. This makes negative the threshold voltage of all the prime and replica cells PC and RC connected to the word lines WL0 to WL(4m−1). The data is thus erased.

As described above, the data is erased at a time.

<Read Operation>

Figure 42:
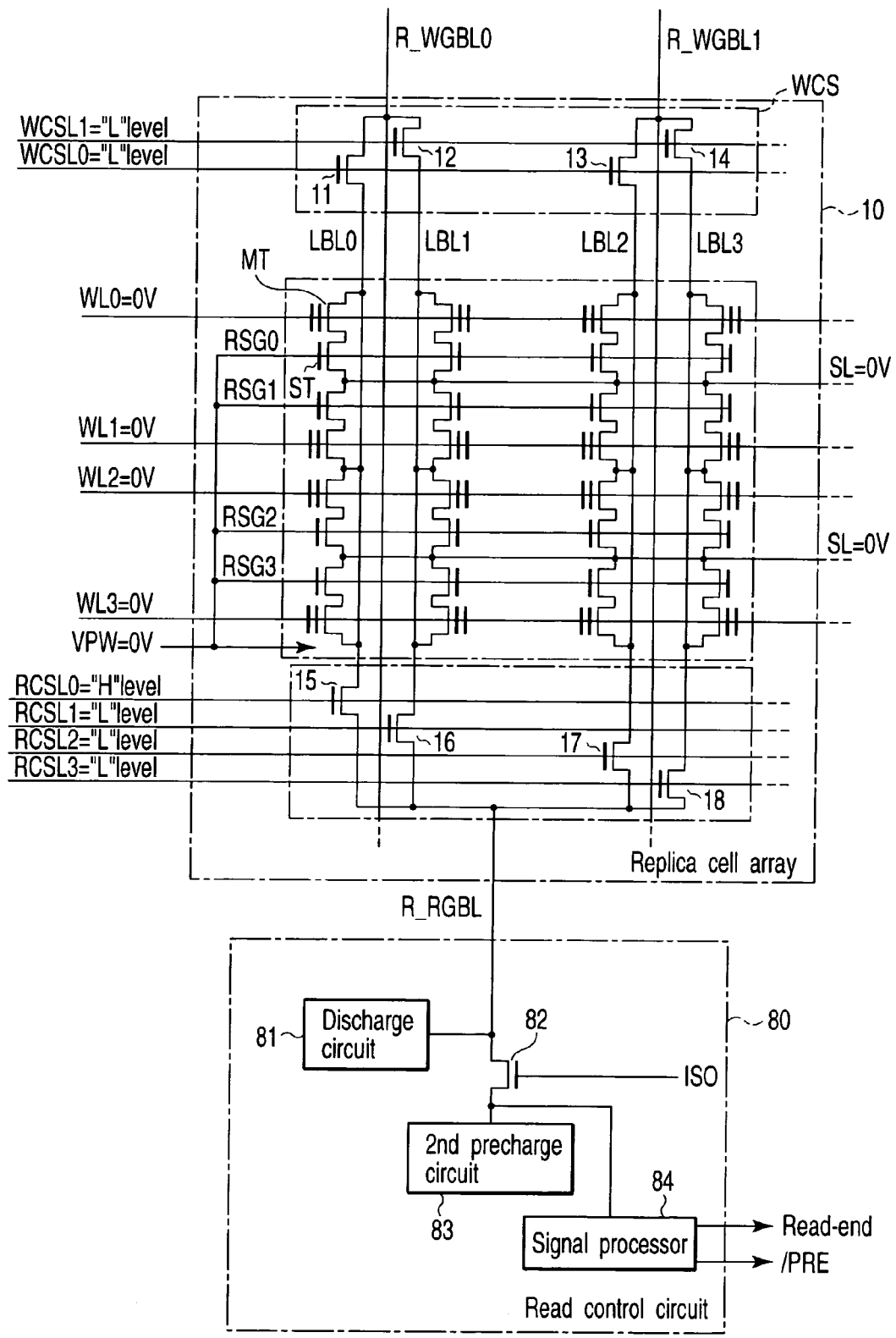
FIG. 42 is a circuit diagram showing how the replica cell array, the write selector, the write circuit, and the switch group operate during the read operation of the 2Tr flash memory according to the first embodiment of the present invention.

Now, a read operation will be described with reference to FIGS. 41 and 42. FIG. 41 is a circuit diagram of the prime cell array PCA and read unit 71 in the 2Tr flash memory 3. FIG. 42 is a circuit diagram of the replica cell array RCA and read control circuit 80. FIG. 41 shows that the data is read from the memory cell transistor MT connected to the local bit line LBL0 and word line WL0. FIG. 42 shows how the replica cell array RCA operates during the data read operation.

In the present embodiment, the data is read only from the prime cell array PCA and not from the replica cell array RCA. The data is read from one prime cell PC per memory cell block BLK. However, if a plurality of read global bit lines RGBL are present per memory cell block BLK, the data corresponding to the number of read global bit lines is read.

First, as shown in FIG. 41, the select gate decoder 30 selects the select gate line SG0 (high: Vc=3 V). Further, the write decoder 20 unselects all the word lines WL0 to WL(4m−1) (0 V) and sets the potential of the p-type well region 202 to 0 V. Moreover, the source line driver 90 sets the potential of the source lines to 0 V.

The column decoder 40 then selects one RCSL0 of the four read column select lines RCSL0 to RCSL3 connected to the second column selector RCS corresponding to the memory cell block BLK including the selected select gate line SG0. This turns on the MOS transistor 15 in the second column selector RCS corresponding to the memory cell block BLK including the selected select gate line SG0. Further, the signal ISO goes high to turn on the MOS transistor 72. This electrically connects the read global bit line RGBL0 to the local bit line LBL0. However, the read column select lines are all unselected which are connected to the second column selector RCS corresponding to the memory cell block BLK not including the selected select gate line SG0.

The column decoder 40 unselects all the write column select lines WCSL0 to WCSL(2m−1). This turns off all the four MOS transistors 11 to 14 in all the write column select lines WCSL0 to WCSL(2m−1). Therefore, the write global bit line WGBL is electrically separated from the local bit lines LBL0 to LBL3.

As a result, one of the local bit lines LBL0 to LBL3 per memory cell block BLK is connected to the sense amplifier 74 via the second column selector RCS, read global bit line, and MOS transistor 72.

Then, the sense amplifier 74 amplifies a variation in the potential across the read global bit line RGBL to allow the data to be read. That is, for example, 3.0 V is applied to the read global bit line RGBL0. Then, if the binary 1 is written to the memory cell transistor MT connected to the selected word line WL0 and the selected local bit line LBL0, a current flows from the read global bit line RGBL to the corresponding source line. On the other hand, if the binary 0 is written to the memory cell transistor MT, no current flows.

In the replica cell array RCA, the replica select gate lines RCA0 to RCA(4m−1) are set to 0 V. Consequently, the data is not read from the replica cells RC connected to the selected word line WL0.

Figure 43:
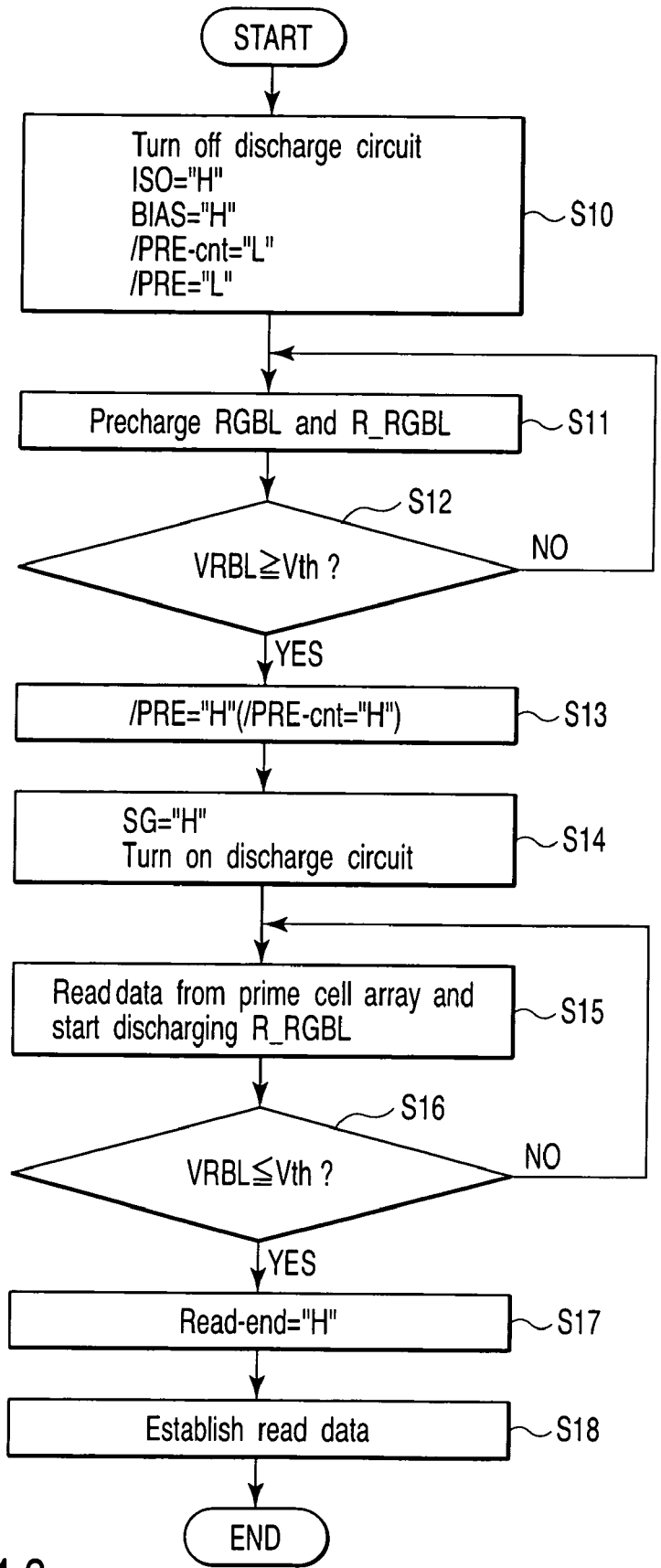
FIG. 43 is a flowchart of the read operation of the 2Tr flash memory according to the first embodiment of the present invention.
Figure 44:
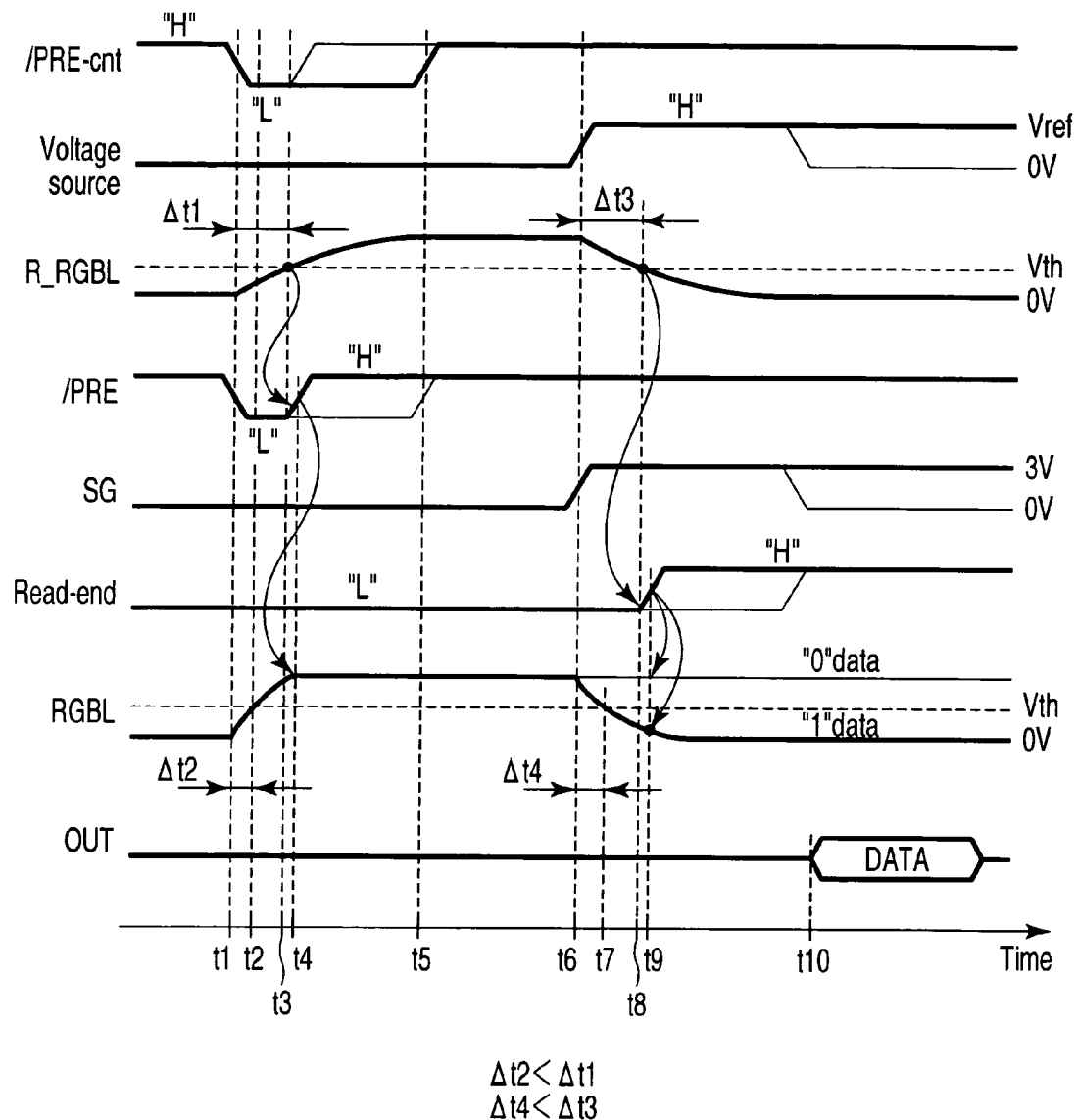
FIG. 44 is a timing chart of various signals output during the read operation of the 2Tr flash memory according to the first embodiment of the present invention.

The read operation will be described in detail with reference to FIGS. 43 and 44. FIG. 43 is a flowchart of the read operation. FIG. 44 is a timing chart of various signals during the read operation. For simplification, the read global bit lines RGBL0 to RGBL(n−1) will be simply referred to as RGBL.

First, before the read operation, the read global bit line RGBL and the replica read global bit line R_RGBL are connected to one of the local bit lines LBL0 to LBL3. Further, the discharge circuit 81 is turned off (MOS transistors 87-1 and 87-2 are turned off; see FIG. 12). Moreover, the bias voltage BIAS goes high, and signals /PRE-cnt and /PRE go low. Consequently, the following MOS transistors are turned on: the MOS transistors Q1 and Q2 in the first precharge circuit 73 and the MOS transistors Q11 and Q12 in the second precharge circuit 83. Furthermore, the signal ISO goes high to turn on the MOS transistor 82 (step S10, time t1). Thus, the first and second precharge circuits 73 and 84 precharge the read global bit line RGBL and the replica read global bit line R_RGBL, respectively (step S11).

The first and second precharge circuits 73 and 84 have the same precharge capability (voltage supply capability). A parasitic capacitance present on the read global bit line RGBL is smaller than that present on the replica read global bit line R_RGBL. Accordingly, the rate of increase in the potential across the read global bit line RGBL is higher than that in the potential across the replica read global bit line R_RGBL. Thus, the potential across the read global bit line RGBL raises to a data determination threshold voltage Vth for the sense amplifier 74 more rapidly than that across the replica read global bit line R_RGBL. In the example in FIG. 44, it takes the potential across the replica read global bit line R_RGBL a time Δt1 to reach Vth (time t3). In contrast, it takes the potential across the read global bit line RGBL a time Δt2 (<Δt1) to reach Vth (time t2).

The signal processor 84 in the read control circuit 80 monitors the potential VRBL across the replica read global bit line R_RGBL (see FIG. 4). While the potential VRBL is lower than Vth, the precharge signal /PRE is continuously asserted (low). When the potential VRBL reaches Vth (step S12; time t3), the precharge signal /PRE is negated (made high). Making the precharge signal /PRE high finishes precharging the read global bit line RGBL (step S13; time t4). As previously described, VRBL is higher than Vth at this time. After time t3, the precharge signal /PRE-cnt is also made high to finish precharging the replica read global bit line R_RGBL.

Then, the select gate decoder 30 selects one of the select gate lines SG to turn on the discharge circuit 81 (step S14, time t6). When the discharge circuit 81 is turned on, the voltage generator 88 outputs the constant voltage Vref. The output of the voltage Vref turns on the MOS transistors 87-1 and 87-2 in the current source circuit 87.

When the select gate decoder 30 selects the select gate line SG, the data retained in the corresponding prime cell PC is read onto the corresponding read global bit line RGBL. Further, the discharge circuit 81 is simultaneously turned on to cause the current source circuit 87 to discharge the replica read global bit line R_RGBL (step S15, time t6). On this occasion, all the replica select gate lines RSG are at 0 V.

If the prime cells PC connected to the selected select gate line retain the binary 0, the potential VBL across the read global bit line RGBL maintains the value of the precharge potential. On the other hand, if the prime cells RC retain the binary 1, the potential VBL lowers from the precharge potential value to 0 V. The potential VRBL across the replica read global bit line R_RGBL lowers toward 0 V regardless of the threshold voltage for the replica cells RC. The rate of decrease in the potential across the read global bit line RGBL is higher than that in the potential across the replica read global bit line R_RGBL. Consequently, the potential across the read global bit line RGBL connected to the prime cells retaining the binary 1 lowers to the data determination threshold voltage Vth for the sense amplifier 74 more rapidly than that across the replica read global bit line R_RGBL. This is because the parasitic capacitance present on the read global bit line RGBL is smaller than that present on the replica read global bit line R_RGBL, so that the read global bit line RGBL requires a shorter time to be discharged than the replica read global bit line R_RGBL. In the example in FIG. 44, it takes the potential across the replica read global bit line R_RGBL a time Δt3 to change from the precharge level to Vth (time t8). In contrast, it takes the potential across the read global bit line RGBL a time Δt4 (<Δt3) to change from the precharge level to Vth (time t7).

While the potential VRBL is higher than Vth, the signal processor 84 in the read control circuit 80 continuously negates the read end signal Read-end (low). When the potential VRBL reaches Vth (step S16, time t8), the read end signal Read-end is asserted (made high; step S17, time t8). When the read end signal Read-end is made high, the sense amplifier 74 establishes read data on the basis of the potential VBL at that point in time (step S18, time t9). More specifically, the data stored in a flip flop at time t9 is established as read data. That is, at time t9, the sense amplifier 74 determines the data to be "0" if the potential VBL exceeds Vth. The sense amplifier 74 determines the data to be "1" if the potential VBL does not exceed Vth. As previously described, if the prime cells PC retain the binary 1, the potential VBL is lower than Vth when the read end signal Read-end is high.

At time t10, the sense amplifier 74 outputs the read data established at time t9, as an output signal OUT.

The above flash memory can produce effects (1) to (10) described below.

(1) Data Read Accuracy can be Improved (Part I)

Figure 45:
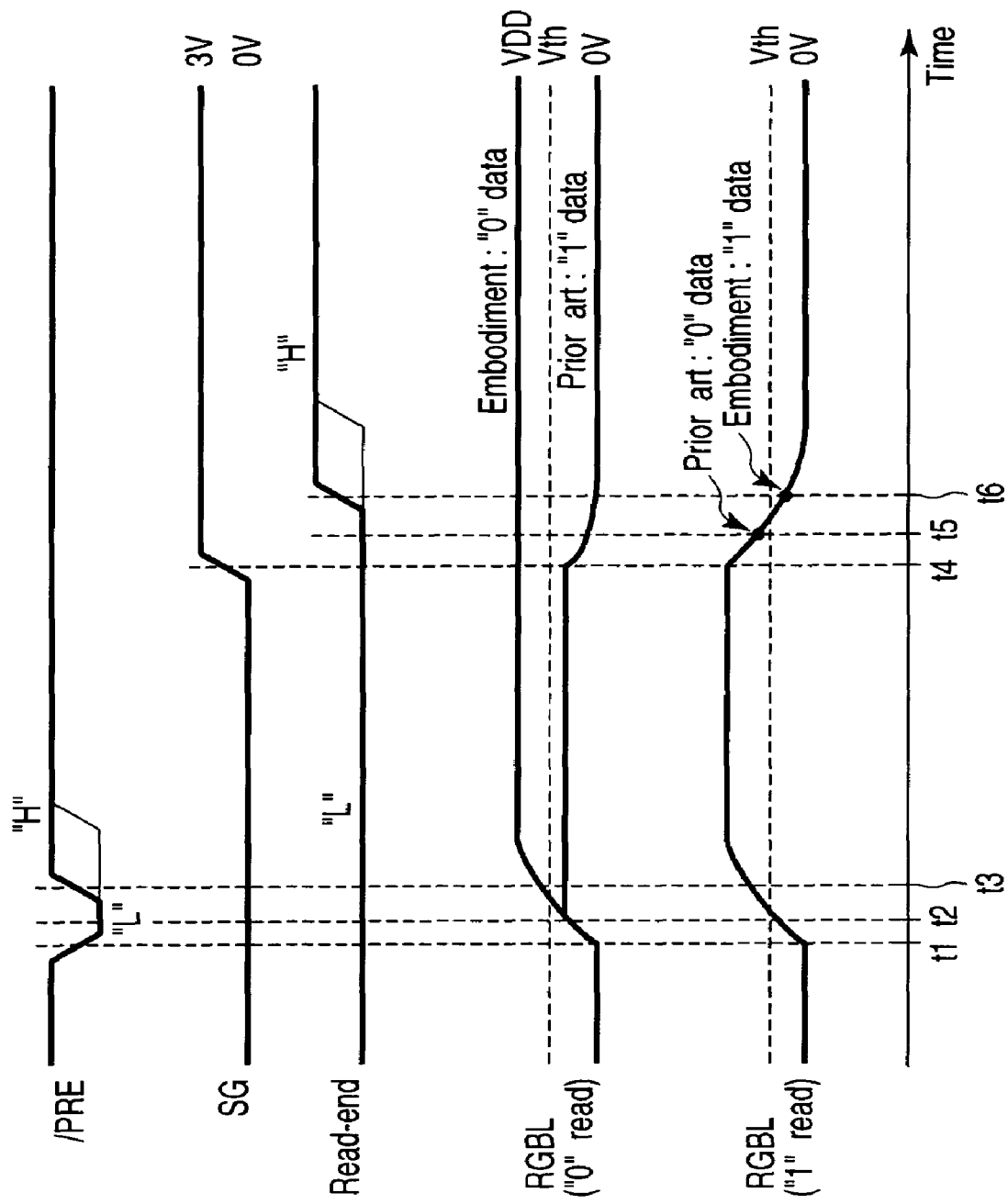
FIG. 45 is a timing chart of various signals output during the read operation of the 2Tr flash memory according to the first embodiment of the present invention and during a read operation of a conventional 2Tr flash memory.

The above configuration can improve the accuracy with which data is read. This will be described with reference to FIG. 45. FIG. 45 is a timing chart of the precharge signal /PRE, the potential across the select gate line SG, the read end signal Read-end, the potential across the read global bit line RGBL during a 0 read operation, and the potential across the read global bit line RGBL during a 1 read operation.

(1-1) Binary 0 Read Operation

First, a 0 read operation will be described. The conventional read method may provide an excessively short precharge time for the bit line. In the example in FIG. 45, precharging may end at time t2 before the potential across the bit line rises to the data determination threshold voltage Vth for the sense amplifier. In this case, the bit line potential (precharge potential) is lower than Vth. Consequently, even if the memory cells retain the binary 0, the sense amplifier erroneously determines the read to be binary 1.

Figure 46:
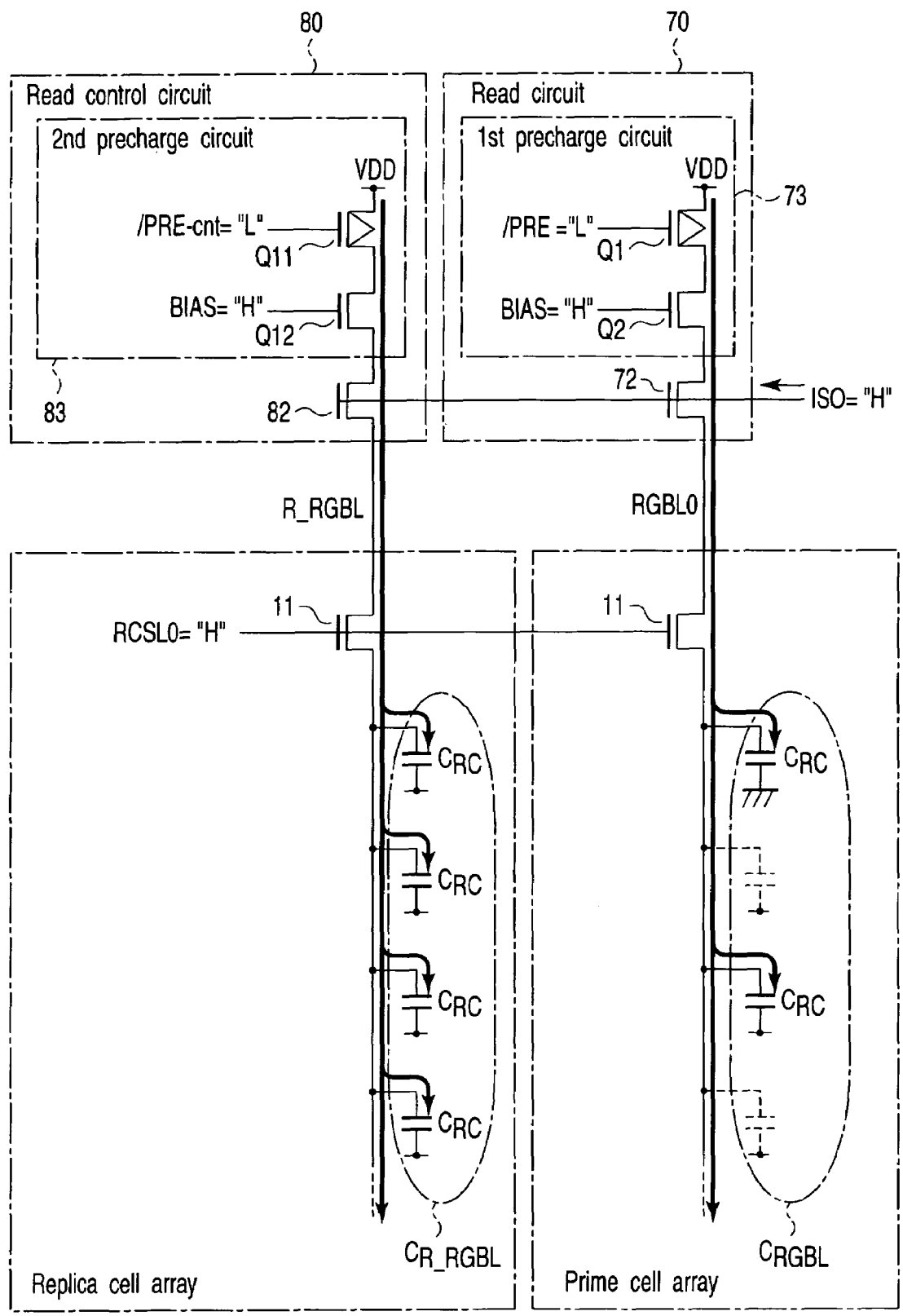
FIG. 46 is a circuit diagram of the memory cell array, read circuit, and read control circuit in the 2Tr flash memory according to the first embodiment of the present invention during bit line precharge.

However, with the above configuration, precharging of the read global bit line ends after the replica read global bit line reaches Vth. At this time, the potential across the read global bit line is ensured to be higher than Vth. Consequently, the read data can be precisely determined. This will be described with reference to FIG. 46. FIG. 46 is a schematic circuit diagram of the prime cell array PCA, replica cell array RCA, read circuit 70, and read control circuit 80 during precharging.

The first precharge circuit 73 precharges the read global bit line RGBL. The second precharge circuit 83 precharges the replica read global bit line R_RGBL. The first and second precharge circuits have the same precharge capability. Therefore, the time required for precharging depends on the parasitic capacitance present on the read global bit line RGBL and replica read global bit line R_RGBL. A larger parasitic capacitance results in a longer time required for precharging.

As previously described, the parasitic capacitance $C_{RC}$ of each of the local bit lines LBL0 to LBL3 in the prime cell array PCA is smaller than that of each of the local bit lines LBL0 to LBL3 in the replica cell array RCA. That is, the total parasitic capacitance $C_{R\_RGBL}$ present on the replica read global bit line R_RGBL is larger than the total parasitic capacitance $C_{RGBL}$ present on the read global bit line RGBL. Therefore, the time required to precharge the replica read global bit line R_RGBL is longer than that required to precharge the read global bit line RGBL.

The signal processor 84 generates a precharge signal /PRE on the basis of the potential across the replica read global bit line R_RGBL. More specifically, the precharge signal /PRE is negated after the potential across the replica read global bit line R_RGBL has exceeded the data determination threshold voltage for the sense amplifier 74. In other words, the precharge signal /PRE is not negated until the potential across the bit line (replica read global bit line R_RGBL) requiring the longest time for precharging exceeds Vth. Accordingly, when the precharge signal /PRE is negated, the potentials of all the bit lines (read global bit lines and replica read global bit lines) are higher than Vth, the bit lines being included in the memory cell array 10. This enables the potentials across the bit lines to be reliably precharged.

The above effect also results from the fact that the replica cell array RCA is farthest from the select gate decoder 30, which controls the signal ISO. The data read operation, more specifically, the precharge operation, is not started until the signal ISO is made high to turn on the isolating MOS transistors 72 and 82. Thus, since the isolating MOS transistor 82 in the read control circuit 80 is farther from the select gate decoder 30 than all the MOS transistors 72 in the read circuit 70, the MOS transistor 82 is turned on after all the MOS transistors 72 are turned on. That is, the replica read global bit line R_RGBL is precharged after precharging of all the read global bit lines RGBL has been started. The signal processor 84 controls the precharge signal /PRE with reference to the potential of the replica read global bit line R_RGBL, which starts being precharged latest. This makes it possible to reliably set the potential across the read global bit line RGBL equal to or higher than Vth, the read global bit line RGBL starting being precharged earlier than the replica read global bit line R_RGBL.

(1-2) Binary 0 Reading Operation

Now, a 1 read operation will be described. The conventional read method may use an excessively short time for the read operation. In the example in FIG. 45, reading data from the memory cells may be ended at time t5 before the potential across the bit line lowers to the data determination threshold voltage for the sense amplifier. In this case, the bit line potential is higher than Vth. Consequently, even if the memory cells retain the binary 1, the sense amplifier erroneously determine that the read binary 0.

Figure 47:
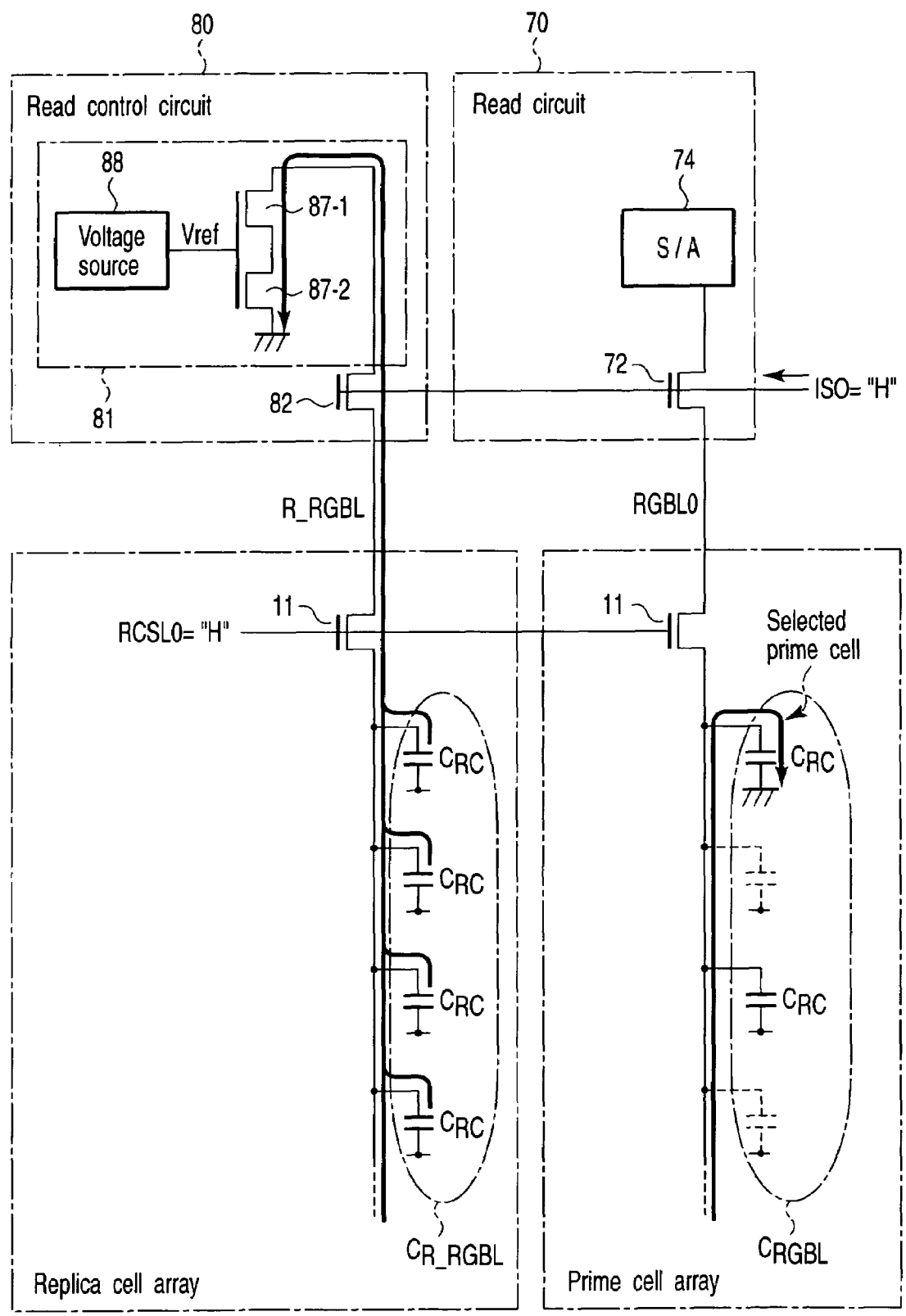
FIG. 47 is a circuit diagram of the memory cell array, read circuit, and read control circuit in the 2Tr flash memory according to the first embodiment of the present invention during bit line precharge.

However, with the above configuration, reading data from the prime cells is finished after the replica read global bit line starts being discharged and before the potential across the replica read global bit line lowers to Vth. By this time, the potential across the read global bit line has already reliably decreased below Vth. Consequently, the read data can be precisely determined. This will be described with reference to FIG. 47. FIG. 47 is a schematic circuit diagram of the prime cell array PCA, replica cell array RCA, read circuit 70, and read control circuit 80 during precharging.

The selected prime cells PC discharge the read global bit line RGBL. The discharge circuit 81 discharges the replica read global bit line R_RGBL. The current source circuit 87 in the discharge circuit 81 has the same configuration as that of the memory cells. Accordingly, the current source circuit 87 has the same discharge capability as that of the memory cells. Therefore, the time required for precharging depends on the parasitic capacities present on the read global bit line RGBL and replica read global bit line R_RGBL. A larger parasitic capacitance results in a longer discharge time.

As previously described, the capacitance $C_{R\_RGBL}$ is larger than the parasitic capacitance $C_{RGBL}$. Consequently, the time required to discharge the replica read global bit line R_RGBL is longer than that required to discharge the read global bit line RGBL.

The signal processor 84 generates a read end signal Read-end on the basis of the potential across the replica read global bit line R_RGBL. More specifically, the read end signal Read-end is asserted after the potential across the replica read global bit line R_RGBL has decrease below the data determination threshold voltage Vth for the sense amplifier 74. In other words, the read end signal Read-end is not asserted until the potential across the bit line (replica read global bit line R_RGBL) requiring the longest time for discharging has decreased below VTh. Accordingly, by the time when the read end signal Read-end is asserted, the following potentials have already decreased below Vth: the potentials across the replica read global bit lines and all the read global bit lines to which the selected prime cells retaining the binary 1 are connected. In this manner, the read end signal Read-end can be asserted after the potential across the bit line from which the binary 1 has been read has reliably decreased below Vth.

(2) Data Read Accuracy can be Improved (Part II)

In the above configuration, the replica select gate lines RSG are separated from the select gate lines and connected to the p-type well region 202. For the read operation, all the replica select gate lines RSG are set to 0 V. Accordingly, all the replica cells RC are off during the read operation. This configuration can prevent the replica cells RD from being used to discharge the replica read global bit line R_RGBL.

If the replica cells RC are used for discharging as in the case of the prior art, then naturally, the current supply capability available for discharging depends on the threshold voltage for the replica cells. The threshold voltage is determined by the rate of electrons injected into the floating gates. Consequently, in this case, disturbance may change the threshold voltage for the replica cells and thus the current supply capabilities of the replica cells available for discharging. This makes it difficult to always discharge the replica read global bit line R_RGBL at a fixed voltage change rate.

However, the present example of configuration can solve the above problem by avoiding using the replica cells for discharging. Instead, the current source circuit 87 discharges the replica read global bit line R_RGBL. Although the current source circuit 87 has the same configuration as that of the replica cells RC, the gate voltage is applied to its floating gate. Consequently, the current source circuit 87 can discharge the replica read global bit line R_RGBL at a fixed voltage change rate without being affected by the disturbance, which occurs with the replica cells RC. This serves to increase the data read accuracy.

(3) Data Read Speed can be Improved

In addition to (1), the data read speed can be improved. This will be described with reference to FIG. 45 again. In the example in FIG. 45, precharging is carried out until the potential across the read global bit line RGBL substantially reaches VDD. Further, discharging is carried out until the potential across the read global bit line RGBL reaches 0 V. However, the effect (1) can also be produced by ending precharging and discharging at the times t3 and t6, respectively, in FIG. 45. Specifically, even when precharging is ended at time t3, the potential across the read global bit line RGBL is higher than Vth at this time. Even when discharging is ended at time t6, the potential across the read global bit line RGBL is lower than Vth at this time. Accordingly, a precise read operation can also be performed by selecting the select gate to start discharging at time t3 and ending discharging to establish read data at time t6. That is, no margins need to be provided for the precharge and discharge periods. This makes it possible to greatly improve the read operation.

(4) Effects (1) to (3) are Obtained without the Need to Complicate the Manufacturing Process.

The above configuration is provided with the replica cell array RCA and the read control circuit 80. However, the replica cell array RCA has almost the same configuration as that of the prime cell array PCA. The second precharge circuit 83 in the read control circuit 80 has the same configuration as that of the first precharge circuit 73 in the read control circuit 70. Moreover, the current source circuit 87 in the read control circuit 80 has almost the same configuration as that of the memory cell array 10. Consequently, the replica cell array RCA and the read control circuit 80 can be manufactured during the same process as that in which the prime cell array PCA and the read circuit 70 are manufactured. Therefore, the above effects can be produced without the need to complicate the manufacturing process.

Further, the current source circuit 87 in the discharge circuit 81 has only to have two MOS transistors in order to provide sufficient functions. However, this may result in an isolated pattern to degrade the reliability of lithography. Accordingly, as described with reference to FIG. 31, the current source circuit 87 is desirably formed of a plurality of MOS transistors including dummy MOS transistors. Alternatively, since the current source circuit 87 is configured almost similarly to the memory cell array 10, it may be placed inside the memory cell array 10.

(5) Erroneous Write Operations can be Suppressed Without Reducing Write Speed.

In the above configuration, the flash memory 3 comprises the select circuit 51 provided for each bit line. The particular voltage is applied to the bit line depending on the data retained in the latch circuit 61. For the 0 write operation (selected bit line), the negative write voltage VNEGPRG (VBB1) is applied to the bit line via the current path in the MOS transistor 53. On the other hand, for the 1 write operation (unselected bit line), the write inhibition voltage VPI is applied to the bit line via the current path in the MOS transistor 52. The voltage generator 130 can vary the voltage value of the write inhibition voltage VPI. In the description of the above example of configuration, VBB2 or VBB3 is used as the write inhibition voltage VPI. VBB3 may have a larger or smaller value than VBB2. One of VBB2 and VBB3 which is optimum for prevention of erroneous write operations is provided as the write inhibition voltage VPI.

For example, when both lower and higher power supply voltages of the latch circuit 63 are set at negative values, a forward bias is applied to between the semiconductor substrate and the n-type well region of the p channel MOS transistor forming the inverter. This makes circuit operations unstable. However, the present example of configuration uses the select circuit 51, including the two n channel MOS transistors 52 and 53, formed on the same p-type well region. Thus, the select circuit 51 enables VNEGPRG and VPI, both of which may become negative, to be applied to the bit line.

This eliminates the need to vary another voltage, for example, the potential across the word line, in order to prevent erroneous write operations as in the prior art. Erroneous write operations can be suppressed by selecting either VBB2 or VBB3 as a write inhibition voltage and setting the optimum value for the write inhibition voltage.

Consequently, erroneous write operations can be suppressed without reducing the write speed. Further, the write inhibition voltage VPI can be varied among a plurality of values. This increases the degree of freedom in circuit configuration (6) Write Operation can be Simplified.

The above configuration initializes the data in the latch circuit 51 during the initial operation before the write or erase operation. This makes the input to and an output from the latch circuit 51 to the low and high levels, respectively.

During the data latch operation, the MOS transistor 101 is provided with 0 V for the 0 write operation (selected bit line) and with 3 V for the 1 write operation (unselected bit line). However, the MOS transistor 101 is brought into the cutoff state for the 0 write operation. Consequently, externally provided binary 0 is not actually transferred to the latch circuit 61. That is, the data in the latch circuit 61 is invariable. On the other hand, for the 1 write operation, the binary 1 is transferred to the latch circuit 61 via the current path in the MOS transistor 101.

That is, as shown in FIG. 36, the present example of configuration performs the initial operation to initialize the data in the latch circuit 61. For the 0 write operation (selected bit line), the select circuit 51 applies the write voltage VNEGPRG to the selected bit line on the basis of the initialized data. On the other hand, for the 1 write operation (unselected bit lines), the select circuit 51 applies the write inhibition voltage VPI to the unselected bit lines on the basis of externally input data instead of the initialized data.

Accordingly, the expression "the latch circuit 51 is initialized during the initial operation" can be changed to the expression "the binary 0 is input to all the latch circuits". For the data write operation, external data may be input only if the binary 1 is written, that is, only if no electrons are injected into the floating gates, in other words, only for the unselected bit lines. No external data need be input if the binary 0 is written, that is, if electrons are injected into the floating gates, in other words, for the selected bit line. This makes it possible to simplify the write operation.

(7) Control of the Flash Memory can be Simplified.

In the above configuration, only the p channel MOS transistor 101 forms the transfer gate that transfers externally input write data to the latch circuit 61. This transfer gate enables circuit area to be reduced compared to the transfer gate formed of a combination of an n channel MOS transistor and a p channel MOS transistor. Moreover, the gate of the p channel MOS transistor has only to be always set at the ground potential. The gate potential need not be controlled. This enables the simplification of control of the flash memory.

(8) Operation Speed of the Flash Memory can be Improved.

In the above configuration, the bit lines are hierarchical and include local bit lines and global bit lines (read global bit lines and write global bit lines). Specifically, a plurality of memory cells are connected to each of a plurality of local bit lines. A plurality of local bit lines are connected to each of the plurality of global bit lines. In the example in FIG. 3, 2(m−1) local bit lines (LBL0 and LBL1 or LBL2 or LBL3) are connected to one write global bit line WGBL via the first column selector WCS. Four memory cells are connected to each local bit line LBL. Further, 4(m−1) local bit lines (LBL0 to LBL3) are connected to one read global bit line RGBL via the second column selector RCS. Four memory cells are connected to each local bit line LBL.

For the write operation, only the local bit line LBL connected to the selected memory cells is connected to the write global bit line WGBL. The first column selector WCS electrically separates the local bit lines LBL to which the selected memory cells are not selected, from the write global bit lines WGBL. Accordingly, one write global bit line WGBL views only one local bit line containing the selected memory cells, that is, the four memory cells. Consequently, only these four memory cells MC contribute to the parasitic capacitance present on the write global bit line. The parasitic capacitance of the write global bit line is not contributed to by the unselected memory cells located on the same row as the selected memory cells and connected to the local bit lines LBL different from the one containing the selected memory cells. It is thus possible to sharply reduce the parasitic capacitance of the write global bit line. This also applies to the read operation.

As described above, it is possible to reduce the parasitic capacities of the write global bit line and read global bit line to improve the operation speed of the flash memory.

(9) Read Speed can be Improved.

The flash memory must handle relatively high voltages such as VPP, VBB1, and VBB2 during the write operation. To meet this request, MOS transistors must be used which have a thick gate insulating film and which can withstand high voltages. In contrast, the voltages handled during the read operation are lower than those used during the write operation. Therefore, in view only of the read operation, it is desirable to use low withstand-voltage MOS transistors having a thin gate insulating film. Also in terms of the operation speed, low withstand-voltage MOS transistors are desirably used.

In this regard, in the above configuration, each local bit line is connected to the corresponding write global bit line and read global bit line. The memory cells are connected to the write circuit 60 Via the write global bit lines and to the read circuit 70 Via the read global bit lines. That is, the signal path for the write operation is different from that for the read operation. Therefore, in the signal path for the read operation, transistors with a thin insulating film can be used to form all the circuits except the second column selector RCS, which connects the read global bit lines to the local bit lines. As a result, the read operation speed can be improved.

(10) Reliability of Write Operations can be Improved.

As described above in (8), the bit lines are hierarchical. When the write path is focused on, a plurality of local bit lines are connected to one write global bit line. For the write operation, only one local bit line containing the selected memory cells is electrically connected to the write global bit lines. The other local bit lines are electrically separated from the write global bit lines. Consequently, the voltage corresponding to the write data is not applied to the local bit lines to which the selected memory cells are not connected. This effectively prevents the data from being erroneously written to the memory cells connected to these local bit lines. Therefore, the reliability of the write operation can be improved.

Figure 48:
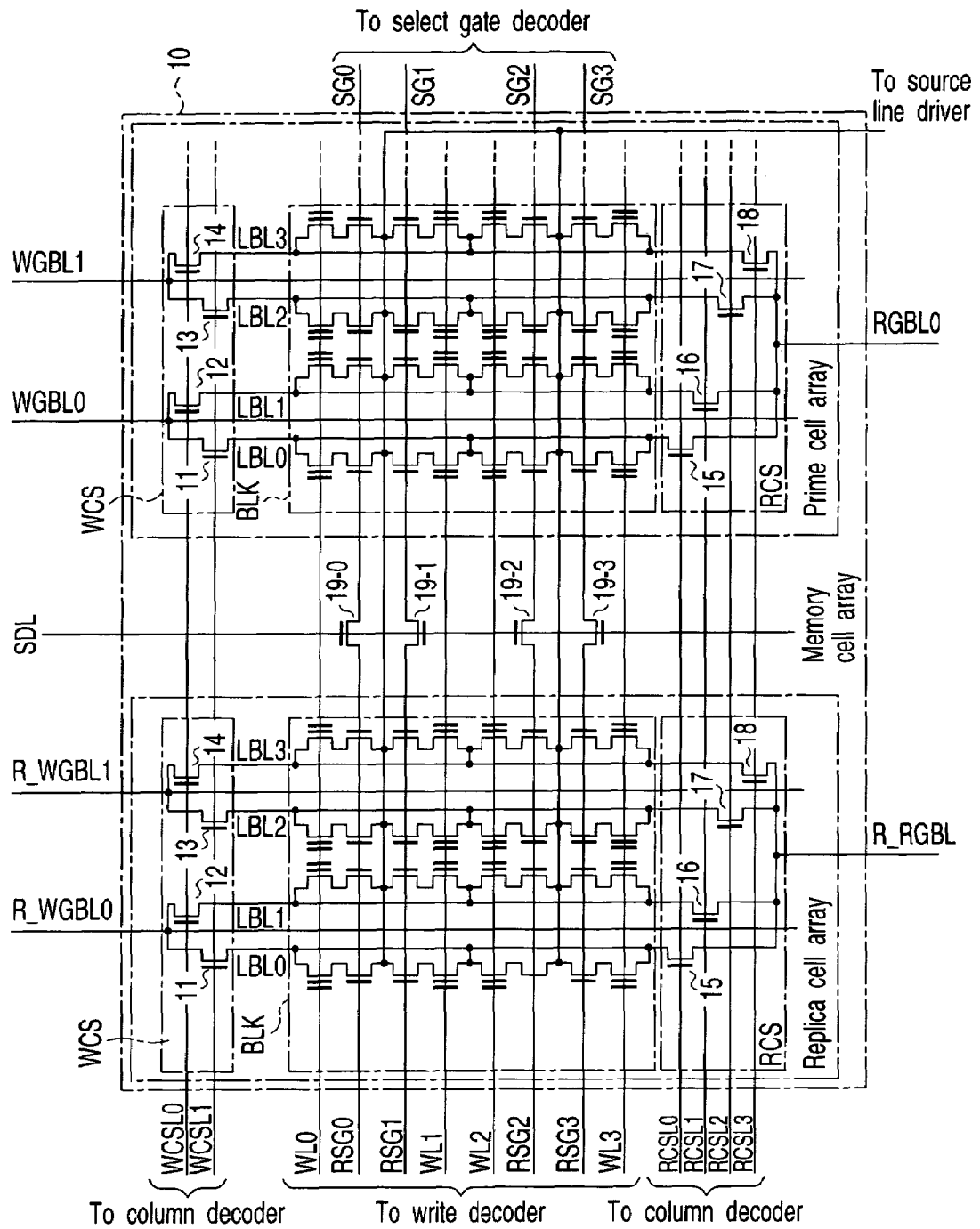
FIG. 48 is a circuit diagram of a memory cell array in the 2Tr flash memory according to the second embodiment of the present invention.
Figure 49:
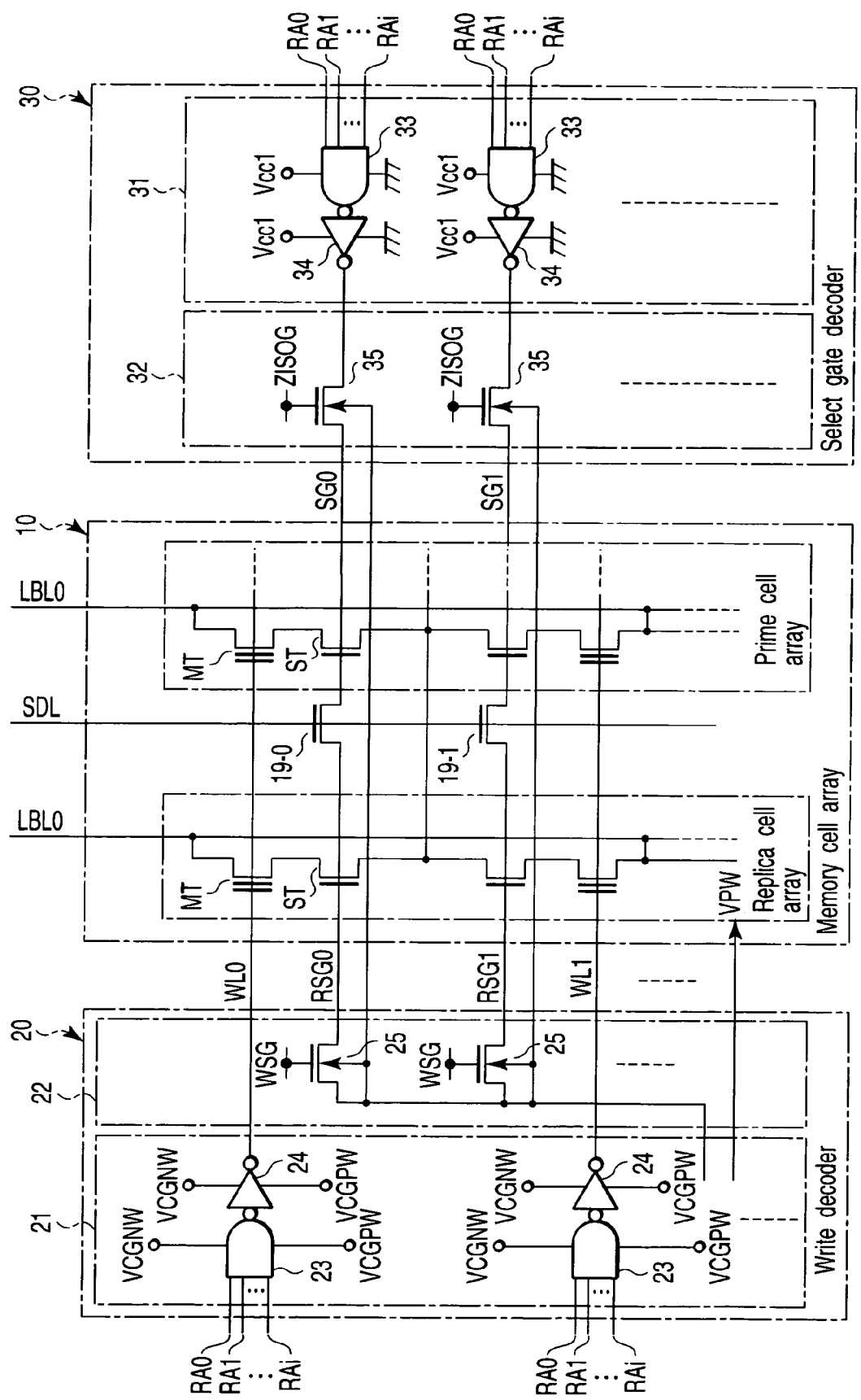
FIG. 49 is a circuit diagram of a memory cell array, a write decoder, and a select decoder provided in the 2Tr flash memory according to the second embodiment of the present invention.

Now, description will be given of a semiconductor storage device according to a second embodiment of the present invention. The present embodiment corresponds to the first embodiment in which MOS transistors switch between the select gate lines and the replica select gate line. The configuration of all the components except the memory cell array is similar to that in the first embodiment. Accordingly, its description is omitted. FIG. 48 is a circuit diagram of the memory cell array 10 provided in the 2Tr flash memory according to the present embodiment. FIG. 49 is a circuit diagram of the memory cell array 10, write decoder 20, and select gate decoder 30.

As shown in the figures, the memory cell array 10 according to the present embodiment corresponds to the configuration described in the first embodiment and which is varied as described below.

(1) MOS transistors 19-0 to 19-(4m−1) are provided between the prime cell array PCA and the replica cell array RCA in association with the select gate lines SG0 to SG(4m−1), respectively.

(2) One end of each of the select gate lines SG0 to SG(4m−1) is connected to the select gate decoder 30. The other end is connected to one end of the current path in the corresponding one of the MOS transistors 19-0 to 19-(4m−1).

(3) One end of each of the replica select gate lines RSG0 to RSG(4m−1) is connected to the write decoder 20. The other end is connected to the other end of the current path in the corresponding one of the MOS transistors 19-0 to 19-(4m−1).

(4) Gates of the MOS transistors 19-0 to 19-(4m−1) are all connected to a select dummy line SDL.

Figure 50:
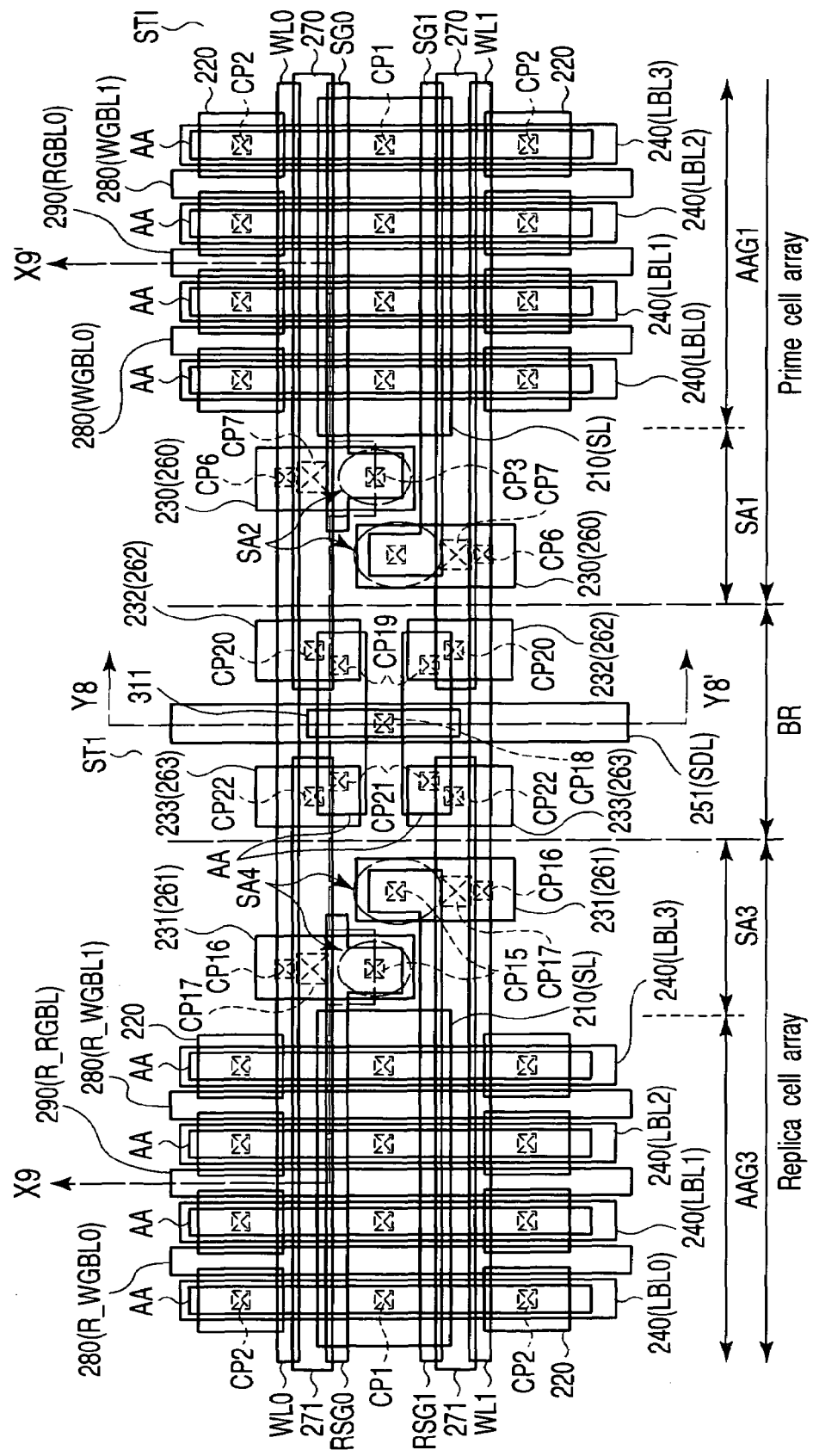
FIG. 50 is a plan view of the memory cell array provided in the 2Tr flash memory according to the second embodiment of the present invention.

Now, with reference to FIG. 50, description will be given of the planar structure of the memory cell array 10 according to the present embodiment. FIG. 50 is a plan view of a particular region of the memory cell array 10.

As shown in the figures, the internal configuration of the prime cell array PCA is similar to that in the first embodiment. The configuration of the third element region group AAG3 in the replica cell array RCA is also similar to that in the first embodiment. The stitch region SA3 in the replica cell array RCA is different from that in the first embodiment. The stitch region SA3 in the replica cell array RCA has the same configuration as that of the stitch region SA1 in the prime cell array PCA. The shunt interconnect 270 in the first embodiment is separated into two parts at the boundary between the prime cell array PCA and the replica cell array RCA. The separated part in the replica cell array functions as a shunt interconnect 271 for the replica select gate lines RSG0 to RSG(4m−1). The boundary between the prime cell array PCA and the replica cell array RCA will be called a boundary region BR.

Now, the boundary region BR will be described. In the boundary region BR, the select gate lines SG0 to SG(4m−1) and the replica select gate lines RSG0 to RSG(4m−1) are removed. On the other hand, the word lines WL0 to WL(4m−1) pass through the boundary region BR. The corresponding MOS transistors 19-0 to 19-(4m−1) are formed in the region where the select gate lines SG0 to SG(4m−1) and the replica select gate lines RSG0 to RSG(4m−1) are removed. That is, the element regions AA are formed in which the longitudinal direction extends along the second direction. A stripe-shaped gate electrode 311 extending along the first direction is formed so as to stride two adjacent regions sandwiched by two word lines. The gate electrode 311 is connected to a stripe-shaped metal interconnect layer 251 extending along the first direction. The metal interconnect layer 251 functions as a select dummy line SDL.

One of source and drain of each of the MOS transistors 19-0 to 19-(4m−1) connects, via contact plugs CP19 and CP20 and metal interconnect layers 232 and 262, to the shunt interconnect 270 of the corresponding one of the select gate lines SG0 to SG(4m−1). Moreover, the other of source and drain of each of the MOS transistors 19-0 to 19-(4m−1) connects, via contact plugs CP21 and CP22 and metal interconnect layers 233 and 263, to the shunt interconnect 271 of the corresponding one of the replica select gate lines RSG0 to RSG(4m−1).

Figure 51:
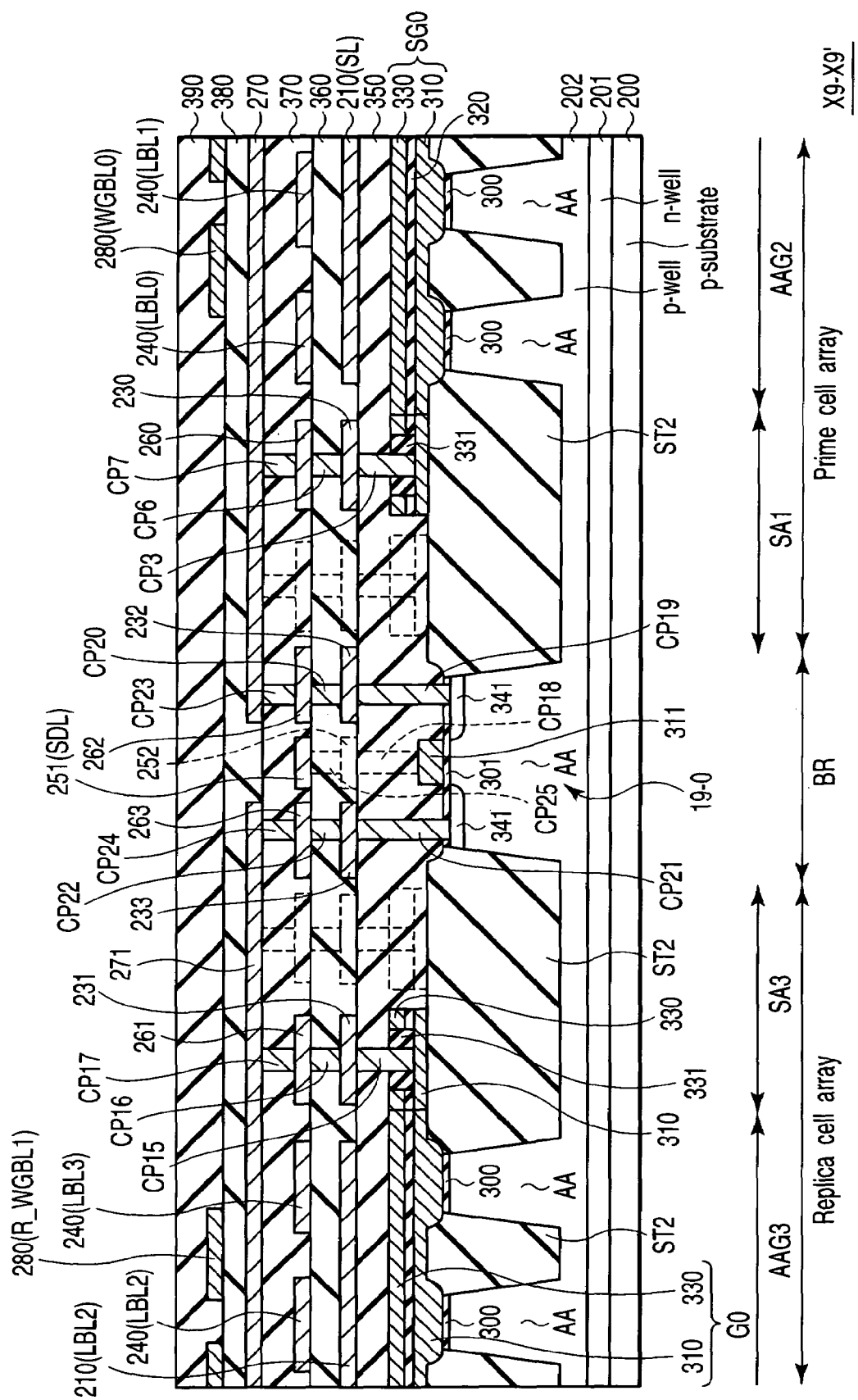
FIG. 51 is a sectional view taken along line X9-X9' in FIG. 50.
Figure 52:
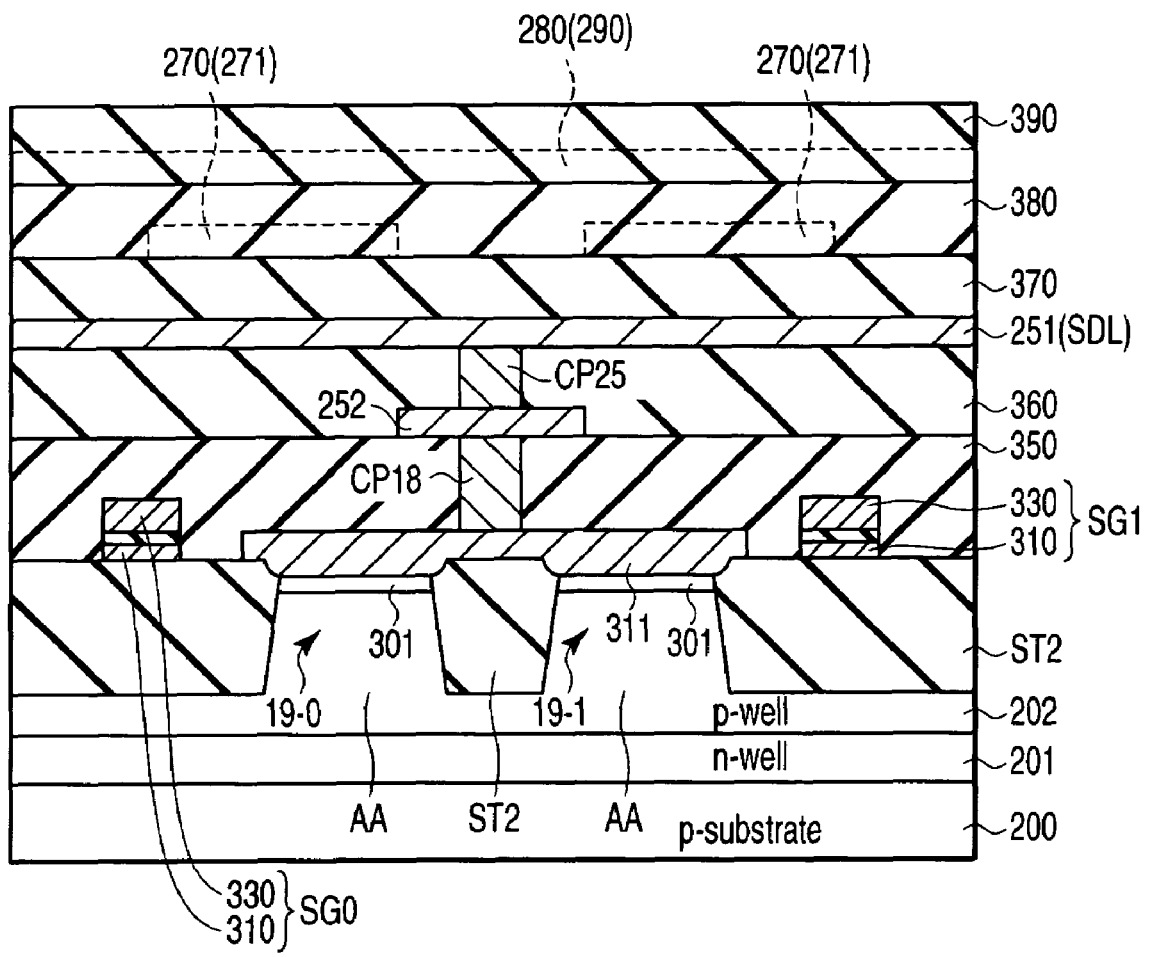
FIG. 52 is a sectional view taken along line X8-X8' in FIG. 50.

Now, description will be given of the sectional structure of the memory cell array 10 configured as described above. FIGS. 51 and 52 are sectional views taken along lines X9-X9' and Y8-Y8' in FIG. 50.

As shown in the figure, the configuration of the prime cell array PCA is similar to that in the first embodiment, so that its description is omitted. Further, the configuration of the third element region group AAG3 in the replica cell array RCA is the same as that in the first embodiment except that the shunt interconnect 270 is replaced with the shunt interconnect 271. Accordingly, its description is omitted. Now, the stitch region SA3 in the replica cell array RCS will be described.

As shown in the figures, the stitch region SA3 has a configuration similar to that of the stitch region SA1. That is, the isolation region STI is formed in the p-type well region 202. The polycrystalline silicon layers 310 and 330 are drawn out to the isolation region STI; the polycrystalline silicon layers 310 and 330 constitute the replica select gate line RSG. In the shunt region SA4, the polycrystalline silicon layer 330 and the inter-gate insulating film 320 are removed to expose the polycrystalline silicon layer 310. The contact plug CP15 is formed in contact with the polycrystalline silicon layer 310 in this region. The contact plug CP15 is electrically separated from the polycrystalline silicon layer 330 by the insulating film 331. The contact plug CP15 is formed so as to extend from the surface of the inter-level insulating film 350 to the polycrystalline silicon layer 310.

The metal interconnect layer 231 and the inter-level insulating film 360 are formed on the inter-level insulating film 350. The metal interconnect layer 231 is provided for each contact plug CP15 and connected to the corresponding contact plug CP15. A contact plug 16 is formed in the inter-level insulating film 360. The contact CP16 is provided for each metal interconnect layer 360 and connected to the corresponding metal interconnect layer 231.

The metal interconnect layer 261 and the inter-level insulating film 370 are formed on the inter-level insulating film 360. The metal interconnect layer 261 is provided for each contact plug CP16 and connected to the corresponding contact plug CP16. A contact plug 17 is formed in the inter-level insulating film 370. The contact CP17 is provided for each metal interconnect layer 261 and connected to the corresponding metal interconnect layer 261.

The metal interconnect layer 271 is formed on the inter-level insulating film 370; the metal interconnect layer 271 functions as the shunt interconnect of the replica select gate line RSG. The metal interconnect layer 271 is connected to the corresponding contact plug CP17. The structure of the shunt region. SA4 is the same as the configuration shown in FIG. 27.

Now, the sectional structure of the boundary region RB will be described. As shown in FIGS. 51 and 52, the MOS transistors 19-0 to 19-(4m−1) are formed on the p-type well region 202 in the boundary region BR. That is, impurity diffusion layers 341 functioning as a source and a drain are formed in the surface region of the p-type well region 202. The gate electrode (polycrystalline silicon layer) 301 is formed on the p-type well region 202 between the source and drain via the gate insulating film 301. The contact plugs CP19 and CP21 are formed in the inter-level insulating film 350 for each of the MOS transistors 19-0 to 19-(4m−1). The metal interconnect layers 232 and 233 are formed on the inter-level insulating film 350 for the contact plugs CP19 and CP21, respectively. The contact plugs CP20 and CP22 are formed in the inter-level insulating film 360 for metal interconnect layers 232 and 233, respectively. The metal interconnect layers 262 and 263 are formed on the inter-level insulating film 360 for the contact plugs CP20 and CP22, respectively. Contact plugs CP23 and CP24 are formed in the inter-level insulating film 360 for metal interconnect layers 262 and 263, respectively.

One of source and drain of each of the MOS transistors 19-0 to 19-(4m−1) is connected, via the contact plugs CP19, CP20, and CP23 and metal interconnect layers 232 and 262, to the shunt interconnect 270 of the corresponding one of the select gate lines SG0 to SG(4m−1). The other of source and drain of each of the MOS transistors 19-0 to 19-(4m−1) is connected, via the contact plugs CP21, CP22, and CP24 and metal interconnect layers 233 and 263, to the shunt interconnect 271 of the corresponding one of the replica select gate lines RSG0 to RSG(4m−1).

As described above, in the boundary region RB, the shunt interconnect 270 of each of the select gate lines SG0 to SG(4m−1) is connected to the shunt interconnect 271 of the corresponding one of the replica select gate lines RSG0 to RSG(4m−1) via the current path in the corresponding one of the MOS transistors 19-0 to 19-(4m−1). The shunt interconnect 270 is connected to the select gate decoder 30. The shunt interconnect 271 is connected to the write decoder 20.

Figure 55:
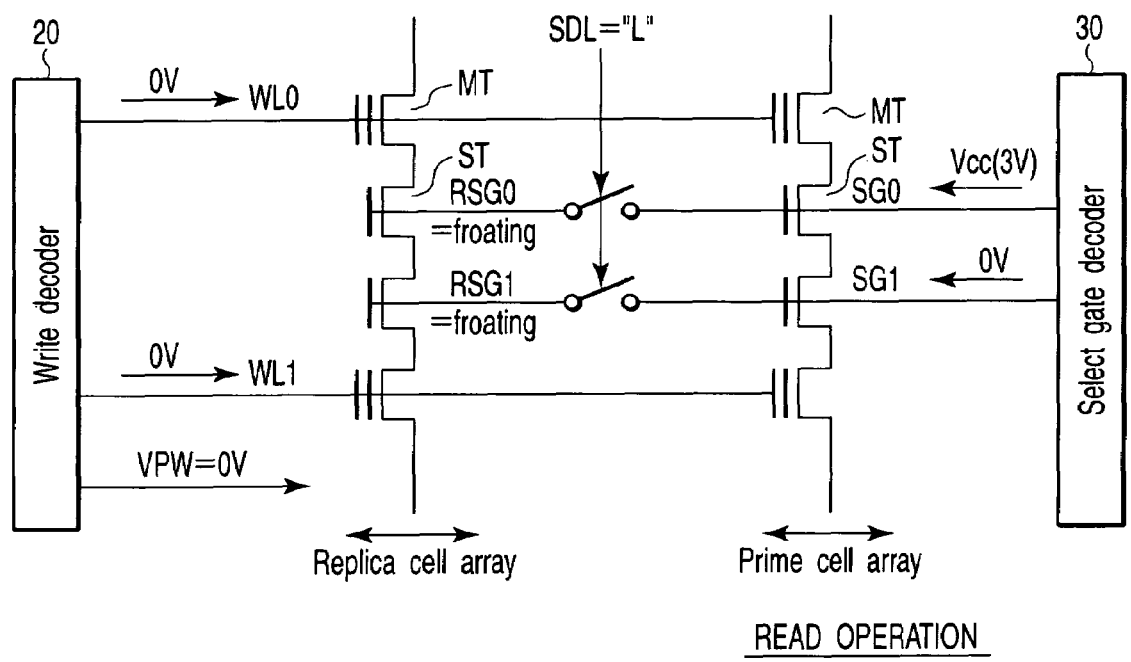
FIG. 55 is a circuit diagram of the memory cell array, the write decoder, and the select gate decoder during a read operation of the 2Tr flash memory according to the second embodiment of the present invention.

Now, description will be given of operations of the 2Tr flash memory 3 according to the present embodiment. The basic operation of the 2Tr flash memory 3 id similar to those in the first embodiment. Thus, in this case, the write, erase, and read operations will be described by focusing on the MOS transistors 19-0 to 19-(4m−1). FIGS. 53 to 55 are circuit diagrams showing how the write, erase, and read operations, respectively, are performed.

<Write Operation>

First, the write operation will be described with reference to FIG. 53. As shown the figure, for the write operation, the select dummy line SDL is made high (for example, Vcc=3 V or 0 V). Consequently, the MOS transistors 19-0 to 19-(4m−1) are turned on to electrically connect the select gate lines SG0 to SG(4m−1) to the replica select gate lines RSG0 to RSG(4m−1), respectively.

Then, the writing decode 20 provides the negative voltage VBB1 to the replica select gate lines RSG0 to RSG(4m−1) and to the select gate lines SG0 to SG(4m−1).

<Erase Operation>

Now, the erase operation will be described with reference to FIG. 54. As shown in the figure, for the erase operation, the select dummy line SDL is also made high (>VPP). Consequently, the MOS transistors 19-0 to 19-(4m−1) are turned on to electrically connect the select gate lines SG0 to SG(4m−1) to the replica select gate lines RSG0 to RSG (4m−1), respectively.

Then, the writing decode 20 provides the positive voltage VBB to the replica select gate lines RSG0 to RSG(4m−1) and to the select gate lines SG0 to SG(4m−1).

<Read Operation>

Now, the read operation will be described with reference to FIG. 55. As shown in the figure, for the read operation, the select dummy line SDL is also made low (for example, 0 V or the negative potential VBB1). Consequently, the MOS transistors 19-0 to 19-(4m−1) are turned off to electrically separate the select gate lines SG0 to SG(4m−1) from the replica select gate lines RSG0 to RSG(4m−1), respectively.

The select gate decoder 30 applies the positive voltage Vcc1 to the selected select gate line SG0. The select gate decoder 30 provides the unselected select gate lines SG1 to SG(4m−1) with 0 V. On the other hand, the replica select gate lines RSG0 to RSG(4m−1) float electrically. Consequently, the select transistor ST connected to the selected select gate line SG0 is turned on. The select transistors are turned off which are connected to the unselected select gate lines SG1 to SG(4m−1) and to all the replica select gate lines RSG0 top RSG(4m−1).

As described above, the configuration according to the present embodiment can perform operations similar to those of the first embodiment and produce the effects (1) to (10), described above. The MOS transistors 19-0 to 19-(4m−1) have only to be able to switch the connections between the select gate lines and the replica select gate lines. The manner of interconnections is not limited to the method of the present embodiment.

Now, description will be given of a semiconductor storage device and a method for controlling the semiconductor device according to the third embodiment of the present invention. The present embodiment relates to a method of controlling the parasitic capacitance present on the replica global bit line R_RGBL according to the first or second embodiment.

Figure 56:
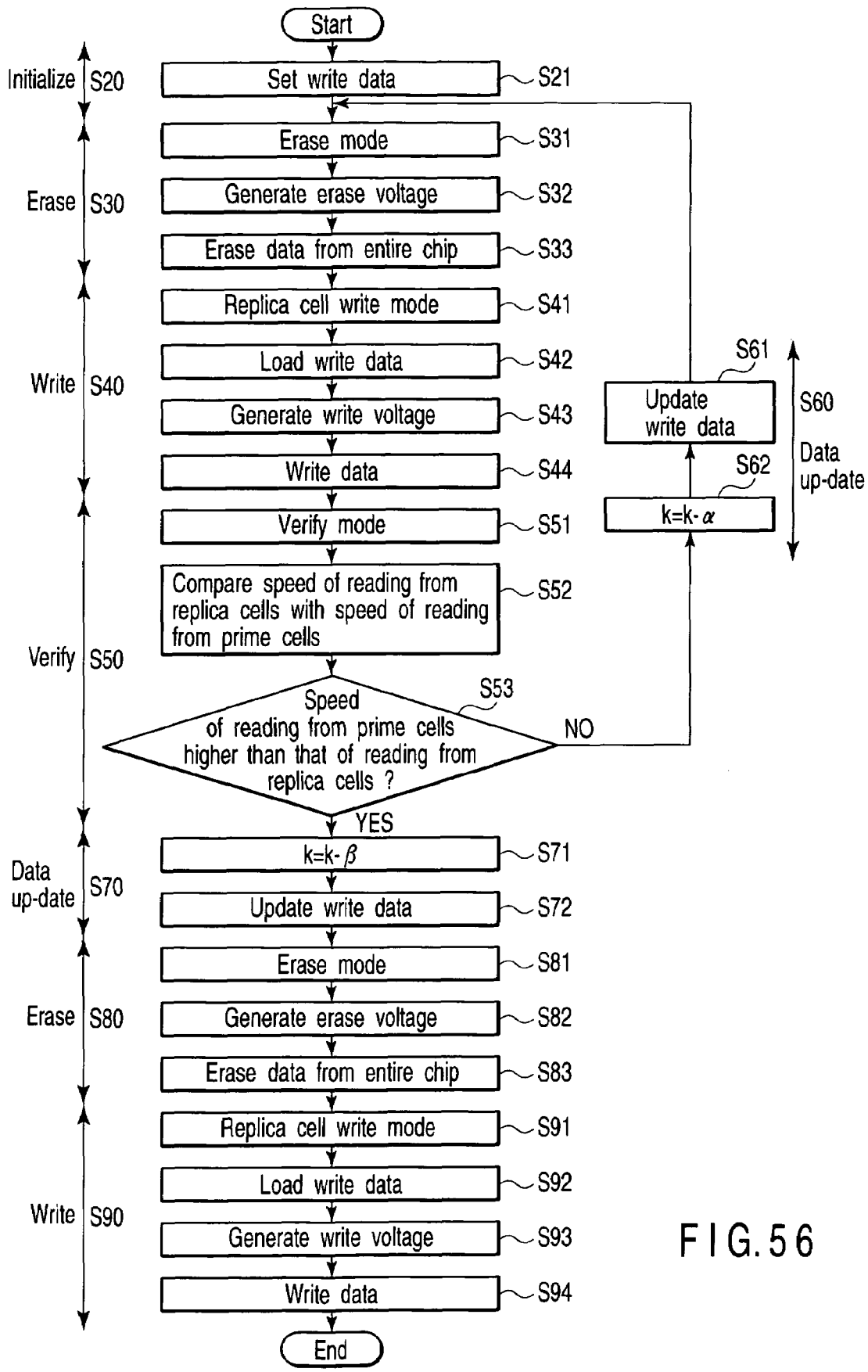
FIG. 56 is a flowchart of a control method in a 2Tr flash memory according to a third embodiment of the present invention.

In the first or second embodiment, the parasitic capacitance of each of the local bit lines LBL0 to LBL3 in the prime cell array PCA is smaller than that each of the local bit lines LBL0 to LBL3 in the replica cell array RCA. With reference to FIG. 56, description will be given of a method of setting the parasitic capacitance of each of the local bit lines in the replica cell array RCA. FIG. 56 is a flowchart of a method for setting the parasitic capacitance. The present method varies the number of memory cells in the replica cell array RCA which retain the binary 1.

As shown in the figures, the present method includes roughly eight steps listed below.

(1) Initialize (step S20)
(2) Erase (step S30)

(3) Write (step S40)
(4) Verify (step S50)

If a verify operation does not provide a predetermined result, the following step is executed.
(5) Data update (step S60) and if a repeated verify operation composed of (2) to (4) provides a predetermined result, the following steps are executed.
(6) Data update (step S70)
(7) Erase (step S80)
(8) Write (step S90)

These steps will be described in detail.

First, the write state machine 120 sets write data (step S21). In the present step, the "write data" indicates "the number of word lines in the replica cell array RCA to which the binary 0 is written. If the total number of word lines is l=(4m−1), the write state machine 120 sets, to (1/2), the total number k of word lines to which the binary 0 is written.

Then, the write state machine 120 changes to an erase mode (step S31). In accordance with an instruction from the write state machine 120, the voltage generator 130 generates a voltage required for the erase operation (step S32). The data in all the prime and replica cells are then erased (the binary 1 is written to the cells; step S33). As a result, the threshold voltages for the prime and replica cells become negative.

Then, the write state machine 120 changes to a write mode (step S41). The write state machine 120 then loads the write data set in step S21 (step S42). In accordance with an instruction from the write state machine 120, the voltage generator 130 generates a voltage required for the write operation (step S43). The binary 0 is written to those word lines the number of which corresponds to the write data loaded in step S42 (step S44). The write operation is as described in the first embodiment. However, in contrast to the normal write operation, no data is written to the prime cell array PCA. That is, the write inhibition voltage VPI is applied to all the write global bit lines. Only the replica cell array RCA is provided with the binary 0. The write operation is simultaneously performed on the replica cells RC connected to the plurality of word lines. That is, in FIG. 39, the positive voltage VPP is applied to the plurality of word lines. As a result, the threshold voltage for the replica cells RC connected to the k word lines changes to a positive value.

Then, the write state machine 120 changes to a verify mode (step S51). The write state machine 120 then reads the data from the prime cells PC and the replica cells RC. The write state machine 120 thus compares the speed of reading from the prime cells with that of reading from the replica cells TC (step S52). The read speed is, in FIG. 44, described in the first embodiment, the amount of time from time t6 when discharging is started or time t1 when precharging is started until time t7 when the potential across the read global bit line RGBL reaches Vth or until time t8 when the potential across the replica read global bit line R_RGBL reaches Vth.

If as a result step S52, the speed of reading from the prime cells PC is lower than that of reading from the replica cells RC (step S53), the parasitic capacitance of the replica read global bit line R_RGBL is smaller than that of the read global bit line RGBL. Accordingly, the settings must be changed so as to further increase the parasitic capacitance of the replica read global bit line R_RGBL. Thus, the write data is re-set so that k=k−α (α: an arbitrary integer). Then, steps S21 to S53 are repeated. That is, the data is erased from the entire chip, and then the number of word lines to which the binary 0 is written is reduced. Then, the data is written again.

If as a result step S52, the speed of reading from the prime cells PC is higher than that of reading from the replica cells RC (step S53), the parasitic capacitance of the replica read global bit line R_RGBL is larger than that of the read global bit line RGBL. That is, at this point in time, the conditions for the parasitic capacitance are met. In this case, to perform a more precise read operation, the data is written again so as to make a read margin.

First, the write data is re-set so that k=k−β (β: an arbitrary integer) (steps S71 and S72)

Then, the write state machine 120 changes to the erase mode (step S81). In accordance with an instruction from the write state machine 120, the voltage generator 130 generates a voltage required for the erase operation (step S82). The data is erased from all the prime and replica cells in the chip (the binary 1 is written; step S83).

Then, the write state machine 120 changes to the write mode (step S91). The write state machine 120 then loads the write data set in step S21 (step S92). In accordance with an instruction from the write state machine 120, the voltage generator 130 generates the voltage required for the write operation (step S93). The binary 0 is written to those word lines the number of which corresponds to the write data loaded in step S92 (step S94).

Consequently, the threshold voltage for the replica cells RC connected to the k word lines changes to a positive value. As a result, the parasitic capacitance of each of the local bit lines LBL0 to LBL3 in the prime cell array PCA is smaller than that each of the local bit lines LBL0 to LBL3 in the replica cell array RCA.

Figure 57:
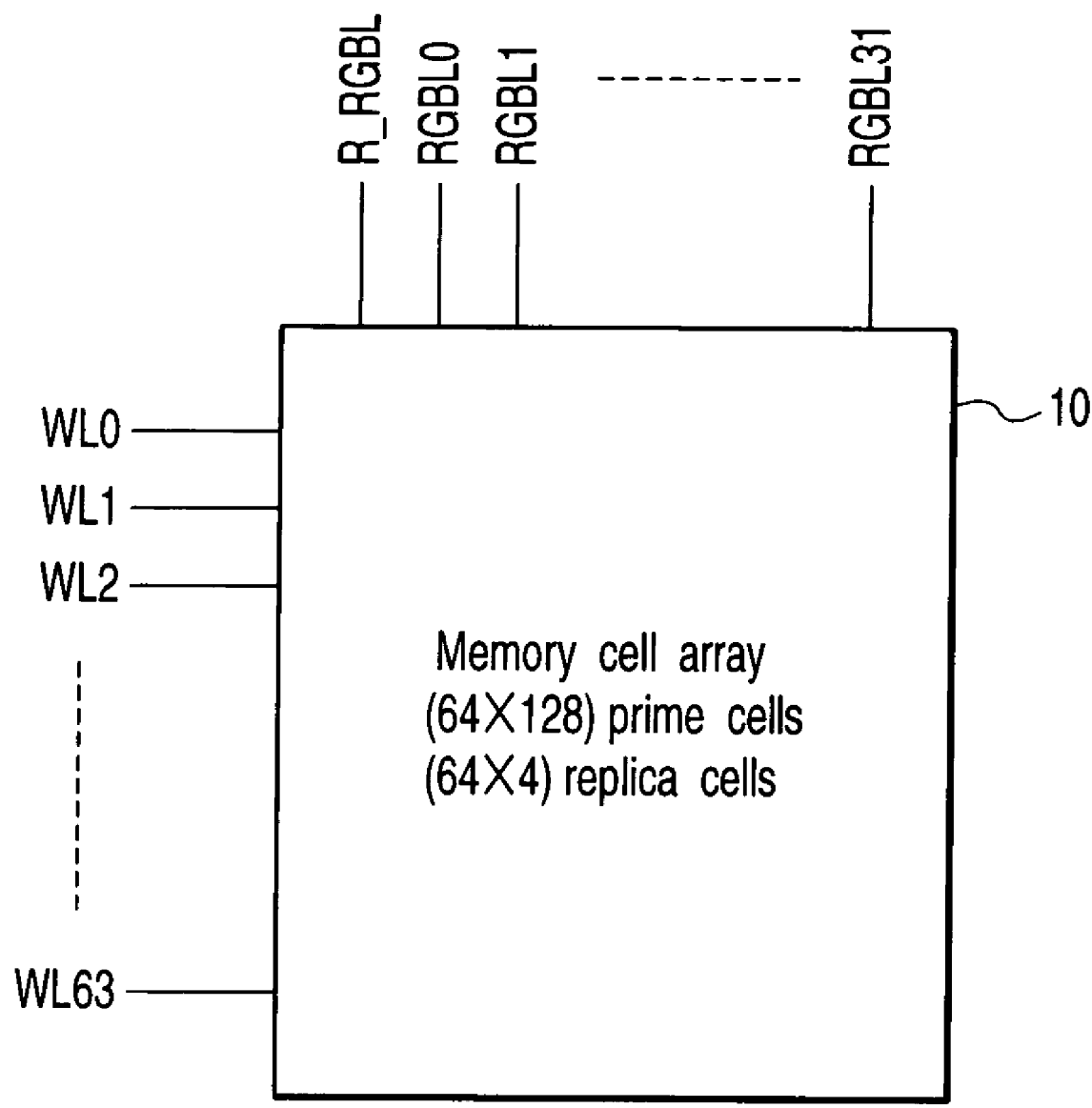
FIG. 57 is a block diagram of the memory cell array provided in the 2Tr flash memory according to the third embodiment of the present invention.
Figure 58:
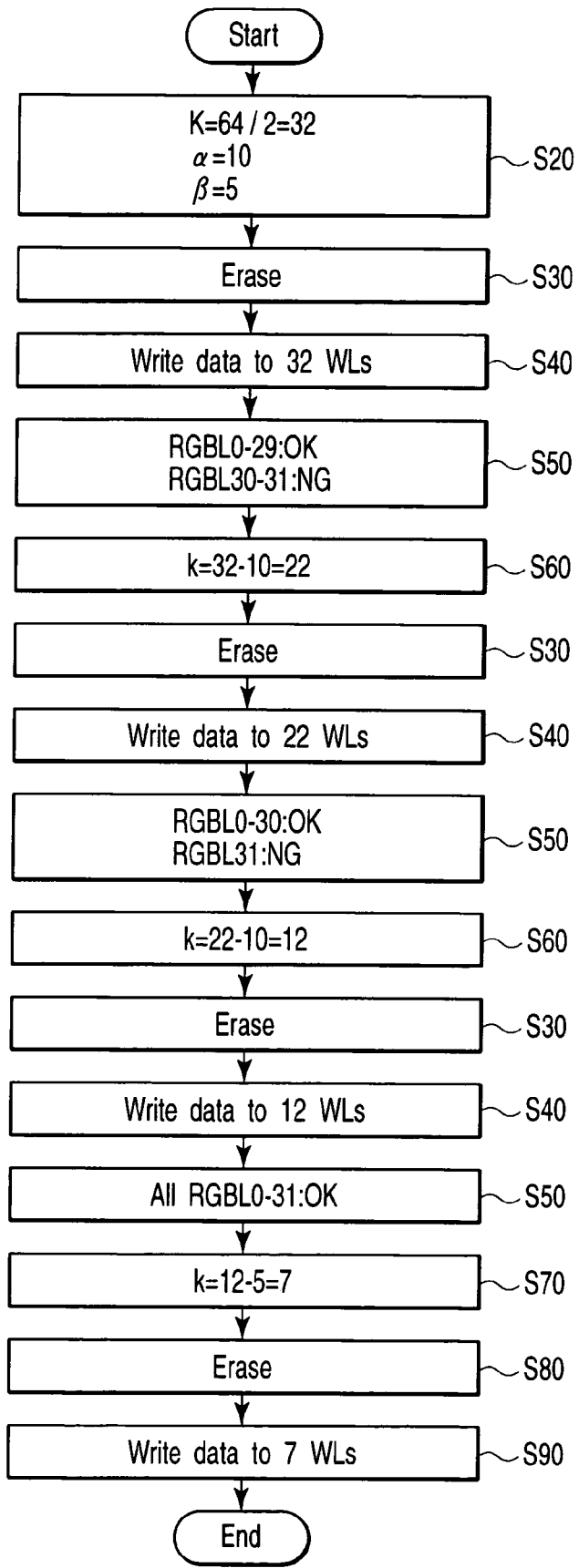
FIG. 58 is a flowchart of a control method in the 2Tr flash memory according to the third embodiment of the present invention.

The above method will be described in further detail with reference to FIGS. 57 and 58. FIG. 57 is a block diagram of the memory cell array. FIG. 58 is a flowchart of a method for setting the parasitic capacitance.

As shown in FIG. 57, the memory cell array 10 is assumed to have 64 word lines WL0 to WL63 (l=64) and 32 read global bit line RGBL0 to RGBL31.

First, the write state machine 120 sets the write data (initialize; step S20). Since the number of word lines is 64, k=64/2=32. The write state machine 120 further sets α and β at 10 and 5, respectively. The values of α and β are only illustrative. The present invention is not limited to these values.

The write state machine 120 erases all the data from the memory cell array 10 at a time (step S30). The write state machine 120 then writes the binary 1 to the replica cells RC connected to the 32 word lines. FIG. 59 is a time chart showing the potentials across the replica read global bit line R_RGBL and read global bit lines RGBL0 to RGBL31 obtained when the data is read from the prime cells PC and replica cells RC. As shown in the figure, the replica read global bit line R_RGBL changes from the precharge level to Vth at time t6. On the other hand, the read global bit line RGBL0 to RGBL29 changes from the precharge level to Vth at time t5, which is earlier than time t6. The read global bit lines RGBL30 and RGBL31 change from the precharge level to times t7 and t8, respectively, which are later than time t5. That is, the parasitic capacitance of the replica read global bit line R_RGBL is larger than that of the read global bit lines RGBL0 to RGBL29 but is smaller than those of the read global bit lines RGBL30 and RGBL31 (step S50). Therefore, the predetermined conditions have not been met yet.

Thus, the write state machine 120 re-sets the write data (step S60). That is, k=k−α=32−10=22.

The write state machine 120 then erases the data from the entire memory cell array 10 at a time (step S30). The write state machine 120 writes the binary 1 to the replica cells RC connected to 22 word lines. FIG. 60 is a time chart showing the potentials across the replica read global bit line R_RGBL and read global bit lines RGBL0 to RGBL31 obtained when the data is read from the prime cells PC and replica cells RC. As shown in the figure, not only the potential across the read global bit lines RGBL0 to RGBL29 but also the potential across the read global bit line RGBL30 reach Vth earlier than that across the replica read global bit line R_RGBL. However, the potential across the read global bit line RGBL31 reaches Vth later than that across the replica read global bit line R_RGBL. That is, the parasitic capacitance of the replica read global bit line R_RGBL is larger than those of the read global bit lines RGBL0 to RGBL30 but is smaller than that of the read global bit line RGBL31 (step S50). Therefore, the predetermined conditions have not been met yet.

Thus, the write state machine 120 re-sets the write data (step S60). That is, $k=k-\alpha=22-10=12$.

The write state machine 120 then erases the data from the entire memory cell array 10 at a time (step S30). The write state machine 120 writes the binary 1 to the replica cells RC connected to 12 word lines. FIG. 61 is a time chart showing the potentials across the replica read global bit line R_RGBL and read global bit lines RGBL0 to RGBL31 obtained when the data is read from the prime cells PC and replica cells RC. As shown in the figure, the potentials across all the read global bit lines RGBL0 to RGBL31 reach Vth earlier than that across the replica read global bit line R_RGBL. That is, the parasitic capacitance of the replica read global bit line R_RGBL is larger than those of the read global bit lines RGBL0 to RGBL31 (step S50). Therefore, at this point in time, the predetermined conditions are met for the first time.

Then, the write state machine 120 re-sets the write data (step S70). That is, $k=k-\beta=12-5=7$. The write state machine 120 then erases the data from the entire memory cell array 10 at a time (step S80). The write state machine 120 writes the binary 1 to the replica cells RC connected to seven word lines.

The setting of parasitic capacitance of the replica read global bit line R_RGBL is thus finished. When the read operation is performed in this state, the potentials across the read global bit lines RGBL0 to RGBL31 and replica read global bit line R_RGBL vary as shown in FIG. 62. That is, the data read operation is completed on all the read global bit lines RGBL0 to RGBL31 earlier than that shown in FIG. 61.

The above method can reduce the parasitic capacitance of each of the local bit lines LBL0 to LBL3 in the prime cell array PCA below that of each of the local bit lines LBL0 to LBL3 in the replica cell array RCA. In the description of the above embodiment, the parasitic capacitance in the replica cell array RCA is controlled on the basis of the number of replica cells RC to which the binary 1 is to be written. However, the parasitic capacitance in the replica cell array RCA can also be increased by bringing the replica cells into an over-erase state instead of using the number of replica cells RC.

Further, the above method allows the data corresponding to the parasitic capacitance in the prime cell array PCA to be considered to be written in the replica cell array. This eliminates the need for a fuse circuit and the like which are used to retain the data corresponding to the parasitic capacitance. It is thus possible to avoid an extra increase in chip area.

Figure 63:
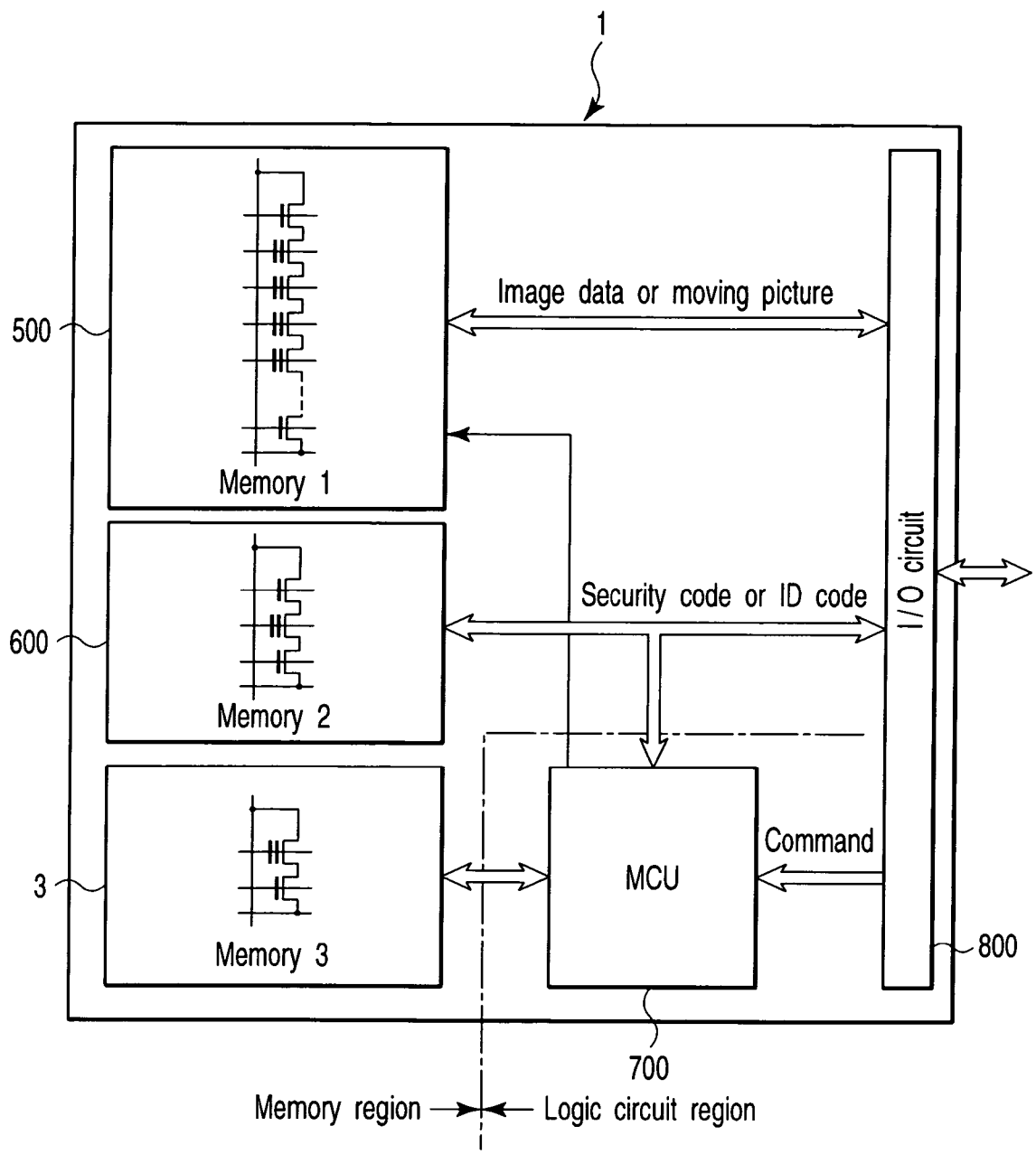
FIG. 63 is a block diagram of a system LSI according to a fourth embodiment of the present invention.

Now, description will be given of a semiconductor storage device according to a fourth embodiment of the present invention. The present embodiment is LSI in which the flash memory described in any of the first to third embodiments is mixed with other semiconductor chips on the same chip. FIG. 63 is a block diagram of a system LSI according to the present embodiment.

As shown in the figure, the system LSI 1 comprises a NAND type flash memory 500, a 3TR-NAND type flash memory 600, a 2Tr flash memory 3, MCU 700, and an I/O circuit 800 which are formed on the same semiconductor substrate.

The NAND type flash memory 500 is used as a storage memory to which image and video data are saved.

The 3Tr-NAND type flash memory 600 retains an ID code or a security code used to access LSI 1.

The 2Tr flash memory 3 retains program data used to operate MCU 700. The 2Tr flash memory 3 is as described in the first to third embodiments.

In response to various externally input commands, MCU 700 executes processing on the basis of a program read from the 2Tr flash memory 3. On this occasion, MCU 700 directly accesses the 2Tr flash memory 3 without using SRAM (Static Random Access Memory) or the like. Examples of processes executed by MCU 700 include compression and decompression of data input to the NAND type flash memory 500 and control of an external device. Moreover, if the data retained in the NAND type flash memory 500 is externally accessed, MCU 700 reads predetermined data from the 3TR-NAND type flash memory 600. MCU 700 then checks the read data against an externally input ID code or security code. If the read data matches the ID code or security code, MCU 700 permits an access to the NAND type flash memory 500. When the access to the NAND type flash memory 500 is permitted, the external device (host) accesses the data in the NAND type flash memory 500. That is, in response to an externally received command, MCU 700 triggers the NAND type flash memory 500 to perform a data read (write) operation.

The I/O circuit 800 controls transmissions to and receptions of signals between the LSI 1 and the external device.

Now, description will be given of the configuration of the three semiconductor memories 500, 600, and 3 contained in LSI 1.

<NAND Type Flash Memory>

Figure 64:
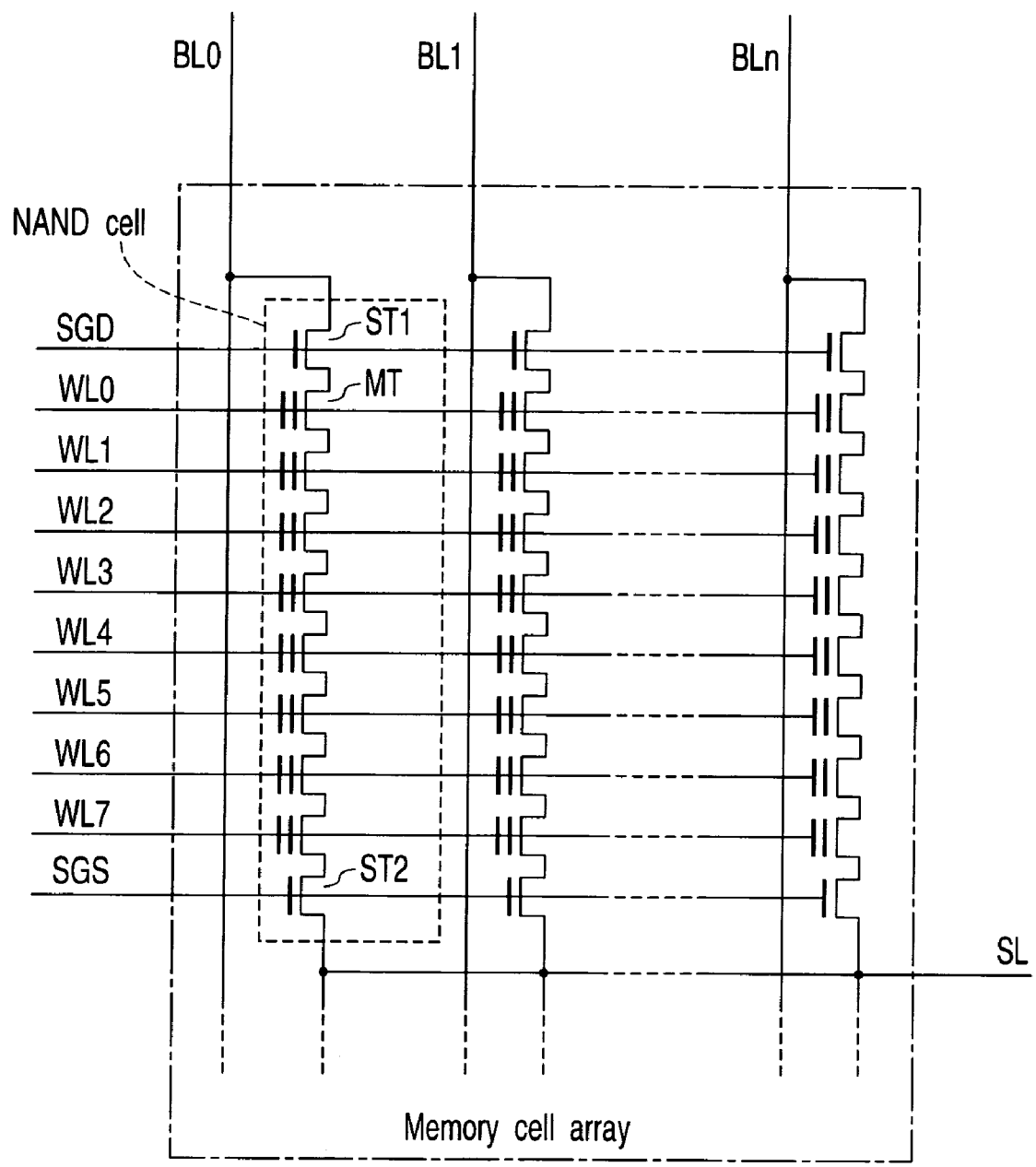
FIG. 64 is a circuit diagram of a memory cell array provided in a NAND type flash memory according to the fourth embodiment of the present invention.

FIG. 64 is a circuit diagram of a memory cell array provided in the NAND type flash memory 500. As shown in the figure, the memory cell array has a plurality of NAND cells arranged in a matrix. Each of the NAND cells includes eight memory cell transistors MT and select transistors ST1 and ST2. The memory cell transistor MT comprises a stacked gate structure having a floating gate formed on the semiconductor substrate via a gate insulating film and a control gate formed on the floating gate via an inter-gate insulating film. The number of memory cell transistors MT is not limited to eight, but 16 or 32 memory cell transistors may be used. The number is not limited. Adjacent memory cell transistors MT share a source and a drain. The memory cell transistors MT are arranged between the select transistors ST1 and ST2 so that their current paths are connected in series. A drain region of one end of the series connected memory cell transistors MT is connected to a source region of the select transistor ST1. A source region of the other end of the series connected memory cell transistors MT is connected to a drain region of the select transistor ST2.

The control gates of all the memory cell transistors MT on the same row are connected to one of the word lines WL0 to WLm. The gates of the select transistors ST1 and ST2 for the memory cells on the same row are connected to the select gate lines SGD and SGS, respectively. The word lines WL0 to WLm are connected to a row decoder (not shown). The drains of all the select transistors ST1 on the same column are connected to one of the bit lines BL0 to BLn. The bit lines BL0 to BLn are connected to a write circuit and a read circuit (not shown). The sources of all the select transistors ST2 are connected to the source line SL and to the source line driver. Not both select transistors ST1 and ST2 are required. Only one of the select transistors ST1 and ST2 may be selected provided that the corresponding NAND cell can be selected.

Figure 65:
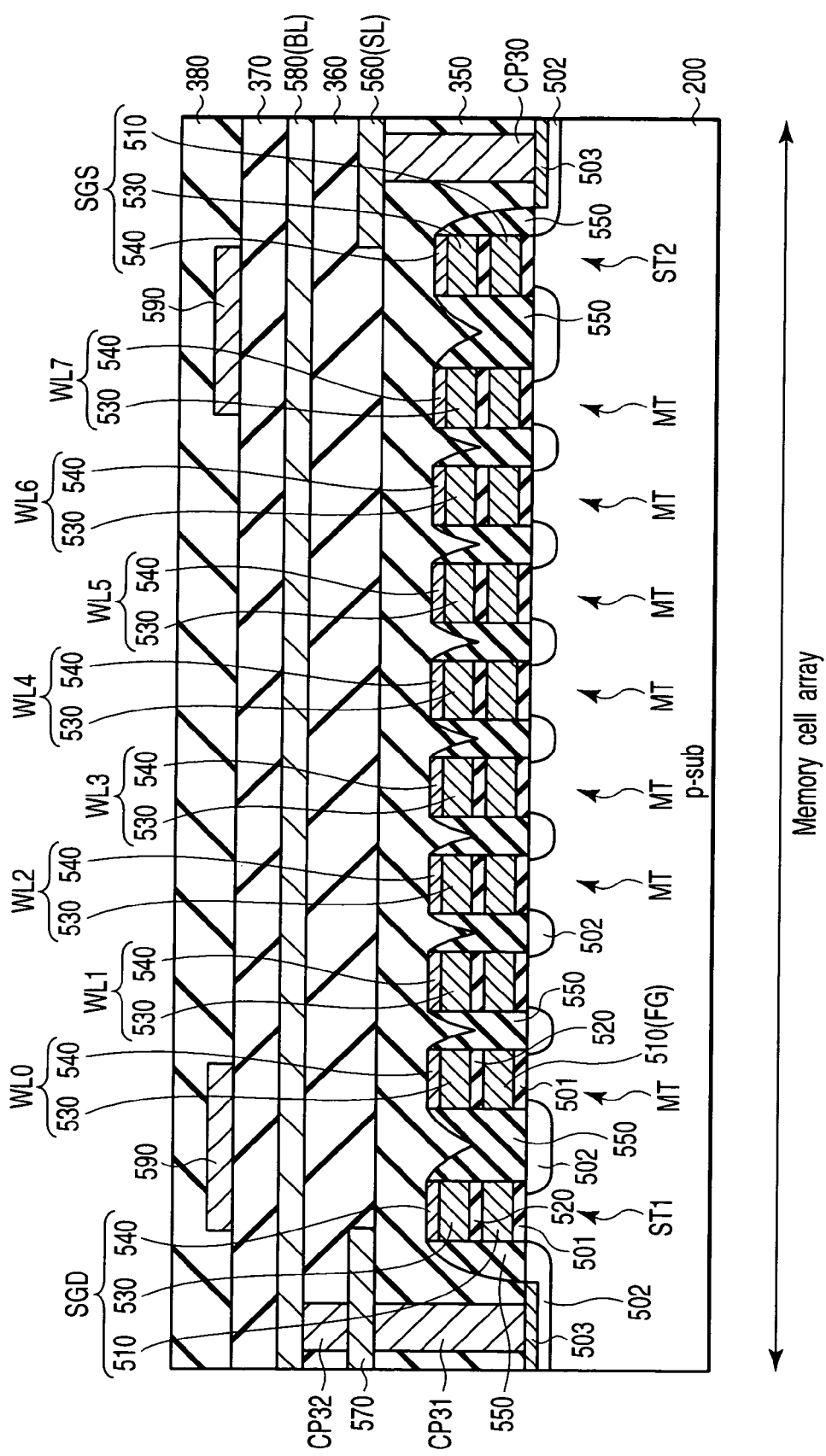
FIG. 65 is a sectional view of the memory cell array provided in the NAND type flash memory according to the fourth embodiment of the present invention.

FIG. 65 is a sectional view of the memory cell array provided in the NAND type flash memory 500; the sectional view is taken along the bit lines. As shown in the figure, a gate insulating film 501 is formed on the p-type semiconductor (silicon) substrate 200. The gate electrodes of the memory cell transistors MT and select transistors ST1 and ST2 are formed on the gate insulating film 501. The gate electrodes of the memory cell transistors MT and select transistors ST1 and ST2 have a polycrystalline silicon layer 510 formed on the gate insulating film 501, an inter-gate insulating film 520 formed on the polycrystalline silicon layer 510, a polycrystalline silicon layer 530 formed on the inter-gate insulating film 520, and a silicide layer 540 formed on the polycrystalline silicon layer 530. The inter-gate insulating film 520 is formed of, for example, a silicon oxide film or an ON, NO, or ONO film that has a stacked structure of a silicon oxide film and a silicon nitride film. In the memory cell transistors MT, the polycrystalline silicon layers 510 in the element regions AA arranged adjacent to each other across the word lines are separated from one another. The polycrystalline silicon layer 510 thus functions as a floating gate (FG). The polycrystalline silicon layer 530 and silicide layer 540 function control gates (word lines WL). The polycrystalline silicon layers 530 in the element regions AA arranged adjacent to each other across the word lines are connected together. In the select transistors ST1 and ST2, the inter-gate insulating film 520 is partly removed in a shunt region (not shown). The polycrystalline silicon layers 510 and 530 are electrically connected together. The polycrystalline silicon layers 510 and 530 and the silicide layer 540 function as a select gate line SGD or SGS. In the select transistors ST1 and ST2, the polycrystalline silicon layers 510 and 530 in the element regions AA arranged adjacent to each other across the word lines are not separated from each other but are connected together.

An impurity diffusion layer 502 is formed in the surface of the semiconductor substrate 200 located between the adjacent gate electrodes; the impurity diffusion layer 502 functions as a source/drain region. The impurity diffusion layer 502 is shared by the adjacent transistors. That is, the impurity diffusion layer 502 between the two adjacent select transistors ST1 functions as the drain region of the two select transistors ST1. The impurity diffusion layer 602 between the two adjacent select transistors ST2 functions as the source region of the two select transistors ST2. The impurity diffusion layer 502 between the two adjacent memory cell transistors MT functions as the source/drain region of the two memory cell transistors MT. Moreover, the impurity diffusion layer 502 between the memory cell transistor MT and select gate line ST1 adjacent to each other functions as the source region of the memory cell transistor MT and select gate line ST1. On the other hand, the impurity diffusion layer 502 between the memory cell transistor MT and select gate line ST2 adjacent to each other functions as the source region of the memory cell transistor MT and the drain region of the select gate line ST2. The silicide layer 502 is formed in the surface of the drain region 502 of the select transistor ST1 and in the surface of the source region 502 of the select transistor ST2. The silicide layer is not formed in the source/drain region 502 of the memory cell transistor MT, in the source region 502 of the select transistor ST1, or in the drain region 502 of the select transistor ST2. Further, a side wall insulating film 550 is formed on side surfaces of gate electrodes (stacked gates) of the memory cell transistor MT and select transistors ST1 and ST2. The side wall insulating film 550 is formed on both a side of the stacked gate facing the source region and a side of the stacked gate facing the drain region. The side wall insulating film 550 fills the region between the stacked gates of the memory cell transistor MT and each of the select transistors ST1 and ST2. Therefore, the side wall insulating film 550 covers the source/drain region of the memory cell transistor MT, the source region of the select transistor ST1, and the top surface of the select transistor ST2.

The inter-level insulating film 350 is formed on the semiconductor substrate 200 so as to cover the memory cell transistor MT and select transistors ST1 and ST2. A contact plug CP30 is formed in the inter-level insulating film 350; the contact plug CP30 reaches the silicide layer 503 formed in the source region 502 of the select transistor ST2. A metal interconnect layer 560 connected to the contact plug CP30 is formed on the inter-level insulating film 350. The metal interconnect layer 560 functions as the source line SL. A contact plug CP31 is also formed in the inter-level insulating film 350; the contact plug CP31 reaches the silicide layer 503 formed in the drain region 502 of the select transistor ST1. A metal interconnect layer 570 connected to the contact plug CP31 is formed on the inter-level insulating film 350.

The inter-level insulating film 360 is formed on the inter-level insulating film 350 so as to cover the metal interconnect layers 560 and 570. A contact plug CP32 reaching the metal interconnect layer 570 is formed in the inter-level insulating film 360. A metal interconnect layer 580 connected to a plurality of contact plugs CP32 is formed on the inter-level insulating film 360. The metal interconnect layer 580 functions as the bit line BL.

The inter-level insulating film 370 is formed on the inter-level insulating film 360 so as to cover the metal interconnect layer 580. A metal interconnect layer 590 is formed on the inter-level insulating film 370. The metal interconnect layer 590 is connected to the silicide layer 540 of the select transistor ST1 or ST2 in a region (not shown). The metal interconnect layer 590 functions as the shunt interconnects of the select gate lines SGD and SGS. The inter-level insulating film 380 is formed on the inter-level insulating film 370 so as to cover the metal interconnect layer 590.

<3Tr-NAND Type Flash Memory>

Figure 66:
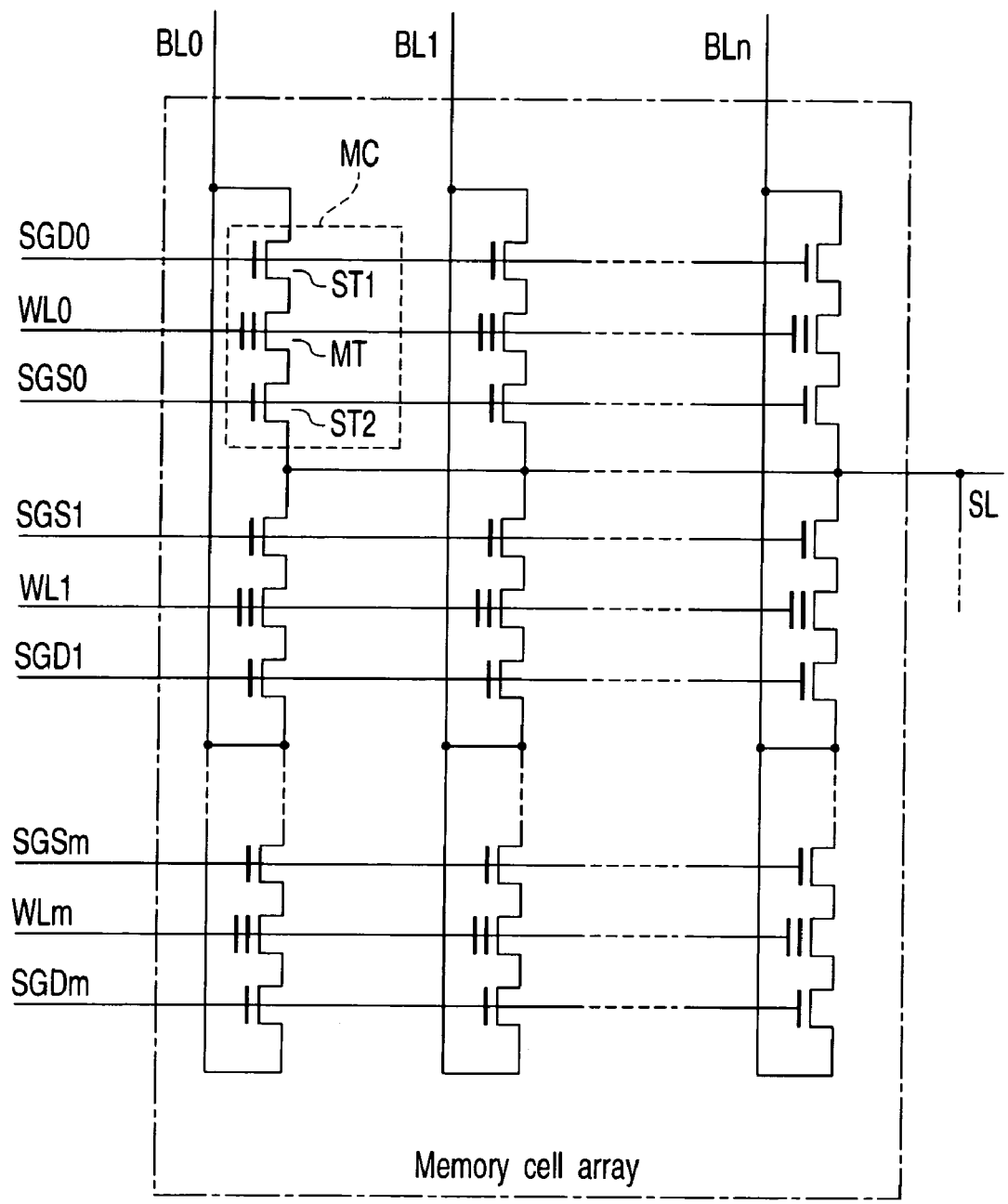
FIG. 66 is a circuit diagram of a memory cell array provided in a 3Tr-NAND type flash memory according to the fourth embodiment of the present invention.

FIG. 66 is a circuit diagram of a memory cell array provided in a 3Tr-NAND type flash memory 600. As shown in the figure, the memory cell array has a plurality of ((m+1)×(n+1); m and n are natural numbers) memory cells MC arranged in a matrix. Each of the memory cells MC has the memory cell transistor MT and select transistors ST1 and ST2 having current paths connected in series. The current path in the memory cell transistor MT is connected to between the current paths in the select transistors ST1 and ST2. That is, this is equal to the NAND cells included in the NAND type flash memory each having only one memory cell transistor MT. The memory cell transistor MT comprises the stacked gate structure having the floating gate formed on the semiconductor substrate via the gate insulating film and the control gate formed on the floating gate via the inter-gate insulating film. The source region of the select transistor ST1 is connected to the drain region of the memory cell transistor MT. The source region of the memory cell transistor MT is connected to the drain region of the select transistor ST2. Further, the memory cell transistors MT adjacent to each other across the columns share the drain region of the select transistor ST1 or the source region of the select transistor ST2.

One of the word lines WL0 to WLm connects to the control gates of the memory cell transistors MT in all the memory cells on the same row. One of the select gate lines SGD0 to SGDm connects to the gates of the select transistors ST1 in all the memory cells on the same row. One of the select gate lines SGS0 to SGSm connects to the gates of the select transistors ST2 in all the memory cells on the same row. A row decoder (not shown) connects to the word lines WL0 to WLm and select gate lines SGD0 to SGDm and SGS0 to SGSm. One of the bit lines BL0 to BLn connects to the drain regions of the select transistors ST1 in all the memory cells MC on the same row. The bit lines BL0 to BLn are connected to a write circuit and a read circuit (not shown). The source regions of the select transistors ST2 in all the memory cells MC are connected to the source line SL and to the source line driver.

Figure 67:
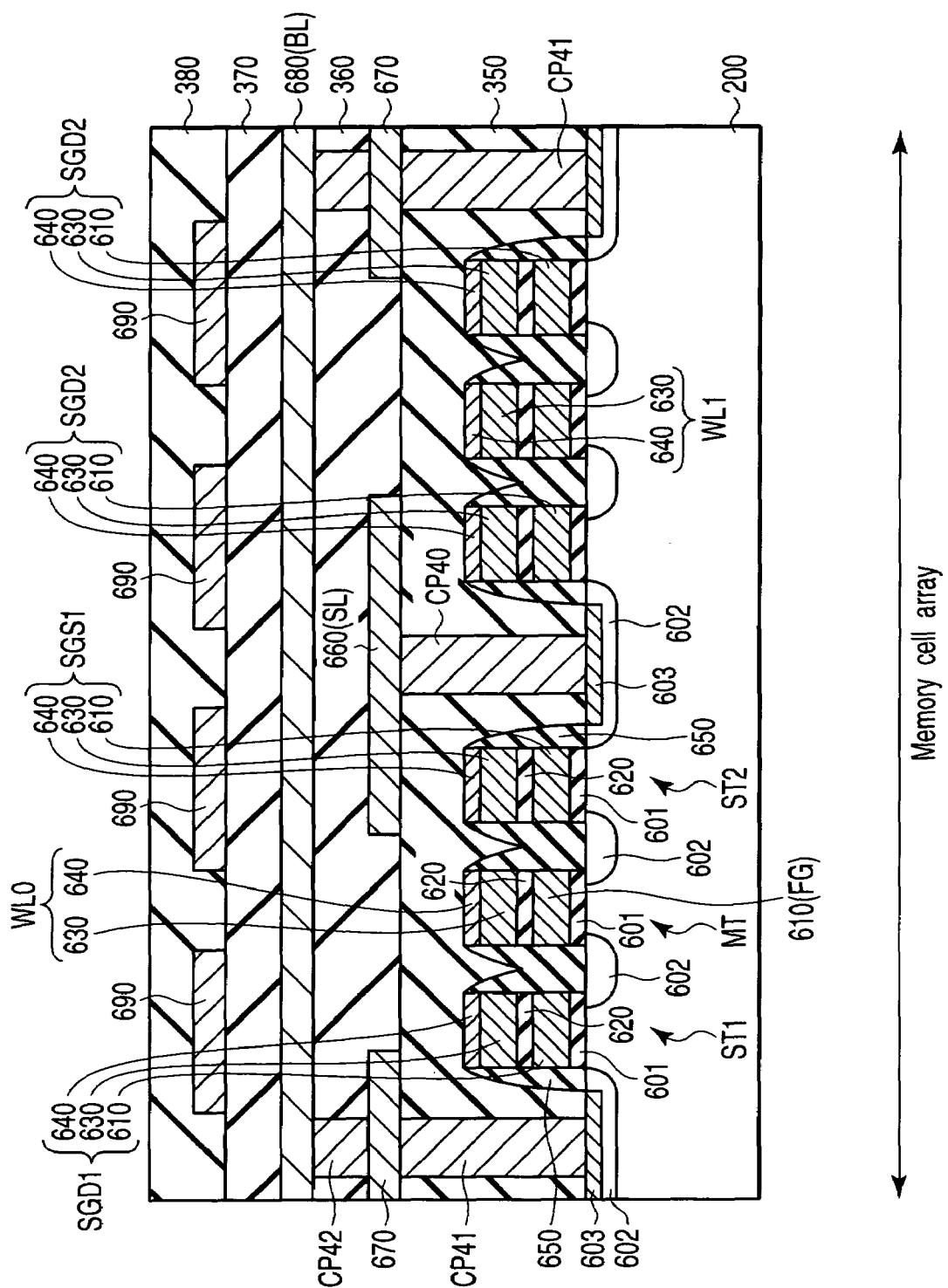
FIG. 67 is a sectional view of the memory cell array provided in the 3Tr-NAND type flash memory according to the fourth embodiment of the present invention.

FIG. 67 is a sectional view of the memory cell array provided in the 3TR-NAND type flash memory 600. As shown in the figure, a gate insulating film 601 is formed on the p-type semiconductor (silicon) substrate 200. The gate electrodes of the memory cell transistors MT and select transistors ST1 and ST2 are formed on the gate insulating film 601. The gate electrodes of the memory cell transistors MT and select transistors ST1 and ST2 have a polycrystalline silicon layer 610 formed on the gate insulating film 601, an inter-gate insulating film 620 formed on the polycrystalline silicon layer 610, a polycrystalline silicon layer 630 formed on the inter-gate insulating film 620, and a silicide layer 640 formed on the polycrystalline silicon layer 630. The inter-gate insulating film 620 is formed of, for example, an ON, NO, or ONO film. In the memory cell transistors MT, the polycrystalline silicon layers 610 in the element regions AA arranged adjacent to each other across the word lines are separated from each other. The polycrystalline silicon layer 610 thus functions as a floating gate (FG). The polycrystalline silicon layer 630 and silicide layer 640 function control gates (word lines WL). The polycrystalline silicon layers 630 in the element regions AA arranged adjacent to each other across the word lines are connected together. In the select transistors ST1 and ST2, the inter-gate insulating film 620 is partly removed in a shunt region (not shown). The polycrystalline silicon layers 610 and 630 are electrically connected together. The polycrystalline silicon layers 610 and 630 and the silicide layer 640 function as a select gate line SGD or SGS. In the select transistors STI and ST2, the polycrystalline silicon layers 610 and 630 in the element regions AA arranged adjacent to each other across the word lines are not separated from each other but are connected together. That is, the floating gate cells in the respective cells are not separated from one another as with the memory cell transistors MT but are all connected together.

An impurity diffusion layer 602 is formed in the surface of the semiconductor substrate 200 located between the adjacent gate electrodes; the impurity diffusion layer 602 functions as a source/drain region. The impurity diffusion layer 502 is shared by the adjacent transistors. That is, the impurity diffusion layer 602 between the two adjacent select transistors ST1 functions as the drain region of the two select transistors ST1. The impurity diffusion layer 602 between the two adjacent select transistors ST2 functions as the source region of the two select transistors ST2. Furthermore, the impurity diffusion layer 602 between the memory cell transistor MT and select gate line ST1 adjacent to each other functions as the source region of the memory cell transistor MT and select gate line ST1. Moreover, the impurity diffusion layer 602 between the memory cell transistor MT and select gate line ST2 adjacent to each other functions as the source region of the memory cell transistor MT and the drain region of the select gate line ST2. A silicide layer 603 is formed in the surface of the drain region 602 of the select transistor ST1 and in the surface of the source region 602 of the select transistor ST2. The silicide layer is not formed in the source/drain region 602 of the memory cell transistor MT, in the source region 602 of the select transistor ST1, or in the drain region 502 of the select transistor ST2. Further, a side wall insulating film 650 is formed on side surfaces of gate electrodes (stacked gates) of the memory cell transistor MT and select transistors. The side wall insulating film 650 is formed on both a side of the stacked gate facing the source region 602 and a side of the stacked gate facing the drain region 602. The side wall insulating film 650 fills the region between the stacked gates of the memory cell transistor MT and select transistor ST. Therefore, the side wall insulating film 650 covers the source/drain region of the memory cell transistor MT, the source region of the select transistor ST1, and the top surface of the select transistor ST2.

The inter-level insulating film 350 is formed on the semiconductor substrate 200 so as to cover the memory cell transistor MT and select transistors ST1 and ST2. A contact plug CP40 is formed in the inter-level insulating film 350; the contact plug 30 reaches the silicide layer 603 formed in the source region 602 of the select transistor ST2. A metal interconnect layer 660 connected to the contact plug CP40 is formed on the inter-level insulating film 350. The metal interconnect layer 560 functions as the source line SL. A contact plug CP41 is also formed in the inter-level insulating film 650; the contact plug CP41 reaches the silicide layer 603 formed in the drain region 602 of the select transistor ST1. A metal interconnect layer 670 connected to the contact plug CP41 is formed on the inter-level insulating film 350.

The inter-level insulating film 360 is formed on the inter-level insulating film 350 so as to cover the metal interconnect layers 660 and 670. A contact plug CP42 reaching the metal interconnect layer 670 is formed in the inter-level insulating film 360. A metal interconnect layer 680 connected to a plurality of contact plugs CP42 is formed on the inter-level insulating film 360. The metal interconnect layer 680 functions as the bit line BL.

The inter-level insulating film 370 is formed on the inter-level insulating film 360 so as to cover the metal interconnect layer 680. A metal interconnect layer 690 is formed on the inter-level insulating film 370. The metal interconnect layer 690 is connected to the silicide layer 640 of the select transistor ST1 or ST2 in a region (not shown). The metal interconnect layer 690 functions as the shunt interconnects of the select gate lines SGD and SGS. The inter-level insulating film 380 is formed on the inter-level insulating film 370 so as to cover the metal interconnect layer 690.

<2Tr Flash Memory>

Figure 68:
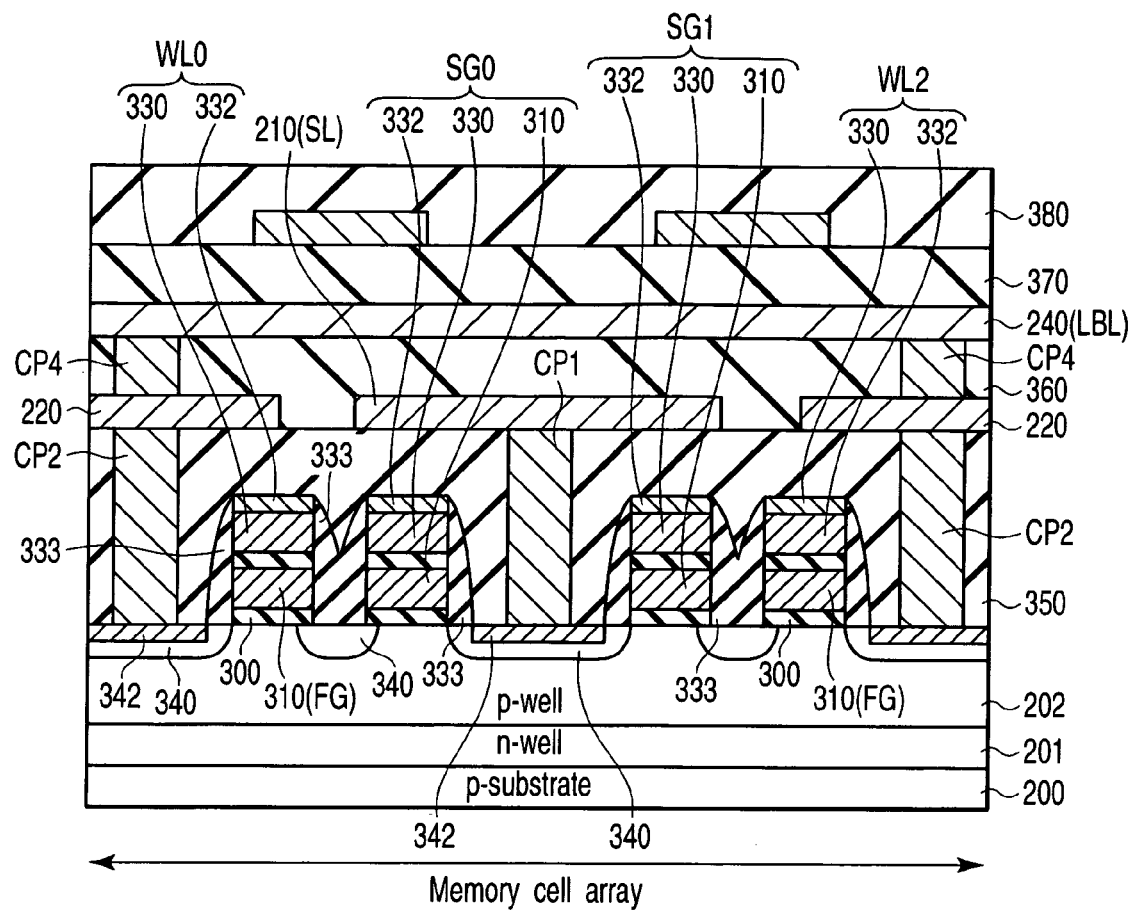
FIG. 68 is a sectional view of a memory cell array provided in a 2Tr-NAND type flash memory according to the fourth embodiment of the present invention.

The configuration of the 2Tr flash memory 3 is as described in the above first and second embodiments. However, as shown in FIG. 68, the silicide layers 332 and 342 may be formed on the polycrystalline silicon layer 330 and in the surface of the impurity diffusion layer 340, respectively. The side wall insulating film 333 may be formed on side walls of the stacked gate. In the memory cell transistor MT, the polycrystalline silicon layer 330 and the silicide layer 332 function as control gates (word lines WL).

The silicide layer 340 is formed in the surface of drain region 340 of the memory cell transistor MT and in the surface of source region 340 of the select transistor ST. The silicide layer is not formed in the source region 340 of the memory cell transistor MT or in the drain region 340 of the select transistor ST. The side wall insulating film 333 fills the region between the stacked gates of the memory cell transistor MT and select transistor ST. Therefore, the side wall insulating film 333 covers the top surface of source region of the memory cell transistor MT and the top surface of drain region of the select transistor ST.

As described above, the system LSI according to the present embodiment produces the effects (1) to (10), described in the first embodiment, but also the effects described below.

(11) Plural Types of Flash Memories can be Mounted on the Same Chip While Preventing an Increase in Manufacturing Costs.

The present configuration and manufacturing method make it possible to form, during the same process, the memory cell transistors MT and select transistors ST1, ST2, and ST provided in the NAND type flash memory 500, 3Tr-NAND type flash memory 600, and 2Tr flash memory 3. That is, the MOS transistors are formed using the same oxidation step, deposition step, impurity injection step, and photolithography and etching step. As a result, the three flash memories 500, 600, and 3 use the same gate insulating film and inter-gate insulating film, the same floating and control gates of the memory cell transistor MT, and the same select gate of the select transistor. This manufacturing method enables a memory cell array of the three flash memories to be formed using the number of steps required to form one flash memory. This makes it possible to reduce the manufacturing costs of a system LSI on which the three types of semiconductor memories are mounted.

(12) Performance of the System LSI can be Improved.

The system LSI according to the present embodiment has the above NAND type flash memory 500, 3Tr-NAND type flash memory 600, and 2Tr flash memory 3.

Unlike the NAND type flash memory 500 and the 3Tr-NAND type flash memory 600, the 2Tr flash memory 3 uses the positive voltage (VPP=10 V) and negative voltage (VBB1=−6 V) for the write and erase operations. That is, a potential difference of 10 V or −6 V is applied to the gate insulating film of each of the MOS transistors used for the row decoder. Consequently, a thinner gate insulating film can be used for each of the MOS transistors used for the row decoder provided in the 2Tr flash memory 3 than for each of the MOS transistors used for the row decoder provided in the NAND type flash memory 500 or 3Tr-NAND type flash memory 600. This makes it possible to reduce the size of the row decoder in the 2Tr flash memory. The row decoder in the 2Tr flash memory can operate faster than that in the NAND type flash memory 500 or 3Tr-NAND type flash memory 600.

Further, according to the present embodiment, the 2Tr flash memory 3 stores program data required to operate MCU 700. The 2Tr flash memory can operate fast as described above. Accordingly, MCU 700 can read data from the 2Tr flash memory 3 without using RAM. This eliminates the need for RAM to simplify the configuration of the system LSI. The operation speed can also be improved.

Furthermore, the 3Tr-NAND type flash memory 600 retains an ID code or a security code. These codes do not have a very large amount of data but are frequently changed or updated in many cases. Accordingly, a memory retaining the code data must operate at a somewhat high speed. In this regard, the 3Tr-NAND type flash memory 600 uses an erase unit smaller than that for the NAND type flash memory 500. The 3Tr-NAND type flash memory 600 thus enables data to be rewritten on a page by page basis. Therefore, the 3Tr-NAND type flash memory 600 is a semiconductor memory that is optimum for retaining the code data.

A conventional LSI having a NAND type flash memory requires such a controller as described below in order to prevent rewrite operations from concentrating on a particular block. The controller converts an address input using ware leveling or logic into a physical address, or if any block is defective, considers it to be a defective block and performs control such that the block will no longer be used. However, the present embodiment does not require such a controller. This is because the 2Tr flash memory 3 may retain a firmware program that controls the blocks in the NAND type flash memory 500 so that MCU 700 can perform the above control. MCU 700 may perform the above control in the intervals between its intrinsic operations (control of an external device and calculation of data input to the NAND type flash memory 500). Of course, if the amount of processing that must be executed by MCU 700 is large compared to the level of capabilities of MCU 700, a hardware sequencer or the like may be provided to control the NAND type flash memory 500.

As described above, with the semiconductor storage device according to any of the first to fourth embodiments, the parasitic capacitance of each of the local bit lines LBL0 to LBL3 in the prime cell array PCA is smaller than that of each of the local bit lines LBL0 to LBL3 in the replica cell array RCA. Therefore, during the read operation, the parasitic capacitance present on the replica read global bit line R_RGBL is larger than that present on the read global bit line RGBL.

During a precharge operation, after the potential across the replica read global bit line R_RGBL exceeds the data determination threshold voltage Vth for the sense amplifier, precharging of the read global bit line RGBL is finished. When a data read operation is finished, the data on the read global bit line RGBL is established after the voltage across the replica read global bit line R_RGBL has decreased from the precharge potential to Vth.

Accordingly, for the precharge operation, the potential across the read global bit line RGBL can be reliably set to at least Vth. When the binary 1 is read, the data can be established after the potential across the read global bit line RGBL has reliably decreased below Vth. This makes it possible to avoid erroneous determinations for read data.

In order to reduce the parasitic capacitance of each of the local bit lines LBL0 to LBL3 in the prime cell array PCA below that of each of the local bit lines LBL0 to LBL3 in the replica cell array RCA, it is possible to control the number of replica cells connected to the local bit lines LBL0 to LBL3 and retaining the binary 1. Alternatively, replica cells in an over-erase state may be provided.

In the description of the above embodiments, the discharge circuit 81 comprises the voltage generator 88 and the current source circuit 87 including the MOS transistors 87-1 and 87-2. However, the configuration of the discharge circuit 81 is not limited provided that the replica read global bit line can be discharged at a fixed temporal variation rate. Further, the discharge capability of the discharge circuit 81, shown in FIG. 12, can be varied using the size of the MOS transistor 87-1 or 87-2 or the value of the value Vref.

Figure 69:
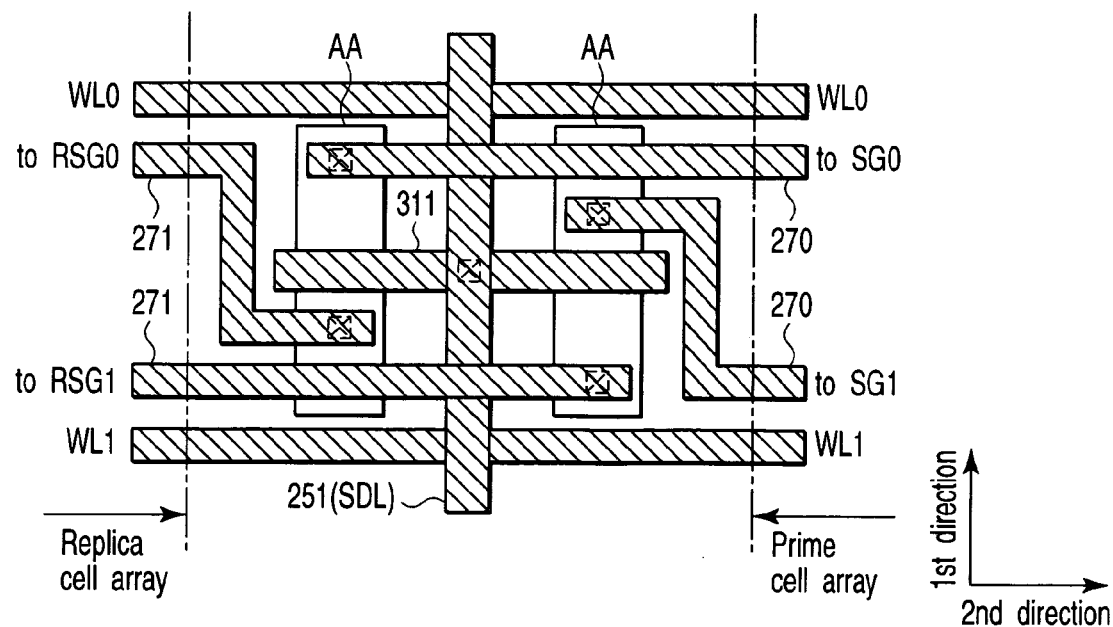
FIG. 69 is a plan view of an isolating MOS transistor provided in a 2Tr flash memory according to a first variation of the second embodiment of the present invention.

Further, the MOS transistors 19-0 to 19-(4m−1), described in the second embodiment, are not limited to those shown in FIG. 50 and having a planar pattern. The MOS transistors 19-0 to 19-(4m−1) have only to be able to switch between the select gate lines SG0 to SG(4m−1) and the replica select gate lines RSG0 to RSG(4m−1). For example, such an arrangement as shown in FIG. 69 may be used. FIG. 69 shows a planar pattern of the MOS transistors 19-0 to 19-(4m−1). For simplification, the only interconnects shown in this figure are the word lines, the shunt interconnects 270 of the select gate lines, the shunt interconnects 271 of the replica select gate lines, the gate electrode 31, and the select dummy line SDL.

As shown in the figure, the two MOS transistors 19-0 and 19-1 (19-2 and 19-3, 19-4 and 19-5, . . . ) are arranged between the two word lines WL0 and WL1 (between WL2 and WL3, between WL4 and WL5, . . . ) along the second direction, in contrast to FIG. 50, described in the second embodiment. The gate electrode 311 is formed so that its longitudinal direction extends along the second direction and that its source, channel, and drain regions extend along the first direction. The shunt interconnect 270 of each select gate line is connected to one of source and drain of the corresponding one of the MOS transistors 19-0 and 19-1.

Figure 70:
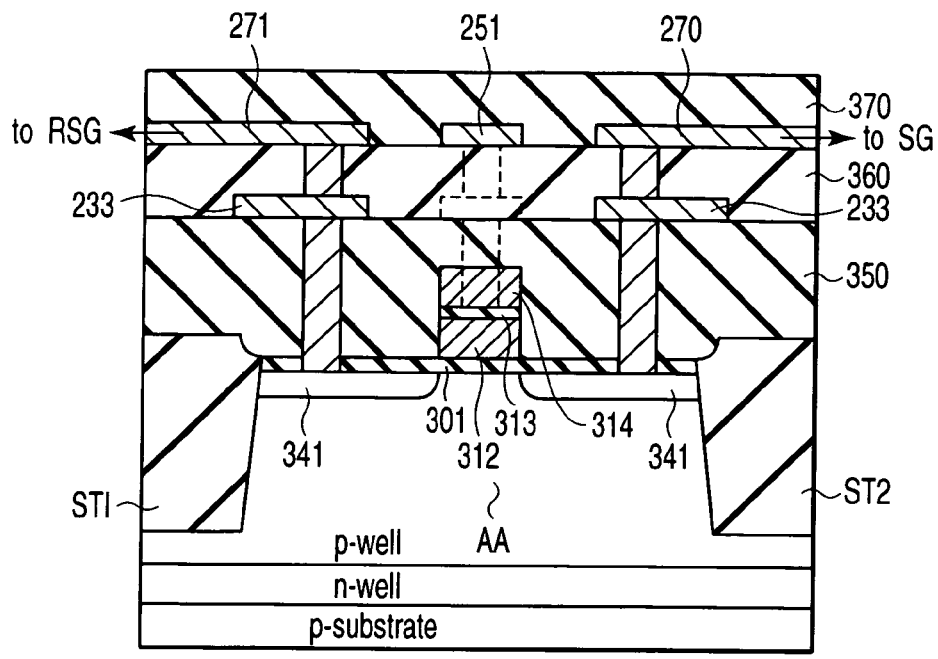
FIG. 70 is a sectional view of an isolating MOS transistor provided in a 2Tr flash memory according to a second variation of the second embodiment of the present invention.
Figure 71:
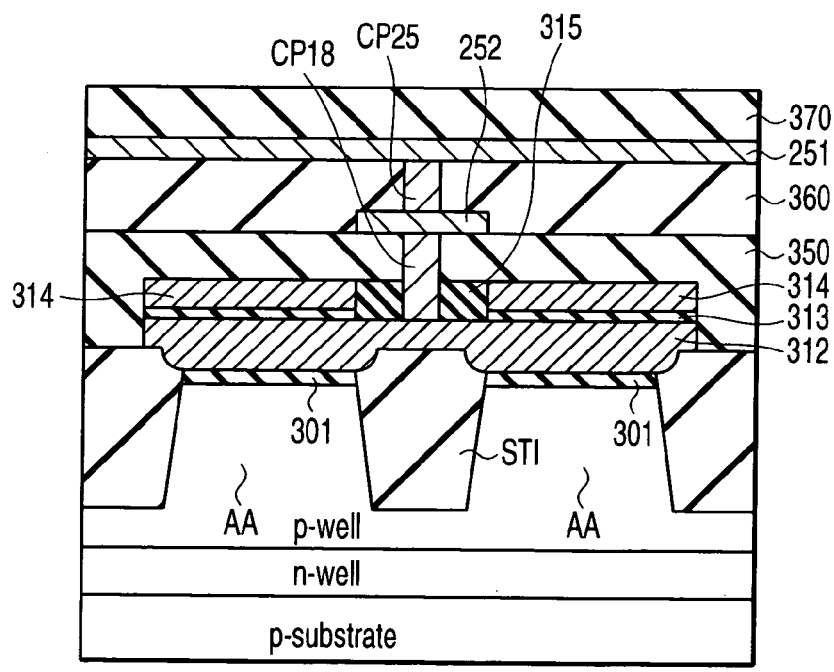
FIG. 71 is a sectional view of the isolating MOS transistor provided in the 2Tr flash memory according to the second variation of the second embodiment of the present invention.

Further, like the gates of the prime and replica cells, the gate electrode 311 of each of the MOS transistors 19-0 to 19-(4m−1) may have a multilayered gate structure as shown in FIGS. 70 and 71. FIGS. 70 and 71 are sectional views taken across the gate length and width, respectively, of the MOS transistors 19-0 to 19-(4m−1). As shown in the figures, the gate electrode 311 comprises a polycrystalline silicon layer 312 formed on the gate insulating film 301 and a polycrystalline silicon layer 314 formed on the polycrystalline silicon layer 312 via an inter-gate insulating film 313. The polycrystalline silicon layer 314 and inter-gate insulating film 313 are removed in a particular region in which the contact plug CP18 is formed in contact with the polycrystalline silicon layer 312. In the example in FIG. 71, like the shunt region SA2, the contact plug CP18 is electrically separated from the polycrystalline silicon layer 314 by an insulating film 315. However, the contact plug CP18 may be in contact with the polycrystalline silicon layer 314.

Figure 72:
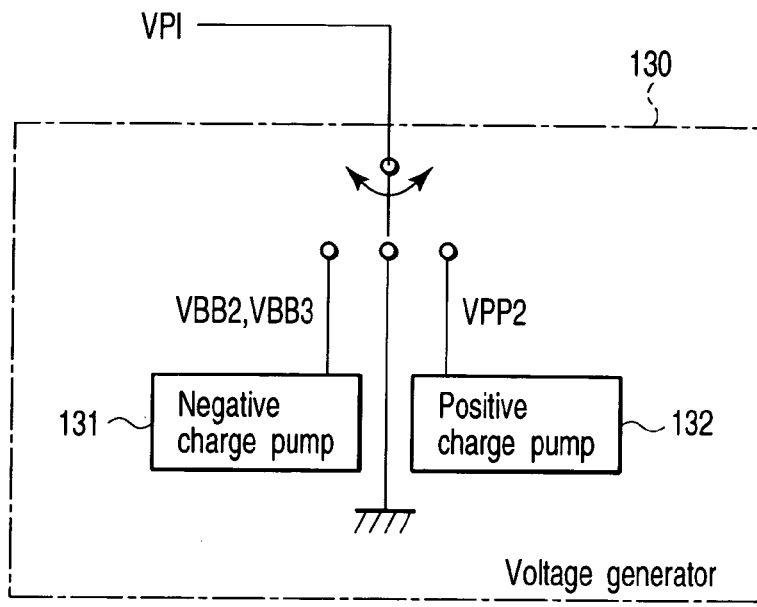
FIG. 72 is a block diagram of a voltage generator provided in a 2Tr flash memory according to a first variation of any of the first to fourth embodiment of the present invention.
Figure 73:
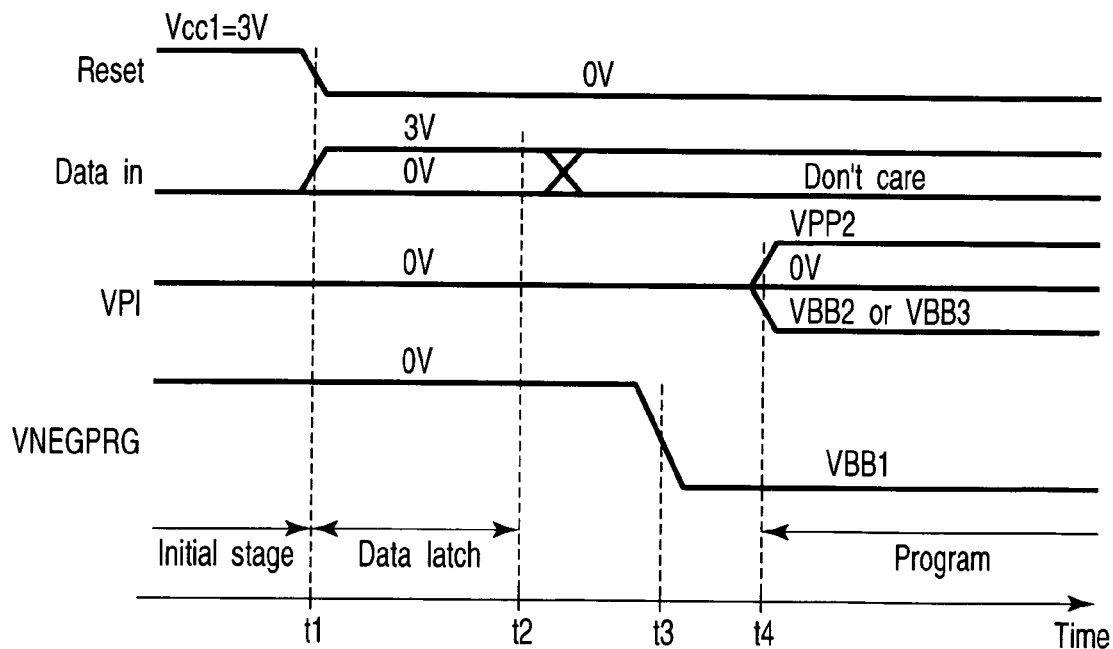
FIG. 73 is a timing chart of various signals output during a read operation of a 2Tr flash memory according to a second variation of any of the first to fourth embodiment of the present invention.

In the description of the above embodiment, only the negative voltage is used as the write inhibition voltage VPI. However, instead of the negative voltage, a positive voltage or 0 V may be used as the write inhibition voltage VPI. FIG. 72 shows a circuit configuration used in this case. FIG. 73 is a timing chart of VPI and VNEGPRG.

As shown in the figure, the voltage generator 130 comprises a charge pump circuit 131 that generates a negative potential and a charge pump circuit 132 that generates a positive potential. The charge pump circuit 131 generates negative potentials VBB2 and VBB4. The charge pump circuit 132 generates a positive potential VPP2. Further, a switch is used to appropriately connect an output node for these voltages and a ground potential node to a VPI node. This enables the use of a voltage best matching the situation as the write inhibition voltage VPI.

In the above embodiments, description is given of the 2Tr flash memory comprising the write decoder 20 and select gate decoder 30. However, as shown in FIG. 74, one row decoder 140 may be used to select the word line and the select gate line. Further, for the erase operation, the potential of the select gate line may float.

Moreover, in the above embodiments, the bit line is hierarchical, but the present invention is not limited to this. However, if the bit line is hierarchical, the write global bit line is desirably set at 0 V for the read operation. Thus, the write selector 50, the write circuit 60, and the switch group 100 are desirably set in their initial states. Setting these components in the initial states enables the potential across the write global bit line to be set at 0 V via the current path in the MOS transistor 53. Setting the potential of the write global bit line at 0 V prevents noise from the read global bit line during the read operation. This enables the read operation to be further stabilized. It is therefore possible to improve the reliability of the read operation performed on the flash memory.

Now, description will be given of an application for the above semiconductor storage device. FIG. 75 shows an example of a memory card. As shown in FIG. 75, a memory card 900 has the flash memory 3, described in the above embodiments (the 2Tr flash memory, 3Tr-NAND type flash memory, or NAND type flash memory may be used instead). The flash memory 3 receives predetermined control signals and data from an external device (not shown). The flash memory 3 also outputs predetermined control signals and data to an external device (not shown).

The following signal lines are connected to the flash memory 3 mounted in the memory card 900: a signal line (DAT) through which data, an address, or a command is transferred, a command line enable signal line (CLE) that indicates that a command is being transferred to the signal line DAT, an address line enable signal line (ALE) that indicates that an address is being transferred to the signal line DAT, and a ready/busy signal line (R/B) that indicates whether or not the flash memory 10 is operative.

Figure 76:
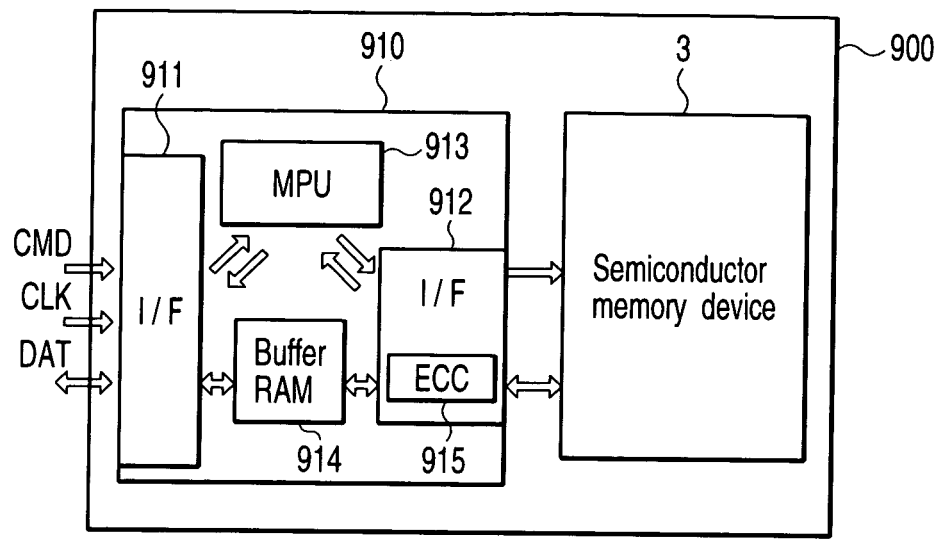
FIG. 76 is a block diagram of the memory card comprising the flash memory according to any of the first to fourth embodiment of the present invention.

FIG. 76 shows another example of a memory card. This memory card is different from that shown in FIG. 75 in that it has a controller 910 which controls the flash memory 3 and which transmits predetermined signals to and from an external device (not shown).

The controller 910 connects to interface sections (I/F) 911 and 912 which receive predetermined signals from the flash memory 3 and an external device (not shown) or which output predetermined signals to the external device, a microprocessor section (MPU) 913 that executes predetermined calculations for converting a logical address input by the external device into a physical address, a buffer RAM 914 that temporarily stores data, ands an error correction section (ECC) 915 that generates an error correction code. The memory card 900 connects to a command signal line (CMD), a clock signal line (CLK), and the signal line (DAY).

The previously described memory card has been shown, but variations may be made to the number of control signals, the bit widths of the signal lines, or the configuration of the controller.

Figure 77:
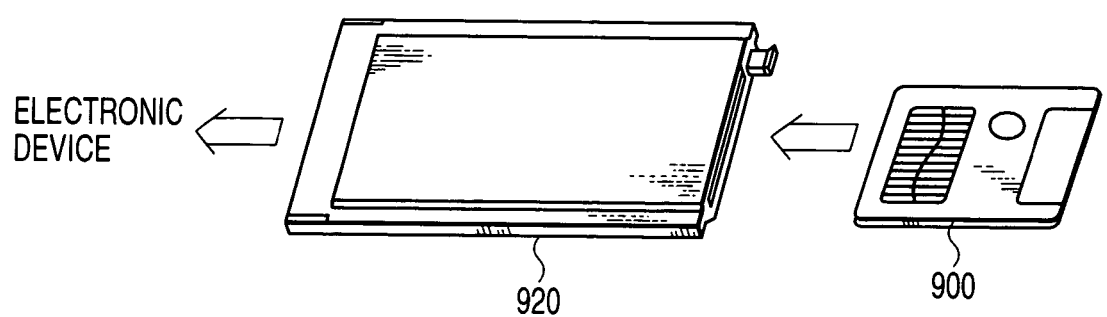
FIG. 77 is a block diagram of the memory card comprising the flash memory according to any of the first to fourth embodiment of the present invention as well as a card holder.

FIG. 77 shows another application. As shown in FIG. 77, the above memory card 900 is inserted into a card holder 920, which is then connected to an electronic device (not shown). The card holder 920 may have some of the functions of the controller 910.

FIG. 78 shows another application. As shown in the figure, the memory card 900 or the card holder 920 into which the memory card 900 has been inserted is inserted into a connection device 1000. The connection device 1000 is connected to a board 1300 Via a connection wire and an interface circuit 1200. A CPU 1400 and a bus 1500 are mounted on the board 1300.

FIG. 79 shows another application. The memory card 900 or the card holder 920 into which the memory card 900 has been inserted is inserted into a connection device 1000. The connection device 1000 is connected to a personal computer 2000 Via the connection wire 1100.

Figure 81:
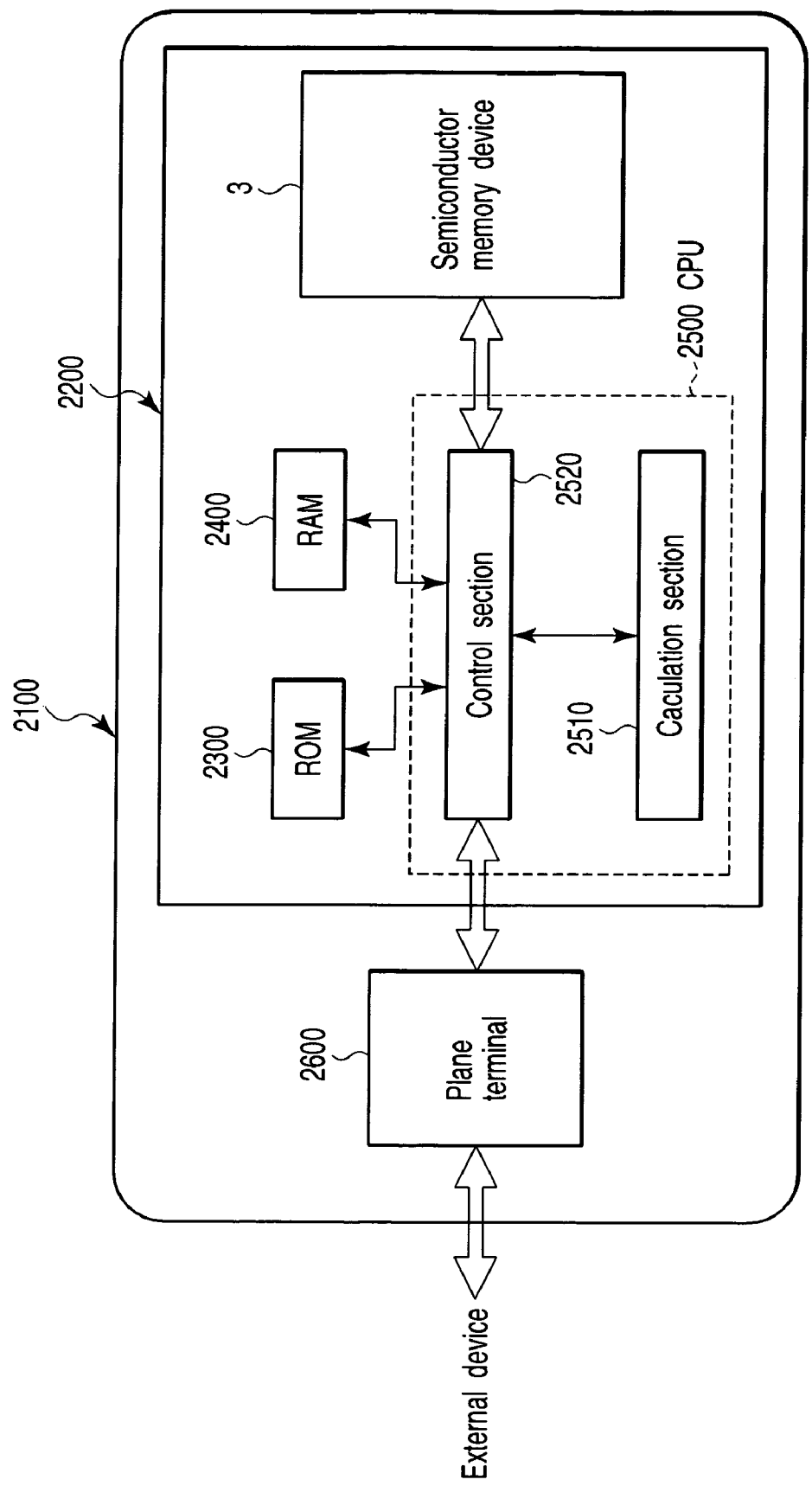
FIG. 81 is a block diagram of the IC card comprising the flash memory according to any of the first to fourth embodiments of the present invention.

FIGS. 80 and 81 show another application. As shown in the figures, MCU 2200 is mounted in an IC card 2100. MCU 2200 comprises the flash memory 10 according to any of the embodiments and other circuits, for example, ROM 2300, RAM 2400, and CPU 2500. The IC card 2100 is connected to MCU 2200 and can be connected to MCU 2200 Via a plane connecting terminal 2600 provided in the IC card 2100. CPU 2500 comprises a calculation section 2510 and a control section 2520 connected to the flash memory 3, ROM 2300, and RAM 2400. For example, MPU 2200 is provided on one surface of the IC card 2100. The plane connecting terminal 2600 is provided on the other surface of the IC card 2100.

As described above, the embodiments of the present invention suppresses migration of extra charge across the bit lines during discharging after precharging has been finished. This increases the speed of the read operation. Since no through current is conducted during discharging, power consumption can be reduced.

Further, the output from the clocked inverter can be made low immediately after precharging. Accordingly, the MOS transistor Q2 can be turned off more quickly. This also increases the speed of the read operation. Furthermore, even if the bit line is at the low level and the MOS transistor Q4 has a high threshold voltage, the bias voltage BIAS can be reliably made low by using the logic signal (precharge signal /PRE) to turn on the MOS transistor Q7.

Moreover, the read control circuit 83 free from the MOS transistor Q7 turns off the MOS transistor Q2, which controls the level of the bit line, later than the read circuit 73. This relatively reduces the speed of the read operation performed by the read control circuit 83. It is thus possible to provide sufficient margins for the main body output and read end signal.

Therefore, an aspect of the present invention provides a semiconductor storage device that can perform a fast read operation with reduced power consumption.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor storage device comprising:
a precharge circuit configured to precharge a bit line connected to a selected memory cell for a read operation, the precharge circuit including a first MOS transistor of a first conductivity type which has a gate connected to the bit line, a second MOS transistor of a second conductivity type which has a gate connected to the bit line, the second MOS transistor having a current path one end of which is connected to one end of a current path in the first MOS transistor, a third MOS transistor of the first conductivity type which has a current path one end of which is connected to the other end of the current path in the first MOS transistor, the other end of the current path in the third MOS transistor being connected to a power supply, and a fourth MOS transistor of the second conductivity type which has a gate connected to a junction between the current paths in the first and second MOS transistors and which controls a charge level of the bit line;
a discharge circuit configured to discharge the bit line using a current flowing through the selected memory cell; and
a sense amplifier configured to sense a voltage across the bit line.

2. The semiconductor storage device according to claim 1, wherein the third MOS transistor is controlled by receiving a precharge signal.

3. The semiconductor storage device according to claim 1, wherein a gate of the third MOS transistor is grounded.

4. The semiconductor storage device according to claim 1, further comprising a fifth MOS transistor of the second conductivity which has a current path one end of which is connected to the junction between the current paths in the first and second MOS transistors, the other end of the current path in the fifth MOS transistor being connected to a ground point, the fifth MOS transistor having a gate to which the precharge signal is supplied.

5. The semiconductor storage device according to claim 4, further comprising a sixth MOS transistor of the second conductivity which has a current path one end of which is connected to the other end of the current path in the second MOS transistor, the other end of the current path in the sixth MOS transistor being connected to the ground point, the sixth MOS transistor having a gate connected to the power supply.

6. The semiconductor storage device according to claim 4, further comprising a sixth MOS transistor of the second conductivity type which has a current path one end of which is connected to the other end of the current path in the second MOS transistor, and an inverter having an input end connected to an output end of the sense amplifier and an output end connected to a gate of the sixth MOS transistor.

7. The semiconductor storage device according to claim 1, further comprising a seventh MOS transistor of the first conductivity which has a current path connected between the fourth MOS transistor and the power supply and which has a gate to which the precharge signal is supplied.

8. The semiconductor storage device according to claim 7, further comprising an eighth MOS transistor of the second conductivity type which has a current path one end of which is connected to the bit line, the other end of the current path in the eighth MOS transistor being connected to the read global bit line, the eighth MOS transistor having a gate to which a separation signal is supplied.

9. The semiconductor storage device according to claim 1, wherein the discharge circuit includes a voltage generator which outputs a fixed voltage, a current source circuit which discharges the bit line by conducting a current corresponding the fixed voltage output by the voltage generator, and a ninth MOS transistor of the second conductivity type which controls the current flowing through the current source circuit on the basis of the precharge signal.

10. The semiconductor storage device according to claim 1, wherein the sense amplifier includes an inverter having an input end connected to the bit line.

11. The semiconductor storage device according to claim 1, wherein the sense amplifier includes a signal processor having an input end connected to the bit line.

12. A semiconductor storage device comprising:
a precharge circuit configured to precharge a bit line connected to a selected memory cell for a read operation, the precharge circuit including a first MOS transistor of a first conductivity type which has a gate connected to a read global bit line, a second MOS transistor of a second conductivity type which has a gate connected to the read global bit line, the second MOS transistor having a current path one end of which is connected to one end of a current path in the first MOS transistor, a third MOS transistor of the first conductivity type which has a current path one end of which is connected to the other end of the current path in the first MOS transistor, the other end of the current path in the third MOS transistor being connected to a power supply, the third MOS transistor having a gate to which a precharge signal is supplied, a fourth MOS transistor of the second conductivity type which has a gate connected to a junction between the current paths in the first and second MOS transistors and which has a current path one end of which is connected to one end of the bit line, the fourth MOS transistor controlling a charge level of the bit line, and a fifth MOS transistor of the second conductivity type which has a current path one end of which is connected to the other end of the bit line, the other end of the current path in the fifth MOS transistor being connected to one end of the read global bit line, the fifth MOS transistor having a gate to which a separation signal is supplied;
a discharge circuit configured to discharge the bit line using a current flowing through the selected memory cell; and
a sense amplifier configured to sense a voltage across the bit line.

13. The semiconductor storage device according to claim 12, further comprising a sixth MOS transistor of the second conductivity which has a current path one end of which is connected to the junction between the current paths in the first and second MOS transistors, the other end of the current path in the sixth MOS transistor being connected to the ground point, the sixth MOS transistor having a gate connected to the power supply.

14. The semiconductor storage device according to claim 13, further comprising a seventh MOS transistor of the second conductivity which has a current path one end of which is connected to the other end of the current path in the second MOS transistor, the other end of the current path in the seventh MOS transistor being connected to the ground point, the seventh MOS transistor having a gate connected to the power supply.

15. The semiconductor storage device according to claim 14, further comprising an eighth MOS transistor of the first conductivity which has a current path connected between the fourth MOS transistor and the power supply and which has a gate to which the precharge signal is supplied.

16. The semiconductor storage device according to claim 12, wherein the discharge circuit includes a voltage generator which outputs a fixed voltage when the read global bit line is discharged, a current source circuit which discharges the read global bit line by conducting a current corresponding the fixed voltage output by the voltage generator, and a ninth MOS transistor of the second conductivity type which controls operations of the current source circuit on the basis of the precharge signal.

17. The semiconductor storage device according to claim 12, wherein the sense amplifier includes an inverter having an input end connected to the bit line.

18. The semiconductor storage device according to claim 12, wherein the sense amplifier includes a signal processor having an input end connected to the bit line.

* * * * *